US012706786B2

(12) United States Patent
Lyu et al.

(10) Patent No.: US 12,706,786 B2
(45) Date of Patent: Aug. 11, 2026

(54) COMMUNICATION METHOD, APPARATUS, AND SYSTEM

(71) Applicant: HUAWEI TECHNOLOGIES CO., LTD., Shenzhen (CN)

(72) Inventors: Rui Lyu, Chengdu (CN); Bofang Zheng, Shenzhen (CN); Xinhua Xiao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 46 days.

(21) Appl. No.: 18/642,238

(22) Filed: Apr. 22, 2024

(65) Prior Publication Data

US 2024/0275646 A1 Aug. 15, 2024

Related U.S. Application Data

(63) Continuation of application No. PCT/CN2022/114699, filed on Aug. 25, 2022.

(30) Foreign Application Priority Data

Oct. 20, 2021 (CN) ......................... 202111223482.3
Dec. 7, 2021 (CN) ......................... 202111486631.5

(51) Int. Cl.
*H04L 25/03* (2006.01)
*H03F 7/00* (2006.01)

(52) U.S. Cl.
CPC .......... *H04L 25/03828* (2013.01); *H03F 7/00* (2013.01)

(58) Field of Classification Search
CPC ....... H04L 25/03828; H03F 7/00; H04B 3/04; H04B 3/50
See application file for complete search history.

(56) References Cited

U.S. PATENT DOCUMENTS

2001/0013965 A1* 8/2001 Watanabe ............ H04B 10/299
398/147
2017/0126353 A1* 5/2017 Croussore .......... H04B 10/2543

FOREIGN PATENT DOCUMENTS

CN 1238612 A 12/1999
CN 1391371 A 1/2003
CN 108140944 A 6/2018

* cited by examiner

*Primary Examiner* — David S Huang

(57) ABSTRACT

A communication method, apparatus, and system are provided, and belong to the field of communication technologies. The method includes: After receiving a first electromagnetic wave signal sent by a first adjacent node, a target third node performs target processing on the first electromagnetic wave signal to obtain a second electromagnetic wave signal, and sends the second electromagnetic wave signal to a second adjacent node. A first node, at least one third node, and a second node are sequentially disposed on a cable, and among these nodes, the target third node is adjacent to the first adjacent node and the second adjacent node. The target processing includes processing used to cause conjugate reversal of a spectrum of the electromagnetic wave signal.

24 Claims, 29 Drawing Sheets

Display/Projector
Display/Projector
Cable
Conference room 1
Conference room 2
Audio and video data source device
Multimedia center

COMMUNICATION METHOD, APPARATUS, AND SYSTEM

CROSS-REFERENCE TO RELATED APPLICATIONS

This is a continuation of International Application No. PCT/CN2022/114699 filed on Aug. 25, 2022, which claims priority to Chinese Patent Application No. 202111486631.5 filed on Dec. 7, 2021, and Chinese Patent Application No. 202111223482.3, filed on Oct. 20, 2021. All of the aforementioned patent applications are hereby incorporated by reference in their entireties.

TECHNICAL FIELD

Disclosed embodiments relate to the field of communication technologies, and in particular, to a communication method, apparatus, and system.

BACKGROUND

In a communication system, nodes may be connected over a cable and may communicate with each other by transmitting an electromagnetic wave signal on the cable.

A first node and a second node in the communication system are used as an example. The first node may load, to an electromagnetic wave signal, data that needs to be sent to the second node, and send the electromagnetic wave signal to the second node over a cable. After receiving the electromagnetic wave signal, the second node may restore the data carried in the electromagnetic wave signal. In this way, communication between the first node and the second node is implemented.

However, when the electromagnetic wave signal is transmitted over the cable, the electromagnetic wave signal is affected by the cable. As a result, the electromagnetic wave signal received by the second node is distorted, and accuracy of the data that is carried in the electromagnetic wave signal and that is restored by the second node is low, which affects effective communication between the nodes.

SUMMARY

This disclosure provides a communication method, apparatus, and system, to resolve a problem that nodes cannot effectively communicate with each other. The technical solutions are as follows.

According to a first aspect, a communication method is provided. The method is performed by a target third node between a first node and a second node. The first node and the second node are connected over a cable, at least one third node is disposed on the cable, and the target third node is one of the at least one third node. In the first node, the second node, and the at least one third node, the target third node is adjacent to the first adjacent node and a second adjacent node.

The method includes: After receiving a first electromagnetic wave signal sent by the first adjacent node, the target third node performs target processing on the first electromagnetic wave signal to obtain a second electromagnetic wave signal, and sends the second electromagnetic wave signal to the second adjacent node. The target processing includes processing used to cause conjugate reversal of a spectrum of the electromagnetic wave signal.

Optionally, amplitude-frequency curves of the first electromagnetic wave signal before and after the conjugate reversal of the spectrum occurs are axisymmetric with respect to a target straight line. Phase-frequency curves of the first electromagnetic wave signal before and after the conjugate reversal of the spectrum occurs are centrosymmetric with respect to a target point. The target straight line is perpendicular to a horizontal coordinate axis of a coordinate system in which the amplitude-frequency curve is located, and a frequency corresponding to an intersection point with the horizontal coordinate axis is a center frequency of the first electromagnetic wave signal. The target point is a point corresponding to the center frequency on a horizontal coordinate axis of a coordinate system in which the phase-frequency curve is located.

Optionally, when the target third node performs the processing used to cause the conjugate reversal of the spectrum of the electromagnetic wave signal on the first electromagnetic wave signal, on one hand, for the amplitude-frequency curve in the spectrum of the first electromagnetic wave signal, the target third node uses the target straight line as a symmetry axis to symmetrically exchange amplitudes corresponding to frequencies on left and right sides of the target straight line, so that the amplitude-frequency curves of the first electromagnetic wave signal before and after the conjugate reversal of the spectrum occurs are axisymmetric to the target straight line; and on the other hand, for the phase-frequency curve in the spectrum of the first electromagnetic wave signal, the target third node multiplies a phase corresponding to each frequency in the phase-frequency curve by −1, and at the same time, uses the target straight line as a symmetry axis to symmetrically exchange phases corresponding to frequencies in the phase-frequency curve, that are, phases corresponding to frequencies on the left and right sides of the target straight line, so that the phase-frequency curves of the first electromagnetic wave signal before and after the conjugate reversal of the spectrum occurs are centrosymmetric with respect to the target point. Certainly, the target third node may also implement, in another manner, the processing used to cause the conjugate reversal of the spectrum of the electromagnetic wave signal on the first electromagnetic wave signal, for example, a manner of filtering the first electromagnetic wave signal. This is not limited in this disclosure.

It can be learned from the foregoing content that first distortion occurs in a process of transmitting the electromagnetic wave signal from the first adjacent node to the target third node, and third distortion further occurs in a process of transmitting the electromagnetic wave signal from the target third node to the second adjacent node, and the third distortion is similar to the first distortion. The target processing performed by the target third node on the received first electromagnetic wave signal includes the processing used to cause the conjugate reversal of the spectrum of the electromagnetic wave signal. Therefore, the second electromagnetic wave signal obtained by the target third node by performing the target processing on the first electromagnetic wave has second distortion opposite to the first distortion relative to the signal sent by the first adjacent node. In the process of transmitting the electromagnetic wave signal from the target third node to the second adjacent node, the third distortion occurs in the electromagnetic wave signal. Under effect of the second distortion and the third distortion, distortion of the electromagnetic wave signal received by the second adjacent node relative to the electromagnetic wave signal sent by the first adjacent node can be reduced, and quality of communication between the first adjacent node and the second adjacent node is ensured, thereby ensuring quality of communication between the first node and the second node.

In addition, when the target third node performs the processing used to cause the conjugate reversal of the spectrum of the electromagnetic wave signal on the first electromagnetic wave signal, the target third node does not need to restore the original electromagnetic wave signal sent by the first node. Therefore, complexity of the target third node is low.

Further, it is assumed that an amplitude-frequency curve of the conjugate reversed signal is axisymmetric to the amplitude-frequency curve of the first electromagnetic wave signal with respect to the target straight line, and a phase-frequency curve of the conjugate reversed signal is centrosymmetric to the phase-frequency curve of the first electromagnetic wave signal with respect to the target point. The target straight line is perpendicular to the horizontal coordinate axis of the coordinate system in which the amplitude-frequency curve is located, and the frequency corresponding to the intersection point with the horizontal coordinate axis is the center frequency of the first electromagnetic wave signal. The target point is the point corresponding to the center frequency on the horizontal coordinate axis of the coordinate system in which the phase-frequency curve is located.

The second electromagnetic wave signal finally obtained by the target third node may be the same as or different from the conjugate reversed signal. This is not limited in this disclosure. When the second electromagnetic wave signal finally obtained by the target third node is different from the conjugate reversed signal, the second electromagnetic wave signal and the conjugate reversed signal are different in at least one type of information of the center frequency, the amplitude-frequency curve, and the phase-frequency curve.

When the second electromagnetic wave signal finally obtained by the target third node may be different from the conjugate reversed signal, the second electromagnetic wave signal and the conjugate reversed signal may meet at least one of the following conditions:

Condition 1.1: In the amplitude-frequency curve of the conjugate reversed signal, a sum of first amplitudes and a sum of second amplitudes have a target magnitude relationship; and in an amplitude-frequency curve of the second electromagnetic wave signal, a sum of third amplitudes and a sum of fourth amplitudes also have the target magnitude relationship.

The first amplitude is an amplitude corresponding to a first frequency, the second amplitude is an amplitude corresponding to a second frequency, the first frequency is less than a center frequency of the conjugate reversed signal, and the second frequency is greater than the center frequency of the conjugate reversed signal. The third amplitude is an amplitude corresponding to a third frequency, the fourth amplitude is an amplitude corresponding to a fourth frequency, the third frequency is less than a center frequency of the second electromagnetic wave signal, and the fourth frequency is greater than the center frequency of the second electromagnetic wave signal.

Condition 1.2: A fluctuation rate of a phase corresponding to any frequency in an additional phase-frequency curve is less than 40% (or 20%, 30%, or the like). The fluctuation rate is a ratio of a fluctuation phase to a phase corresponding to any frequency, and the fluctuation phase is a phase corresponding to any frequency in a normalized additional phase-frequency curve.

The additional phase-frequency curve is a curve obtained by subtracting a reference phase-frequency curve from a phase-frequency curve of the second electromagnetic wave signal. A center frequency of the reference phase-frequency curve is the same as the center frequency of the second electromagnetic wave signal. When the center frequency of the conjugate reversed signal is the same as the center frequency of the second electromagnetic wave signal, the reference phase-frequency curve is the phase-frequency curve of the conjugate reversed signal. When the center frequency of the conjugate reversed signal is different from the center frequency of the second electromagnetic wave signal, the reference phase-frequency curve is a phase-frequency curve obtained after the phase-frequency curve of the conjugate reversed signal shifts along the horizontal coordinate axis of the phase-frequency curve.

The fluctuation rate is the ratio of the fluctuation phase to the phase corresponding to the any frequency, and the fluctuation phase is the phase corresponding to the any frequency in the normalized additional phase-frequency curve. It should be noted that the normalization is used for rotating and shifting the additional phase-frequency curve, so that both two endpoints and a target intersection point of the additional phase-frequency curve are shifted to a horizontal coordinate axis of the additional phase-frequency curve, and the target intersection point corresponds to the center frequency of the first electromagnetic wave signal. The target intersection point is an intersection point between a connection line of the two endpoints and a reference straight line, the reference straight line is perpendicular to the horizontal coordinate axis, and a frequency corresponding to an intersection point with the horizontal coordinate axis is the center frequency of the first electromagnetic wave signal.

When the second electromagnetic wave signal and the conjugate reversed signal meet the condition 1.1, a difference between the amplitude-frequency curve of the second electromagnetic wave signal and the amplitude-frequency curve of the conjugate reversed signal is small. When the second electromagnetic wave signal and the conjugate reversed signal meet the condition 1.2, a difference between the phase-frequency curve of the second electromagnetic wave signal and the phase-frequency curve of the conjugate reversed signal is small. In this case, a difference between the second electromagnetic wave signal and the conjugate reversed signal is small, so that the distortion of the electromagnetic wave signal received by the second adjacent node relative to the electromagnetic wave signal sent by the first adjacent node can also be reduced.

It can be learned from the foregoing content that the second electromagnetic wave signal may be the same as or different from the conjugate reversed signal. When the second electromagnetic wave signal is different from the conjugate reversed signal, the difference may be caused by a factor of a component in the target third node. Alternatively, when the second electromagnetic wave signal is different from the conjugate reversed signal, the difference may be caused by other processing (for example, referred to as auxiliary processing) that is different from the foregoing processing used to cause the conjugate reversal of the spectrum of the electromagnetic wave signal. Alternatively, when the second electromagnetic wave signal is different from the conjugate reversed signal, the difference may be caused by the factor of the component in the target third node and the other processing included in the target processing.

When the second electromagnetic wave signal is the same as the conjugate reversed signal, it is equivalent to that the second electromagnetic wave signal can be obtained after conjugate reversal in an ideal case occurs on the spectrum of the first electromagnetic wave signal. When the second electromagnetic wave signal is different from the conjugate reversed signal, it is equivalent to that the second electromagnetic wave signal can be obtained after conjugate reversal in a non-ideal case occurs on the spectrum of the first electromagnetic wave signal.

Further, the target third node may perform the target processing on the first electromagnetic wave signal in various manners. The following uses several manners as an example for description. In the following several manners, the conjugate reversal occurring on the spectrum of the first electromagnetic wave signal may be the conjugate reversal in the ideal case or may be the conjugate reversal in the non-ideal case. In addition, when the conjugate reversal is the conjugate reversal in the non-ideal case, the second electromagnetic wave signal is different from the conjugate reversed signal due to the factor of the component in the target third node.

Manner 1: When performing the target processing on the first electromagnetic wave signal, the target third node may first perform down-conversion on the first electromagnetic wave signal to obtain a first baseband signal; then obtain a second baseband signal based on the first baseband signal, where the second baseband signal is conjugate to the first baseband signal; and finally perform up-conversion on the second baseband signal to obtain the second electromagnetic wave signal.

When the target third node performs the target processing on the first electromagnetic wave signal in the manner 1, the target third node may include: a signal source unit, a first phase shift unit, a second phase shift unit, a first frequency mixing unit, a second frequency mixing unit, a third frequency mixing unit, a fourth frequency mixing unit, a reverse unit, and a combining unit. The signal source unit is configured to provide a local-frequency electromagnetic wave signal, and a center frequency of the local-frequency electromagnetic wave signal is the same as the center frequency of the first electromagnetic wave signal. The first phase shift unit, the second phase shift unit, the first frequency mixing unit, and the third frequency mixing unit are all connected to the signal source unit, the first phase shift unit is further connected to the second frequency mixing unit, the second phase shift unit is further connected to the fourth frequency mixing unit, the first frequency mixing unit is connected to the third frequency mixing unit, the second frequency mixing unit and the fourth frequency mixing unit are connected via the reverse unit, and the third frequency mixing unit and the fourth frequency mixing unit are both connected to the combining unit.

When the target third node performs the down-conversion on the first electromagnetic wave signal to obtain the first baseband signal, the first frequency mixing unit mixes the first electromagnetic wave signal and the local-frequency electromagnetic wave signal to obtain a real part signal of the first baseband signal; the first phase shift unit shifts a phase of the local-frequency electromagnetic wave signal by $\pi/2$ to obtain a first phase-shift signal, where $\pi$ represents a ratio of a circumference-diameter ratio constant of a circle; and the second frequency mixing unit mixes the first electromagnetic wave signal and the first phase-shift signal obtained by the first phase shift unit, to obtain an imaginary part signal of the first baseband signal.

When the target third node obtains the second baseband signal based on the first baseband signal, the reverse unit performs negation on the imaginary part signal to obtain a reverse signal of the imaginary part signal, where the second baseband signal includes the real part signal and the reverse signal.

When the target third node performs the up-conversion on the second baseband signal to obtain the second electromagnetic wave signal, the third frequency mixing unit mixes the real part signal and the local-frequency electromagnetic wave signal to obtain a first frequency-mixed signal; the second phase shift unit shifts the phase of the local-frequency electromagnetic wave signal by $\pi/2$ to obtain the first phase-shift signal; the fourth frequency mixing unit mixes the reverse signal and the first phase-shift signal obtained by the second phase shift unit, to obtain a second frequency-mixed signal; and the combining unit combines the first frequency-mixed signal and the second frequency-mixed signal to obtain the second electromagnetic wave signal.

Manner 2: When performing the target processing on the first electromagnetic wave signal, the target third node may first perform down-conversion on the first electromagnetic wave signal to obtain a first baseband signal; and then perform conjugate up-conversion on the first baseband signal to obtain the second electromagnetic wave signal.

It should be noted that when the target third node performs the target processing on the first electromagnetic wave signal in the manner 2, there are various processing manners of the target third node.

In a first optional processing manner of the manner 2, the target third node includes a signal source unit, a first phase shift unit, a second phase shift unit, a first frequency mixing unit, a second frequency mixing unit, a third frequency mixing unit, a fourth frequency mixing unit, and a combining unit. The signal source unit is configured to provide a local-frequency electromagnetic wave signal, and a center frequency of the local-frequency electromagnetic wave signal is the same as the center frequency of the first electromagnetic wave signal. The first phase shift unit, the second phase shift unit, the first frequency mixing unit, and the third frequency mixing unit are all connected to the signal source unit, the first phase shift unit is further connected to the second frequency mixing unit, the second phase shift unit is further connected to the fourth frequency mixing unit, the first frequency mixing unit is connected to the third frequency mixing unit, the second frequency mixing unit is connected to the fourth frequency mixing unit, and the third frequency mixing unit and the fourth frequency mixing unit are both connected to the combining unit.

When the target third node performs the down-conversion on the first electromagnetic wave signal to obtain the first baseband signal, the first frequency mixing unit mixes the first electromagnetic wave signal and the local-frequency electromagnetic wave signal to obtain a real part signal of the first baseband signal; the first phase shift unit shifts a phase of the local-frequency electromagnetic wave signal by $\pi/2$ to obtain a first phase-shift signal, where $\pi$ represents a ratio of a circumference-diameter ratio constant of a circle; and the second frequency mixing unit mixes the first electromagnetic wave signal and the first phase-shift signal, to obtain an imaginary part signal of the first baseband signal.

When the target third node performs the conjugate up-conversion on the first baseband signal to obtain the second electromagnetic wave signal, the third frequency mixing unit mixes the real part signal and the local-frequency electromagnetic wave signal to obtain a first frequency-mixed signal; the second phase shift unit shifts the phase of the local-frequency electromagnetic wave signal by $-\pi/2$ to obtain a second phase-shift signal; the fourth frequency mixing unit mixes the imaginary part signal and the second phase-shift signal to obtain a second frequency-mixed signal; and the combining unit combines the first frequency-mixed signal and the second frequency-mixed signal to obtain the second electromagnetic wave signal.

In the first optional processing manner of the manner 2, because the second phase shift unit shifts the phase of the local-frequency electromagnetic wave signal by $-\pi/2$ to obtain the second phase-shift signal, the fourth frequency mixing unit mixes the imaginary part signal and the second phase-shift signal, which is equivalent to mixing the reverse signal of the imaginary part signal in the manner 1 and the second phase-shift signal in the manner 1. Therefore, in the first optional processing manner of the manner 2, the second frequency-mixed signal obtained by mixing the imaginary part signal and the second phase-shift signal by the fourth frequency mixing unit is equivalent to the second frequency-mixed signal in the manner 1, and further in the first optional processing manner of the manner 2, the second electromagnetic wave signal obtained by the combining unit is equivalent to the second electromagnetic wave signal in the manner 1.

In a second optional processing manner of the manner 2, the target third node includes a signal source unit, a first phase shift unit, a second phase shift unit, a first frequency mixing unit, a second frequency mixing unit, a third frequency mixing unit, a fourth frequency mixing unit, and a combining unit. The signal source unit is configured to provide a local-frequency electromagnetic wave signal, and a center frequency of the local-frequency electromagnetic wave signal is the same as the center frequency of the first electromagnetic wave signal. The first phase shift unit, the second phase shift unit, the first frequency mixing unit, and the third frequency mixing unit are all connected to the signal source unit, the first phase shift unit is further connected to the second frequency mixing unit, the second phase shift unit is further connected to the fourth frequency mixing unit, the first frequency mixing unit is connected to the fourth frequency mixing unit, the second frequency mixing unit is connected to the third frequency mixing unit, and the third frequency mixing unit and the fourth frequency mixing unit are both connected to the combining unit.

When the target third node performs the down-conversion on the first electromagnetic wave signal to obtain the first baseband signal, the first frequency mixing unit mixes the first electromagnetic wave signal and the local-frequency electromagnetic wave signal to obtain a real part signal; the first phase shift unit shifts a phase of the local-frequency electromagnetic wave signal by $\pi/2$ to obtain a first phase-shift signal, where $\pi$ represents a ratio of a circumference-diameter ratio constant of a circle; and the second frequency mixing unit mixes the first electromagnetic wave signal and the first phase-shift signal obtained by the first phase shift unit, to obtain an imaginary part signal.

When the target third node performs the conjugate up-conversion on the first baseband signal to obtain the second electromagnetic wave signal, the third frequency mixing unit mixes the imaginary part signal and the local-frequency electromagnetic wave signal to obtain a first frequency-mixed signal; the second phase shift unit shifts the phase of the local-frequency electromagnetic wave signal by $\pi/2$ to obtain the first phase-shift signal; the fourth frequency mixing unit mixes the real part signal and the first phase-shift signal obtained by the second phase shift unit, to obtain a second frequency-mixed signal; and the combining unit combines the first frequency-mixed signal and the second frequency-mixed signal to obtain the second electromagnetic wave signal.

It can be learned that, in the second optional processing manner of the manner 2, the real part signal and the imaginary part signal in the input signal of the upper frequency mixing unit are crossed, to implement the conjugate on the first baseband signal. In this case, the upper frequency mixing unit is equivalent to additionally adding a phase rotation of 90 degrees after performing the conjugate on the first baseband signal. The phase rotation of 90 degrees does not affect effect of the target processing.

Manner 3: When performing the target processing on the first electromagnetic wave signal, the target third node may perform spectrum shifting on the first electromagnetic wave signal to obtain a third electromagnetic wave signal; and then filter the third electromagnetic wave signal to obtain the second electromagnetic wave signal.

It should be noted that the first electromagnetic wave signal is a band-pass real signal, and the spectrum of the first electromagnetic wave signal has conjugate symmetry, that is, the spectrum of the first electromagnetic wave signal is conjugate symmetric with respect to a vertical coordinate axis (a point passing through a frequency 0) of a coordinate system in which the spectrum is located. In this case, a spectrum of the baseband signal of the first electromagnetic wave signal is on a positive half-axis side, and the center frequency of the first electromagnetic wave signal is used as a center frequency. According to the conjugate symmetry of the spectrum of the first electromagnetic wave signal, a spectrum that is conjugate symmetric to the spectrum of the baseband signal of the first electromagnetic wave signal exists in an interval on a negative half-axis side of the spectrum of the first electromagnetic wave signal. Therefore, the conjugate symmetry of the signal spectrum of the original positive half-axis can be equivalently implemented by shifting the spectrum of the first electromagnetic wave signal in the interval on the negative half-axis side to the positive half-axis.

When the target third node performs the target processing on the first electromagnetic wave signal in the manner 3, the target third node includes a signal source unit, a frequency multiplication unit, a frequency mixing unit, and a filter unit. The signal source unit, the frequency multiplication unit, the frequency mixing unit, and the filter unit are sequentially connected. The signal source unit is configured to provide a local-frequency electromagnetic wave signal, and a center frequency of the local-frequency electromagnetic wave signal is the same as the center frequency of the first electromagnetic wave signal.

When the target third node performs the spectrum shifting on the first electromagnetic wave signal to obtain the third electromagnetic wave signal, the frequency multiplication unit obtains a frequency multiplied signal of the local-frequency electromagnetic wave signal, where a center frequency of the frequency multiplied signal is twice the center frequency of the first electromagnetic wave signal. The frequency mixing unit mixes the first electromagnetic wave signal and the frequency multiplied signal to obtain the third electromagnetic wave signal.

When the target third node filters the third electromagnetic wave signal to obtain the second electromagnetic wave signal, the filter unit filters the third electromagnetic wave signal to obtain the second electromagnetic wave signal.

Manner 4: When performing the target processing on the first electromagnetic wave signal, the target third node may sequentially perform frequency conversion, spectrum shifting, filtering, and frequency conversion on the first electromagnetic wave signal to obtain the second electromagnetic wave signal.

When the target third node performs the target processing on the first electromagnetic wave signal in the manner 4, the target third node includes a first signal source unit, a second signal source unit, a frequency multiplication unit, a first frequency mixing unit, a second frequency mixing unit, a third frequency mixing unit, a first filter unit, and a second filter unit. The first frequency mixing unit, the first filter unit, the second frequency mixing unit, the second filter unit, and the third frequency mixing unit are sequentially connected. The first signal source unit is connected to the first frequency mixing unit, and the second signal source unit is connected to the second frequency mixing unit via the frequency multiplication unit. The first signal source unit is configured to generate a first local-frequency electromagnetic wave signal, and the second signal source unit is configured to generate a second local-frequency electromagnetic wave signal. A center frequency of the first local-frequency electromagnetic wave signal is $f_1$, a center frequency of the second local-frequency electromagnetic wave signal is $f_2$, the center frequency of the first electromagnetic wave signal is $f_0$, $f_1+f_2=f_0$, $f_1<f_0-F/2$, and F represents bandwidth of the first electromagnetic wave signal.

When the target third node performs the target processing on the first electromagnetic wave signal to obtain the second electromagnetic wave signal, the first frequency mixing unit mixes the first electromagnetic wave signal and the first local-frequency electromagnetic wave signal to obtain a first frequency-mixed signal. The first filter unit filters the first frequency-mixed signal to obtain a first sub-signal in the first frequency-mixed signal, where a center frequency of the first sub-signal is $f_2$. The frequency multiplication unit obtains a frequency multiplied signal of the second local-frequency electromagnetic wave signal, where a center frequency of the frequency multiplied signal is twice $f_2$. The second frequency mixing unit mixes the first sub-signal and the frequency multiplied signal to obtain a second frequency-mixed signal. The second filter unit filters the second frequency-mixed signal to obtain a second sub-signal in the second frequency-mixed signal, where a center frequency of the second sub-signal is $f_2$. The third frequency mixing unit mixes the second sub-signal and the first local-frequency electromagnetic wave signal to obtain the second electromagnetic wave signal.

Manner 5: When performing the target processing on the first electromagnetic wave signal, the target third node performs parametric amplification on the first electromagnetic wave signal to obtain the second electromagnetic wave signal. It should be noted that when the target third node performs the target processing on the first electromagnetic wave signal in the manner 5, there are various processing manners of the target third node.

In a first optional processing manner of the manner 5, the target third node includes a signal source unit, a first filter unit, a second filter unit, a third filter unit, and a nonlinear unit. The signal source unit is configured to provide a local-frequency electromagnetic wave signal. The signal source unit is connected to the second filter unit, and the first filter unit, the second filter unit, and the third filter unit are all connected to the nonlinear unit.

When target third node performs parametric amplification on the first electromagnetic wave signal to obtain the second electromagnetic wave signal, the first filter unit filters the first electromagnetic wave signal to obtain a first filtered signal, where a center frequency of the first filtered signal is the center frequency of the first electromagnetic wave signal. The second filter unit filters the local-frequency electromagnetic wave signal to obtain a second filtered signal. The nonlinear unit performs parametric amplification on the first filtered signal based on the second filtered signal to obtain a parametric amplified signal. The third filter unit filters the parametric amplified signal to obtain the second electromagnetic wave signal. The center frequency of the second electromagnetic wave signal is $Mf_p+Nf_0$, both M and N are non-zero integers, N is less than zero, $f_0$ represents the center frequency of the first electromagnetic wave signal, and $f_p$ represents the center frequency of the second filtered signal.

It should be noted that, the second filtered signal obtained by filtering the local-frequency electromagnetic wave signal generated by the signal source unit by the second filter unit is used as a pump signal and is applied to the nonlinear unit together with the first filtered signal obtained by filtering the first electromagnetic wave signal input to the target third node by the first filter unit. The nonlinear unit has nonlinear effect under the action of the pump signal, and the nonlinear unit transfers energy in the pump signal to an output parametric amplified signal, to implement parametric amplification. The nonlinear unit may generate the parametric amplified signal at any frequency $Af_p+Bf_0$ (both A and B are non-zero integers). In this case, the third filter unit may filter the parametric amplified signal output by the nonlinear unit, to obtain the second electromagnetic wave signal whose center frequency is $Mf_p+Nf_0$. In addition, to implement the conjugate symmetry of the spectrum of the second electromagnetic wave signal with respect to the spectrum of the first electromagnetic wave signal, N needs to be an integer less than zero. For example, M=2 and N=−1. In this case, the center frequency of the second electromagnetic wave signal is $2f_p-f_0$, and $f_p$ may be a frequency close to $f_0$. When $f_p$ is a frequency similar to $2f_0$, M=1 and N=−1 may also be selected. In this case, the center frequency of the second electromagnetic wave signal is $f_p-f_0=f_0$.

In addition, because the target third node performs the parametric amplification on the first electromagnetic wave signal in a process of performing the target processing on the first electromagnetic wave signal, power of the second electromagnetic wave signal can also be increased, thereby reducing a transmission loss of the electromagnetic wave signal on the cable.

In a second optional processing manner of the manner 5, the target third node includes a signal source unit, a connection unit, a first filter unit, a second filter unit, and a nonlinear unit. The connection unit has a first end, a second end, and a third end, the first end is connected to the first adjacent node, the second end is connected to the second adjacent node, and the third end is connected to one end of the first filter unit. The connection unit is configured to transmit a signal that is input from the first end to the third end and transmit a signal that is input from the third end to the second end. The other end of the first filter unit and the second filter unit are both connected to the nonlinear unit. The signal source unit is connected to the second filter unit, and the signal source unit is configured to provide a local-frequency electromagnetic wave signal.

When the target third node performs the parametric amplification on the first electromagnetic wave signal to obtain the second electromagnetic wave signal, the first filter unit filters the first electromagnetic wave signal input from the one end of the first filter unit to obtain a first filtered signal, and outputs the first filtered signal from the other end of the first filter unit, where a center frequency of the first filtered signal is the center frequency of the first electromagnetic wave signal. The second filter unit filters the local-frequency electromagnetic wave signal to obtain a second filtered signal. The nonlinear unit performs parametric amplification on the first filtered signal based on the second filtered signal to obtain a parametric amplified signal. The first filter unit filters the parametric amplified signal from the nonlinear unit to obtain the second electromagnetic wave signal, and outputs the second electromagnetic wave signal from the other end of the first filter unit. The center frequency of the second electromagnetic wave signal is $Mf_p+Nf_0$, $Mf_p+Nf_0-f_0$, both M and N are non-zero integers, N is less than zero, $f_0$ represents the center frequency of the first electromagnetic wave signal, and $f_p$ represents the center frequency of the second filtered signal.

In the second optional processing manner, filtering the parametric amplification signal to obtain the second electromagnetic wave signal and filtering the first electromagnetic wave signal to obtain the first filtered signal are both implemented on the first filter unit. In addition, the second electromagnetic wave signal and the first filtered signal are separated via a connection unit (for example, a device such as a circulator) according to different signal directions.

Optionally, before performing the target processing on the first electromagnetic wave signal, the target third node may further perform low-noise amplification on the first electromagnetic wave signal, to improve quality of the first electromagnetic wave signal.

Optionally, after performing the target processing on the first electromagnetic wave signal to obtain the second electromagnetic wave signal, and before sending the second electromagnetic wave signal to the second adjacent node, the target third node may further perform power amplification on the second electromagnetic wave signal, to increase power of the second electromagnetic wave signal, thereby reducing a transmission loss of the electromagnetic wave signal on the cable.

Optionally, the first electromagnetic wave signal is a terahertz signal, an optical signal, or the like.

According to a second aspect, a communication apparatus is provided. The communication apparatus is performed by a target third node between a first node and a second node. The first node and the second node are connected over a cable, at least one third node is disposed on the cable, and the target third node is one of the at least one third node. In the first node, the second node, and the at least one third node, the target third node is adjacent to the first adjacent node and a second adjacent node. The communication apparatus includes a receiving module, a target processing module, and a sending module. The receiving module is configured to receive a first electromagnetic wave signal sent by a first adjacent node. The target processing module is configured to perform target processing on the first electromagnetic wave signal to obtain a second electromagnetic wave signal, where the target processing includes processing used to cause conjugate reversal of a spectrum of the electromagnetic wave signal. The sending module is configured to send the second electromagnetic wave signal to the second adjacent node.

Optionally, amplitude-frequency curves of the first electromagnetic wave signal before and after the conjugate reversal of the spectrum occurs are axisymmetric with respect to a target straight line. Phase-frequency curves of the first electromagnetic wave signal before and after the conjugate reversal of the spectrum occurs are centrosymmetric with respect to a target point. The target straight line is perpendicular to a horizontal coordinate axis of a coordinate system in which the amplitude-frequency curve is located, and a frequency corresponding to an intersection point with the horizontal coordinate axis is a center frequency of the first electromagnetic wave signal. The target point is a point corresponding to the center frequency on a horizontal coordinate axis of a coordinate system in which the phase-frequency curve is located.

Optionally, when the target processing module performs the processing used to cause the conjugate reversal of the spectrum of the electromagnetic wave signal on the first electromagnetic wave signal, on one hand, for the amplitude-frequency curve in the spectrum of the first electromagnetic wave signal, the target processing module uses the target straight line as a symmetry axis to symmetrically exchange amplitudes corresponding to frequencies on left and right sides of the target straight line, so that the amplitude-frequency curves of the first electromagnetic wave signal before and after the conjugate reversal of the spectrum occurs are axisymmetric to the target straight line; and on the other hand, for the phase-frequency curve in the spectrum of the first electromagnetic wave signal, the target processing module multiplies a phase corresponding to each frequency in the phase-frequency curve by −1, and at the same time, uses the target straight line as a symmetry axis to symmetrically exchange phases corresponding to frequencies in the phase-frequency curve, that are, phases corresponding to frequencies on the left and right sides of the target straight line, so that the phase-frequency curves of the first electromagnetic wave signal before and after the conjugate reversal of the spectrum occurs are symmetric with respect to the target point. Certainly, the target processing module may also implement, in another manner, the processing used to cause the conjugate reversal of the spectrum of the electromagnetic wave signal on the first electromagnetic wave signal, for example, a manner of filtering the first electromagnetic wave signal.

It can be learned from the foregoing content that first distortion occurs in a process of transmitting the electromagnetic wave signal from the first adjacent node to the target third node, and third distortion further occurs in a process of transmitting the electromagnetic wave signal from the target third node to the second adjacent node, and the third distortion is similar to the first distortion. The target processing performed by the target third node on the received first electromagnetic wave signal includes the processing used to cause the conjugate reversal of the spectrum of the electromagnetic wave signal. Therefore, the second electromagnetic wave signal obtained by the target third node by performing the target processing on the first electromagnetic wave has second distortion opposite to the first distortion relative to the signal sent by the first adjacent node. In the process of transmitting the electromagnetic wave signal from the target third node to the second adjacent node, the third distortion occurs in the electromagnetic wave signal. Under effect of the second distortion and the third distortion, distortion of the electromagnetic wave signal received by the second adjacent node relative to the electromagnetic wave signal sent by the first adjacent node can be reduced, and quality of communication between the first adjacent node and the second adjacent node is ensured, thereby ensuring quality of communication between the first node and the second node.

In addition, when the target processing module performs the processing used to cause the conjugate reversal of the spectrum of the electromagnetic wave signal on the first electromagnetic wave signal, the target processing module does not need to restore the original electromagnetic wave signal sent by the first node. Therefore, complexity of the target processing module is low.

Further, it is assumed that an amplitude-frequency curve of the conjugate reversed signal is axisymmetric to the amplitude-frequency curve of the first electromagnetic wave signal with respect to the target straight line, and a phase-frequency curve of the conjugate reversed signal is centrosymmetric to the phase-frequency curve of the first electromagnetic wave signal with respect to the target point. The target straight line is perpendicular to the horizontal coordinate axis of the coordinate system in which the amplitude-frequency curve is located, and the frequency corresponding to the intersection point with the horizontal coordinate axis is the center frequency of the first electromagnetic wave signal. The target point is the point corresponding to the center frequency on the horizontal coordinate axis of the coordinate system in which the phase-frequency curve is located.

The second electromagnetic wave signal finally obtained by the target third node may be the same as or different from the conjugate reversed signal. This is not limited in this disclosure. When the second electromagnetic wave signal finally obtained by the target third node is different from the conjugate reversed signal, the second electromagnetic wave signal and the conjugate reversed signal are different in at least one type of information of the center frequency, the amplitude-frequency curve, and the phase-frequency curve.

When the second electromagnetic wave signal finally obtained by the target third node may be different from the conjugate reversed signal, the second electromagnetic wave signal and the conjugate reversed signal may meet at least one of the following conditions:

Condition 1.1: In the amplitude-frequency curve of the conjugate reversed signal, a sum of first amplitudes and a sum of second amplitudes have a target magnitude relationship; and in an amplitude-frequency curve of the second electromagnetic wave signal, a sum of third amplitudes and a sum of fourth amplitudes also have the target magnitude relationship.

The first amplitude is an amplitude corresponding to a first frequency, the second amplitude is an amplitude corresponding to a second frequency, the first frequency is less than a center frequency of the conjugate reversed signal, and the second frequency is greater than the center frequency of the conjugate reversed signal. The third amplitude is an amplitude corresponding to a third frequency, the fourth amplitude is an amplitude corresponding to a fourth frequency, the third frequency is less than a center frequency of the second electromagnetic wave signal, and the fourth frequency is greater than the center frequency of the second electromagnetic wave signal.

Condition 1.2: A fluctuation rate of a phase corresponding to any frequency in an additional phase-frequency curve is less than 40% (or 20%, 30%, or the like). The fluctuation rate is a ratio of a fluctuation phase to a phase corresponding to any frequency, and the fluctuation phase is a phase corresponding to the any frequency in a normalized additional phase-frequency curve.

The additional phase-frequency curve is a curve obtained by subtracting a reference phase-frequency curve from a phase-frequency curve of the second electromagnetic wave signal. A center frequency of the reference phase-frequency curve is the same as the center frequency of the second electromagnetic wave signal. When the center frequency of the conjugate reversed signal is the same as the center frequency of the second electromagnetic wave signal, the reference phase-frequency curve is the phase-frequency curve of the conjugate reversed signal. When the center frequency of the conjugate reversed signal is different from the center frequency of the second electromagnetic wave signal, the reference phase-frequency curve is a phase-frequency curve obtained after the phase-frequency curve of the conjugate reversed signal shifts along the horizontal coordinate axis of the phase-frequency curve.

The fluctuation rate is the ratio of the fluctuation phase to the phase corresponding to the any frequency, and the fluctuation phase is the phase corresponding to the any frequency in the normalized additional phase-frequency curve. It should be noted that the normalization is used for rotating and shifting the additional phase-frequency curve, so that both two endpoints and a target intersection point of the additional phase-frequency curve are shifted to a horizontal coordinate axis of the additional phase-frequency curve, and the target intersection point corresponds to the center frequency of the first electromagnetic wave signal. The target intersection point is an intersection point between a connection line of the two endpoints and a reference straight line, the reference straight line is perpendicular to the horizontal coordinate axis, and a frequency corresponding to an intersection point with the horizontal coordinate axis is the center frequency of the first electromagnetic wave signal.

When the second electromagnetic wave signal and the conjugate reversed signal meet the condition 1.1, a difference between the amplitude-frequency curve of the second electromagnetic wave signal and the amplitude-frequency curve of the conjugate reversed signal is small. When the second electromagnetic wave signal and the conjugate reversed signal meet the condition 1.2, a difference between the phase-frequency curve of the second electromagnetic wave signal and the phase-frequency curve of the conjugate reversed signal is small. In this case, a difference between the second electromagnetic wave signal and the conjugate reversed signal is small, so that the distortion of the electromagnetic wave signal received by the second adjacent node relative to the electromagnetic wave signal sent by the first adjacent node can also be reduced.

It can be learned from the foregoing content that the second electromagnetic wave signal may be the same as or different from the conjugate reversed signal. When the second electromagnetic wave signal is different from the conjugate reversed signal, the difference may be caused by a factor of a component in the target third node. Alternatively, when the second electromagnetic wave signal is different from the conjugate reversed signal, the difference may be caused by other processing (for example, referred to as auxiliary processing) that is different from the foregoing processing used to cause the conjugate reversal of the spectrum of the electromagnetic wave signal. Alternatively, when the second electromagnetic wave signal is different from the conjugate reversed signal, the difference may be caused by the factor of the component in the target third node and the other processing included in the target processing.

When the second electromagnetic wave signal is the same as the conjugate reversed signal, it is equivalent to that the second electromagnetic wave signal can be obtained after conjugate reversal in an ideal case occurs on the spectrum of the first electromagnetic wave signal. When the second electromagnetic wave signal is different from the conjugate reversed signal, it is equivalent to that the second electromagnetic wave signal can be obtained after conjugate reversal in a non-ideal case occurs on the spectrum of the first electromagnetic wave signal.

Further, the target processing module may perform the target processing on the first electromagnetic wave signal in various manners. The following uses several manners as an example for description. In the following several manners, the conjugate reversal occurring on the spectrum of the first electromagnetic wave signal may be the conjugate reversal in the ideal case or may be the conjugate reversal in the non-ideal case. In addition, when the conjugate reversal is the conjugate reversal in the non-ideal case, the second electromagnetic wave signal is different from the conjugate reversed signal due to the factor of the component in the target third node.

Manner 1: The target processing module is configured to perform down-conversion on the first electromagnetic wave signal to obtain a first baseband signal; obtain a second baseband signal based on the first baseband signal, where the second baseband signal is conjugate to the first baseband signal; and perform up-conversion on the second baseband signal to obtain the second electromagnetic wave signal.

Optionally, when the target processing module performs the target processing on the first electromagnetic wave signal in the manner 1, the target processing module includes: a signal source unit, a first phase shift unit, a second phase shift unit, a first frequency mixing unit, a second frequency mixing unit, a third frequency mixing unit, a fourth frequency mixing unit, a reverse unit, and a combining unit. The signal source unit is configured to provide a local-frequency electromagnetic wave signal, and a center frequency of the local-frequency electromagnetic wave signal is the same as the center frequency of the first electromagnetic wave signal. The first phase shift unit, the second phase shift unit, the first frequency mixing unit, and the third frequency mixing unit are all connected to the signal source unit, the first phase shift unit is further connected to the second frequency mixing unit, the second phase shift unit is further connected to the fourth frequency mixing unit, the first frequency mixing unit is connected to the third frequency mixing unit, the second frequency mixing unit and the fourth frequency mixing unit are connected via the reverse unit, and the third frequency mixing unit and the fourth frequency mixing unit are both connected to the combining unit.

The first frequency mixing unit is configured to mix the first electromagnetic wave signal and the local-frequency electromagnetic wave signal to obtain a real part signal of the first baseband signal. The first phase shift unit is configured to shift a phase of the local-frequency electromagnetic wave signal by $\pi/2$ to obtain a first phase-shift signal, where $\pi$ represents a ratio of a circumference-diameter ratio constant of a circle. The second frequency mixing unit is configured to mix the first electromagnetic wave signal and the first phase-shift signal obtained by the first phase shift unit, to obtain an imaginary part signal of the first baseband signal. The reverse unit is configured to perform negation on the imaginary part signal to obtain a reverse signal of the imaginary part signal, where the second baseband signal includes the real part signal and the reverse signal. The third frequency mixing unit is configured to mix the real part signal and the local-frequency electromagnetic wave signal to obtain a first frequency-mixed signal. The second phase shift unit is configured to shift the phase of the local-frequency electromagnetic wave signal by $\pi/2$ to obtain the first phase-shift signal. The fourth frequency mixing unit is configured to mix the reverse signal and the first phase-shift signal obtained by the second phase shift unit, to obtain a second frequency-mixed signal. The combining unit is configured to combine the first frequency-mixed signal and the second frequency-mixed signal to obtain the second electromagnetic wave signal.

Manner 2: When the target processing module is configured to first perform down-conversion on the first electromagnetic wave signal to obtain a first baseband signal. Then, the target third node performs conjugate up-conversion on the first baseband signal to obtain the second electromagnetic wave signal.

It should be noted that when the target processing module performs the target processing on the first electromagnetic wave signal in the manner 2, there are various processing manners of the target processing module.

(2.1) In a first optional processing manner, the target processing module includes a signal source unit, a first phase shift unit, a second phase shift unit, a first frequency mixing unit, a second frequency mixing unit, a third frequency mixing unit, a fourth frequency mixing unit, and a combining unit. The signal source unit is configured to provide a local-frequency electromagnetic wave signal, and a center frequency of the local-frequency electromagnetic wave signal is the same as the center frequency of the first electromagnetic wave signal. The first phase shift unit, the second phase shift unit, the first frequency mixing unit, and the third frequency mixing unit are all connected to the signal source unit, the first phase shift unit is further connected to the second frequency mixing unit, the second phase shift unit is further connected to the fourth frequency mixing unit, the first frequency mixing unit is connected to the third frequency mixing unit, the second frequency mixing unit is connected to the fourth frequency mixing unit, and the third frequency mixing unit and the fourth frequency mixing unit are both connected to the combining unit.

The first frequency mixing unit is configured to mix the first electromagnetic wave signal and the local-frequency electromagnetic wave signal to obtain a real part signal of the first baseband signal. The first phase shift unit is configured to shift a phase of the local-frequency electromagnetic wave signal by $\pi/2$ to obtain a first phase-shift signal, where $\pi$ represents a ratio of a circumference-diameter ratio constant of a circle. The second frequency mixing unit is configured to mix the first electromagnetic wave signal and the first phase-shift signal, to obtain an imaginary part signal of the first baseband signal. The third frequency mixing unit is configured to mix the real part signal and the local-frequency electromagnetic wave signal to obtain a first frequency-mixed signal. The second phase shift unit is configured to shift the phase of the local-frequency electromagnetic wave signal by $-\pi/2$ to obtain a second phase-shift signal. The fourth frequency mixing unit is configured to mix the imaginary part signal and the second phase-shift signal to obtain a second frequency-mixed signal. The combining unit is configured to combine the first frequency-mixed signal and the second frequency-mixed signal to obtain the second electromagnetic wave signal.

In a second optional processing manner of the manner 2, the target processing module includes a signal source unit, a first phase shift unit, a second phase shift unit, a first frequency mixing unit, a second frequency mixing unit, a third frequency mixing unit, a fourth frequency mixing unit, and a combining unit. The signal source unit is configured to provide a local-frequency electromagnetic wave signal, and a center frequency of the local-frequency electromagnetic wave signal is the same as the center frequency of the first electromagnetic wave signal. The first phase shift unit, the second phase shift unit, the first frequency mixing unit, and the third frequency mixing unit are all connected to the signal source unit, the first phase shift unit is further connected to the second frequency mixing unit, the second phase shift unit is further connected to the fourth frequency mixing unit, the first frequency mixing unit is connected to the fourth frequency mixing unit, the second frequency mixing unit is connected to the third frequency mixing unit, and the third frequency mixing unit and the fourth frequency mixing unit are both connected to the combining unit.

The first frequency mixing unit is configured to mix the first electromagnetic wave signal and the local-frequency electromagnetic wave signal to obtain a real part signal. The first phase shift unit is configured to shift a phase of the local-frequency electromagnetic wave signal by $\pi/2$ to obtain a first phase-shift signal, where $\pi$ represents a ratio of a circumference-diameter ratio constant of a circle. The second frequency mixing unit is configured to mix the first electromagnetic wave signal and the first phase-shift signal obtained by the first phase shift unit, to obtain an imaginary part signal. The third frequency mixing unit is configured to mix the imaginary part signal and the local-frequency electromagnetic wave signal to obtain a first frequency-mixed signal. The second phase shift unit is configured to shift the phase of the local-frequency electromagnetic wave signal by $\pi/2$ to obtain the first phase-shift signal. The fourth frequency mixing unit is configured to mix the real part signal and the first phase-shift signal obtained by the second phase shift unit, to obtain a second frequency-mixed signal. The combining unit is configured to combine the first frequency-mixed signal and the second frequency-mixed signal to obtain the second electromagnetic wave signal.

Manner 3: The target processing module is configured to perform spectrum shifting on the first electromagnetic wave signal to obtain a third electromagnetic wave signal; and then filter the third electromagnetic wave signal to obtain the second electromagnetic wave signal.

When the target third node performs the target processing on the first electromagnetic wave signal in the manner 3, the target processing module includes a signal source unit, a frequency multiplication unit, a frequency mixing unit, and a filter unit. The signal source unit, the frequency multiplication unit, the frequency mixing unit, and the filter unit are sequentially connected. The signal source unit is configured to provide a local-frequency electromagnetic wave signal, and a center frequency of the local-frequency electromagnetic wave signal is the same as the center frequency of the first electromagnetic wave signal.

The frequency multiplication unit is configured to obtain a frequency multiplied signal of the local-frequency electromagnetic wave signal, where a center frequency of the frequency multiplied signal is twice the center frequency of the first electromagnetic wave signal. The frequency mixing unit is configured to mix the first electromagnetic wave signal and the frequency multiplied signal to obtain the third electromagnetic wave signal. The filter unit is configured to mix the third electromagnetic wave signal to obtain the second electromagnetic wave signal.

Manner 4: When performing the target processing on the first electromagnetic wave signal, the target processing module may sequentially perform frequency conversion, spectrum shifting, filtering, and frequency conversion on the first electromagnetic wave signal to obtain the second electromagnetic wave signal.

When the target third node performs the target processing on the first electromagnetic wave signal in the manner 4, the target processing module includes a first signal source unit, a second signal source unit, a frequency multiplication unit, a first frequency mixing unit, a second frequency mixing unit, a third frequency mixing unit, a first filter unit, and a second filter unit. The first frequency mixing unit, the first filter unit, the second frequency mixing unit, the second filter unit, and the third frequency mixing unit are sequentially connected. The first signal source unit is connected to the first frequency mixing unit, and the second signal source unit is connected to the second frequency mixing unit via the frequency multiplication unit. The first signal source unit is configured to generate a first local-frequency electromagnetic wave signal, and the second signal source unit is configured to generate a second local-frequency electromagnetic wave signal. A center frequency of the first local-frequency electromagnetic wave signal is $f_1$, a center frequency of the second local-frequency electromagnetic wave signal is $f_2$, the center frequency of the first electromagnetic wave signal is $f_0$, $f_1+f_2=f_0$, $f_1<f_0-F/2$, and F represents bandwidth of the first electromagnetic wave signal.

The first frequency mixing unit is configured to mix the first electromagnetic wave signal and the first local-frequency electromagnetic wave signal to obtain a first frequency-mixed signal. The first filter unit is configured to filter the first frequency-mixed signal to obtain a first sub-signal in the first frequency-mixed signal, where a center frequency of the first sub-signal is $f_2$. The frequency multiplication unit is configured to obtain a frequency multiplied signal of the second local-frequency electromagnetic wave signal, where a center frequency of the frequency multiplied signal is twice $f_2$. The second frequency mixing unit is configured to mix the first sub-signal and the frequency multiplied signal to obtain a second frequency-mixed signal. The second filter unit is configured to filter the second frequency-mixed signal to obtain a second sub-signal in the second frequency-mixed signal, where a center frequency of the second sub-signal is $f_2$. The third frequency mixing unit is configured to mix the second sub-signal and the first local-frequency electromagnetic wave signal to obtain the second electromagnetic wave signal.

Manner 5: When performing the target processing on the first electromagnetic wave signal, the target processing module performs parametric amplification on the first electromagnetic wave signal to obtain the second electromagnetic wave signal. It should be noted that when the target processing module performs the target processing on the first electromagnetic wave signal in the manner 5, there are various processing manners of the target third node.

In a first optional processing manner of the manner 5, the target processing module includes a signal source unit, a first filter unit, a second filter unit, a third filter unit, and a nonlinear unit. The signal source unit is configured to provide a local-frequency electromagnetic wave signal. The signal source unit is connected to the second filter unit, and the first filter unit, the second filter unit, and the third filter unit are all connected to the nonlinear unit.

The first filter unit is configured to filter the first electromagnetic wave signal to obtain a first filtered signal, where a center frequency of the first filtered signal is the center frequency of the first electromagnetic wave signal. The second filter unit is configured to filter the local-frequency electromagnetic wave signal to obtain a second filtered signal. The nonlinear unit is configured to perform parametric amplification on the first filtered signal based on the second filtered signal to obtain a parametric amplified signal. The third filter unit is configured to filter the parametric amplified signal to obtain the second electromagnetic wave signal. The center frequency of the second electromagnetic wave signal is $Mf_p+Nf_0$, both M and N are non-zero integers, N is less than zero, $f_0$ represents the center frequency of the first electromagnetic wave signal, and $f_p$ represents the center frequency of the second filtered signal.

In a second optional processing manner of the manner 5, the target processing module includes a signal source unit, a connection unit, a first filter unit, a second filter unit, and a nonlinear unit. The connection unit has a first end, a second end, and a third end, the first end is connected to the first adjacent node, the second end is connected to the second adjacent node, and the third end is connected to one end of the first filter unit. The connection unit is configured to transmit a signal that is input from the first end to the third end and transmit a signal that is input from the third end to the second end. The other end of the first filter unit and the second filter unit are both connected to the nonlinear unit. The signal source unit is connected to the second filter unit, and the signal source unit is configured to provide a local-frequency electromagnetic wave signal.

The first filter unit is configured to filter the first electromagnetic wave signal input from the one end of the first filter unit to obtain a first filtered signal and output the first filtered signal from the other end of the first filter unit, where a center frequency of the first filtered signal is the center frequency of the first electromagnetic wave signal. The second filter unit is configured to filter the local-frequency electromagnetic wave signal to obtain a second filtered signal. The nonlinear unit is configured to perform parametric amplification on the first filtered signal based on the second filtered signal to obtain a parametric amplified signal. The first filter unit is configured to filter the parametric amplified signal from the nonlinear unit to obtain the second electromagnetic wave signal and output the second electromagnetic wave signal from the other end of the first filter unit. The center frequency of the second electromagnetic wave signal is $Mf_p+Nf_0$, $Mf_p+Nf_0-f_0$, both M and N are non-zero integers, N is less than zero, $f_0$ represents the center frequency of the first electromagnetic wave signal, and $f_p$ represents the center frequency of the second filtered signal.

Optionally, before performing the target processing on the first electromagnetic wave signal, the target processing module may be further configured to perform low-noise amplification on the first electromagnetic wave signal, to improve quality of the first electromagnetic wave signal.

Optionally, after performing the target processing on the first electromagnetic wave signal to obtain the second electromagnetic wave signal, and before sending the second electromagnetic wave signal to the second adjacent node, the target processing module may be further configured to perform power amplification on the second electromagnetic wave signal, to increase power of the second electromagnetic wave signal, thereby reducing a transmission loss of the electromagnetic wave signal on the cable.

Optionally, the first electromagnetic wave signal is a terahertz signal, an optical signal, or the like.

According to a third aspect, a chip is provided. The chip includes a programmable logic circuit and/or program instructions. When running, the chip is configured to implement the communication method according to any design in the first aspect.

According to a fourth aspect, a communication method is provided. The method is executed by a second node, the second node is connected to a first node over a cable, and at least one third node is disposed on the cable. The method includes: after receiving an electromagnetic wave signal sent by an adjacent third node, the second node may determine, based on the received electromagnetic wave signal, data carried in the electromagnetic wave signal sent by the first node.

Further, in this disclosure, each third node may be a target third node. In a process of performing target processing on the received first electromagnetic wave signal, each third node performs processing used to cause conjugate reversal of a spectrum of the electromagnetic wave signal on the first electromagnetic wave signal. Therefore, when an even number of third nodes are disposed on the cable, the even number of third nodes may be divided into a plurality of groups of third nodes that are sequentially arranged in a direction from the first node to the second node, and each group of third nodes includes two third nodes. After target processing is performed by the two third nodes on the electromagnetic wave signal, the conjugate reversal does not occur on the spectrum of the electromagnetic wave signal. Therefore, the conjugate reversal does not occur on the electromagnetic wave signal received by the second node relative to the spectrum of the electromagnetic wave signal sent by the first node.

However, when an odd number of third nodes are disposed on the cable, the odd number of third nodes may be divided into a plurality of groups of third nodes and one third node that are sequentially arranged in a direction from the first node to the second node, and each group of third nodes includes two third nodes. After target processing is performed by the two third nodes on the electromagnetic wave signal, the conjugate reversal does not occur on the spectrum of the electromagnetic wave signal. However, after the electromagnetic wave signal is processed by a last third node, the conjugate reversal occurs on the spectrum of the electromagnetic wave signal. Therefore, the conjugate reversal occurs on the electromagnetic wave signal received by the second node relative to the spectrum of the electromagnetic wave signal sent by the first node. Therefore, when the odd number of third nodes are disposed on the cable, the second node needs to perform the processing used to cause the conjugate reversal of the spectrum of the electromagnetic wave signal on the received electromagnetic wave signal.

For example, when the odd number of third nodes are disposed on the cable, when determining, based on the received electromagnetic wave signal, the data carried in the electromagnetic wave signal sent by the first node, the second node may first process the electromagnetic wave signal received by the second node to obtain the electromagnetic wave signal sent by the first node, then obtain a baseband signal of the electromagnetic wave signal, and perform constellation mapping based on the baseband signal to obtain the data carried in the electromagnetic wave signal sent by the first node. A process in which the second node processes the received electromagnetic wave signal to obtain the electromagnetic wave signal sent by the first node is the same as a process in which the target third node performs the target processing on the first electromagnetic wave signal to obtain the second electromagnetic wave signal. Details are not described herein in this disclosure.

For another example, when the odd number of third nodes are disposed on the cable, when the second node determines, based on the received electromagnetic wave signal, the data carried in the electromagnetic wave signal sent by the first node, the second node may first obtain a second baseband signal of the received electromagnetic wave signal, where the second baseband signal includes a real part signal and an imaginary part signal. Then, the second node may obtain a first baseband signal based on the second baseband signal, where the first baseband signal is conjugate to the second baseband signal. Finally, the second node may perform constellation mapping based on the first baseband signal to obtain the data carried in the electromagnetic wave signal sent by the first node.

When the even number of third nodes are disposed on the cable, the second node may directly obtain a baseband signal of the received electromagnetic wave signal and perform constellation mapping based on the real part signal and the imaginary part signal in the baseband signal to obtain the data carried in the electromagnetic wave signal sent by the first node.

In addition, if the second electromagnetic wave signal is different from a conjugate reversed signal, before determining, based on the received electromagnetic wave signal, the data carried in the electromagnetic wave signal sent by the first node, the second node may further compensate for the difference.

According to a fifth aspect, a communication apparatus is provided. The communication apparatus is a second node, the second node is connected to a first node over a cable, and at least one third node is disposed on the cable. The communication apparatus includes a receiving module and a determining module. The receiving module is configured to receive an electromagnetic wave signal sent by an adjacent third node. The determining module is configured to determine, based on the received electromagnetic wave signal, data carried in the electromagnetic wave signal sent by the first node.

Further, in this disclosure, each third node may be a target third node. In a process of performing target processing on the received first electromagnetic wave signal, each third node performs processing used to cause conjugate reversal of a spectrum of the electromagnetic wave signal on the first electromagnetic wave signal. Therefore, when an even number of third nodes are disposed on the cable, the even number of third nodes may be divided into a plurality of groups of third nodes that are sequentially arranged in a direction from the first node to the second node, and each group of third nodes includes two third nodes. After target processing is performed by the two third nodes on the electromagnetic wave signal, the conjugate reversal does not occur on the spectrum of the electromagnetic wave signal. Therefore, the conjugate reversal does not occur on the electromagnetic wave signal received by the second node relative to the spectrum of the electromagnetic wave signal sent by the first node.

However, when an odd number of third nodes are disposed on the cable, the odd number of third nodes may be divided into a plurality of groups of third nodes and one third node that are sequentially arranged in a direction from the first node to the second node, and each group of third nodes includes two third nodes. After target processing is performed by the two third nodes on the electromagnetic wave signal, the conjugate reversal does not occur on the spectrum of the electromagnetic wave signal. However, after the electromagnetic wave signal is processed by a last third node, the conjugate reversal occurs on the spectrum of the electromagnetic wave signal. Therefore, the conjugate reversal occurs on the electromagnetic wave signal received by the second node relative to the spectrum of the electromagnetic wave signal sent by the first node. Therefore, when the odd number of third nodes are disposed on the cable, the determining module in the second node needs to perform the processing used to cause the conjugate reversal of the spectrum of the electromagnetic wave signal on the received electromagnetic wave signal.

For example, when the odd number of third nodes are disposed on the cable, when determining, based on the received electromagnetic wave signal, the data carried in the electromagnetic wave signal sent by the first node, the determining module may first process the electromagnetic wave signal received by the second node to obtain the electromagnetic wave signal sent by the first node, then obtain a baseband signal of the electromagnetic wave signal, and perform constellation mapping based on the baseband signal to obtain the data carried in the electromagnetic wave signal sent by the first node. A process in which the second node processes the received electromagnetic wave signal to obtain the electromagnetic wave signal sent by the first node is the same as a process in which the target third node performs the target processing on the first electromagnetic wave signal to obtain the second electromagnetic wave signal. Details are not described herein in this disclosure.

For another example, when the odd number of third nodes are disposed on the cable, when the determining module determines, based on the received electromagnetic wave signal, the data carried in the electromagnetic wave signal sent by the first node, the determining module may first obtain a second baseband signal of the received electromagnetic wave signal, where the second baseband signal includes a real part signal and an imaginary part signal. Then, the determining module may obtain a first baseband signal based on the second baseband signal, where the first baseband signal is conjugate to the second baseband signal. Finally, the determining module may perform constellation mapping based on the first baseband signal to obtain the data carried in the electromagnetic wave signal sent by the first node.

When the even number of third nodes are disposed on the cable, the determining module may directly obtain a baseband signal of the received electromagnetic wave signal and perform constellation mapping based on the real part signal and the imaginary part signal in the baseband signal to obtain the data carried in the electromagnetic wave signal sent by the first node. In addition, if the second electromagnetic wave signal is different from a conjugate reversed signal, before determining, based on the received electromagnetic wave signal, the data carried in the electromagnetic wave signal sent by the first node, the second node may further compensate for the difference.

According to a sixth aspect, a chip is provided. The chip includes a programmable logic circuit and/or program instructions. When running, the chip is configured to implement the communication method according to any design in the fourth aspect.

According to a seventh aspect, a communication system is provided. The communication system includes a first node, a second node, and at least one third node, the first node is connected to the second node over a cable, and the at least one third node is disposed on the cable. A target third node is one of the at least one third node, and the target third node is the communication apparatus according to any design in the second aspect, or the target third node includes the chip according to the third aspect. The second node is the communication apparatus according to any design in the fifth aspect, or the second node includes the chip according to the sixth aspect.

Further, the cable is divided into a plurality of cable sections by the first node, the at least one third node, and the second node. A cable section between a $(2n+1)^{th}$ node and a $(2n+2)^{th}$ node located in the first node, the at least one third node, and the second node is referred to as a first cable section, where n>0. A cable section between a $(2n+2)^{th}$ node and a $(2n+3)^{th}$ node located in the first node, the at least one third node, and the second node is referred to as a second cable section.

A length of each cable section meets a specific constraint condition.

For example, the length of each cable section in the cable meets the first constraint condition: an absolute value of a difference between a sum of lengths of the first cable section and a sum of lengths of the second cable section in the cable is less than a first length.

The first length is a minimum value of a frequency selective fading transmission length and a dispersion transmission length. After the frequency selective fading transmission length is transmitted over the cable, a maximum fading amplitude in fading amplitudes of frequencies in the electromagnetic wave signal sent by the first node is a maximum fading amplitude that is capable of being processed by the second node. The frequency selective fading transmission length may be a quotient of the maximum fading amplitude and a unit fading amplitude in the cable. The unit fading amplitude is a maximum fading amplitude of fading amplitudes of frequencies in the electromagnetic wave signal sent by the first node when the electromagnetic wave signal is transmitted over a cable section of a unit length in the cable. After the dispersion transmission length is transmitted over the cable, dispersion of the electromagnetic wave signal sent by the first node is maximum dispersion that is capable of being processed by the second node. The dispersion transmission length may be a quotient of the maximum dispersion and a dispersion amount of a cable section per unit length in the cable.

When the first length is the minimum value of the frequency selective fading transmission length and the dispersion transmission length, the absolute value of the difference between the sum of the lengths of the first cable section and the sum of the lengths of the second cable section in the cable is less than the minimum value. This can ensure that both frequency selective fading and group delay dispersion of the electromagnetic wave signal received by the second node are small.

For another example, the length of each cable section in the cable meets a second constraint condition: a length of a cable section between any two adjacent nodes in the cable is less than or equal to a second length, and the second length is a maximum length that can be transmitted by the electromagnetic wave signal sent by the first node.

The maximum length that can be transmitted by the electromagnetic wave signal sent by the first node is a maximum length transmitted by the electromagnetic wave signal when no node exists between the first node and the second node and the electromagnetic wave signal sent by the first node can be effectively received by the second node. The maximum length is determined by device parameters such as a transmission loss of the electromagnetic wave signal transmitted over the cable, power of transmitting the electromagnetic wave signal by the first node, and sensitivity of receiving the electromagnetic wave signal by the second node. When the length of the cable section between the any two adjacent nodes is less than or equal to the maximum length that can be transmitted by the electromagnetic wave signal sent by the first node, it can be ensured that the electromagnetic wave signal can be effectively transmitted between the cable sections.

Further, at least one fourth node may be further disposed on the cable, and the fourth node is configured to perform power amplification on the electromagnetic wave signal transmitted over the cable. When a transmission length between the first node and the second node is long, and a quantity of third nodes is large, in this disclosure, the fourth node may be further disposed on one or more cable sections, so that the fourth node performs the power amplification on the electromagnetic wave signal transmitted over the cable, thereby ensuring that power of the electromagnetic wave signal received by the second node is high, and reducing a transmission loss of the electromagnetic wave signal.

For technical effects brought by corresponding design manners in any two of the first aspect to the seventh aspect, refer to each other. Details are not described herein again.

DESCRIPTION OF EMBODIMENTS

To make principles and technical solutions of this disclosure clearer, the following further describes implementations of this disclosure in detail with reference to the accompanying drawings.

Figures 1, 2, 3:
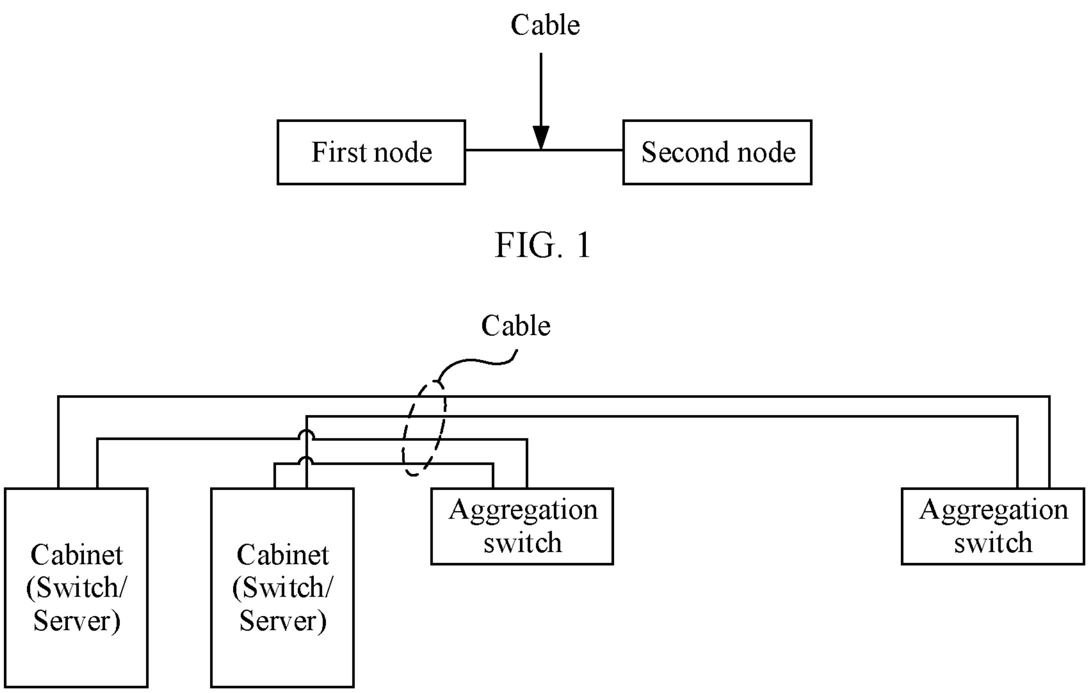
FIG. 1 is a schematic diagram of a structure of a communication system according to an embodiment of this disclosure.
FIG. 2 is a schematic diagram of a structure of another communication system according to an embodiment of this disclosure.
FIG. 3 is a schematic diagram of a structure of another communication system according to an embodiment of this disclosure.

An embodiment of this disclosure provides a communication system. As shown in FIG. 1, the communication system includes a first node and a second node. A quantity of first nodes and a quantity of second nodes in the communication system are not limited. The first node and the second node are connected over a cable. The cable may be a polymer cable, and the cable can transmit an electromagnetic wave signal, for example, a terahertz signal (an electromagnetic wave signal of a terahertz frequency) or an optical signal.

For example, as shown in FIG. 2, the communication system provided in this embodiment of this disclosure may be a data center, the first node in the communication system may be a switch or a server in a cabinet, and the second node may be an aggregation switch. A communication interface between the first node and the second node may be a standard interface, for example, a quad small form-factor pluggable (quad small form-factor pluggable, QSFP) interface, a small form-factor pluggable (small form-factor pluggable, SFP) interface, a CXP interface (an interface with a transmission rate of 12×10 gigabits per second), or a CX4 interface (an interface with a transmission rate of 10 gigabits per second). The communication system shown in FIG. 2 includes two first nodes and two second nodes, and each first node is connected to each second node over a cable.

For another example, as shown in FIG. 3, the communication system provided in this embodiment of this disclosure may be an audio and video data transmission system. The first node in the communication system may be an audio and video data source device in a multimedia center, and the second node may be a display or a projector in a conference room (or an entertainment place). A communication interface between the first node and the second node may be a standard multimedia display interface, for example, a high-definition multimedia interface (high definition multimedia interface, HDMI) or a display port (display port, DP). The communication system shown in FIG. 3 includes one first node and two second nodes, and the first node is connected to each second node over a cable.

Figure 4:
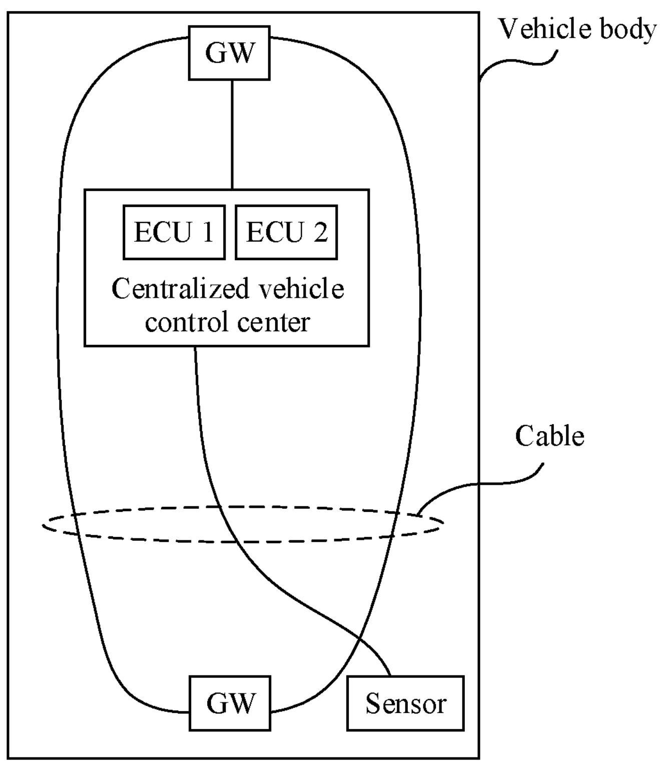
FIG. 4 is a schematic diagram of a structure of another communication system according to an embodiment of this disclosure.

For another example, as shown in FIG. 4, the communication system provided in this embodiment of this disclosure may be a vehicle-mounted wired network system. The vehicle-mounted wired network system includes a vehicle body, at least one distributed gateway (GW) (two GWs are used as an example in FIG. 4), a centralized vehicle control center, and at least one sensor (one sensor is used as an example in FIG. 4). The centralized vehicle control center includes at least one electronic control unit (ECU) (two ECUs are used as an example in FIG. 4). In every two parts that are connected over a cable in the system shown in FIG. 4, one part is a first node, and the other part is a second node, and communicates with each other over the cable. For example, an ECU 1 may be used as the first node, and the sensor may be used as the second node; or in the two GWs, one GW is the first node, and the other GW is the second node.

In the communication system provided in this embodiment of this disclosure, an electromagnetic wave signal may be transmitted between the first node and the second node over the cable for communication. For example, the first node may modulate an electromagnetic wave signal based on data that needs to be transmitted and send the electromagnetic wave signal to the cable. After being transmitted over the cable, the electromagnetic wave signal is received and demodulated by the second node, to restore the data that needs to be transmitted by the first node. For example, refer to FIG. 5. The first node may include a transmitter. The transmitter includes a modulator configured to modulate an electromagnetic wave signal based on data that needs to be sent to the second node. Optionally, the transmitter may further include a power amplifier (Power Amplifier, PA) and a coupler. The PA is connected to the modulator and is configured to perform power amplification on an electromagnetic wave signal modulated by the modulator. One end of the coupler is connected to the PA, and the other end is connected to a cable, and is configured to transmit, to the cable, an electromagnetic wave signal obtained after the power amplification by the PA.

Figure 5:
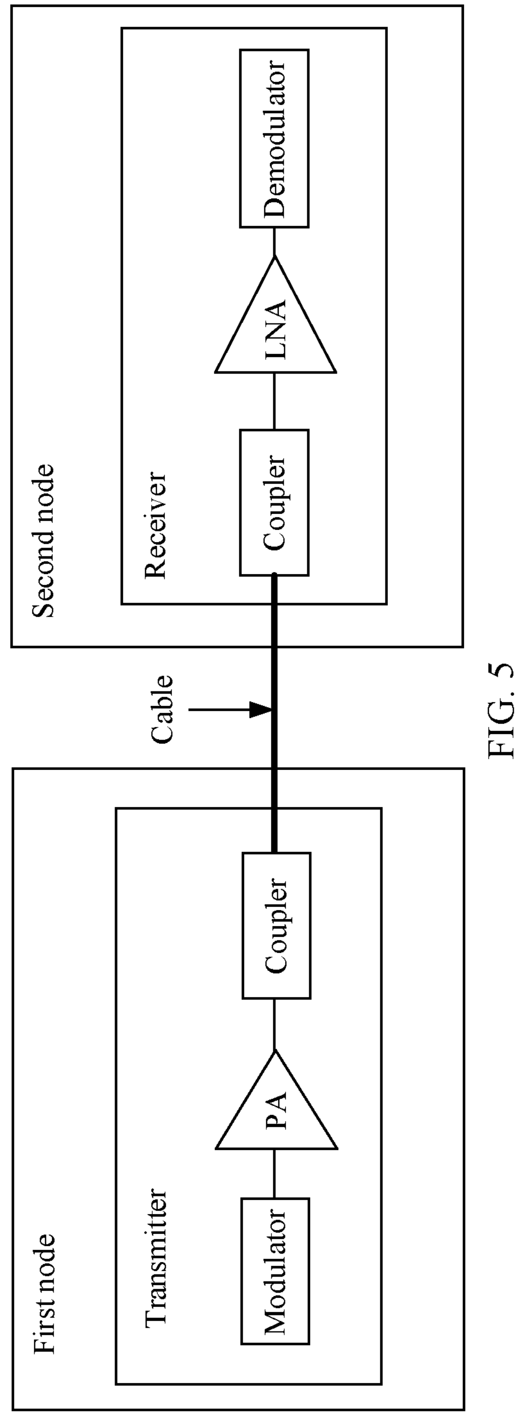
FIG. 5 is a schematic diagram of a structure of another communication system according to an embodiment of this disclosure.

Still refer to FIG. 5. The second node includes a receiver. The receiver includes a demodulator configured to demodulate an electromagnetic wave signal into data, and the like. Optionally, the receiver further includes a low noise amplifier (LNA) and a coupler. One end of the coupler is connected to a cable, and the other end is connected to the LNA. The coupler is configured to receive an electromagnetic wave signal transmitted over the cable. The LNA is configured to perform low noise amplification on an electromagnetic wave signal from the coupler. The demodulator is configured to demodulate an electromagnetic wave signal obtained after the low-noise amplification.

Optionally, the second node may further include another component. For example, the second node further includes a clock restorer and an equalizer (not shown in FIG. 5). The clock restorer is configured to extract a clock signal from a baseband signal (a baseband signal obtained by demodulating an electromagnetic wave signal by the demodulator). The equalizer is configured to equalize the baseband signal based on the clock signal, to obtain data carried in the baseband signal.

It should be noted that, in this embodiment of this disclosure, that the first node sends an electromagnetic wave signal to the second node is used as an example. Optionally, the second node may also send an electromagnetic wave signal to the first node. In this case, the first node includes the receiver in FIG. 5, and the second node includes the transmitter in FIG. 5.

It can be learned from the foregoing content that the electromagnetic wave signal may be transmitted between the first node and the second node over a cable for communication. However, due to a material characteristic and a structure characteristic of the cable, the electromagnetic wave signal is greatly affected when being transmitted over the cable. The following describes three aspects of the impact.

According to a first aspect, a transmission loss occurs when the electromagnetic wave signal is transmitted over the cable, and the transmission loss causes an energy loss of the electromagnetic wave signal. In addition, a longer transmission length of the electromagnetic wave signal in the cable indicates a larger energy loss of the electromagnetic wave signal. When energy of the electromagnetic wave signal received by the second node is lower than sensitivity of the second node, the second node cannot demodulate and restore data that needs to be sent by the first node. That energy of the signal received by the second node is lower than sensitivity of the second node means that a transmission loss of the electromagnetic wave signal received by the second node is greater than a maximum transmission loss of an electromagnetic wave signal that can be demodulated and recovered by the second node.

Figure 6:
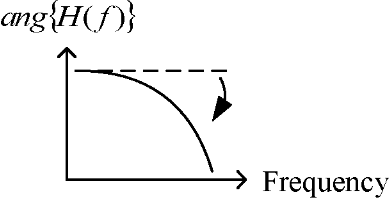
FIG. 6 is a schematic diagram of group delay dispersion according to an embodiment of this disclosure.

According to a second aspect, group delay dispersion occurs when the electromagnetic wave signal is transmitted over the cable. The group delay dispersion means that signals of different frequencies in the electromagnetic wave signal have different propagation speeds when being transmitted over the cable. When the electromagnetic wave signal is a terahertz signal, because bandwidth of the terahertz signal is large, and a frequency difference of in-band signals is large, the group delay dispersion causes serious waveform distortion of the terahertz signal. In addition, a longer transmission length of the electromagnetic wave signal in the cable indicates severer group delay dispersion and larger waveform distortion of the electromagnetic wave signal. For example, as shown in FIG. 6, if a channel transmission function of the cable is $H(f)$, where f represents a frequency of the electromagnetic wave signal, an image of the group delay dispersion of the electromagnetic wave signal (represented as an image of $ang\{H(f)\}$ that varies with a frequency) has a quadratic curve change characteristic, and severer group delay dispersion indicates a larger curvature of the quadratic curve. $ang\{H(f)\}$ indicates a phase of $H(f)$.

Figure 7:
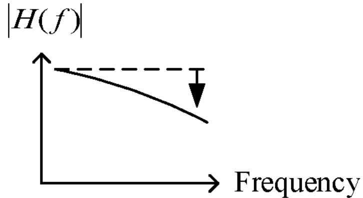
FIG. 7 is a schematic diagram of frequency selective fading according to an embodiment of this disclosure.

According to a third aspect, frequency selective fading occurs when the electromagnetic wave signal is transmitted over the cable. The frequency selective fading means that fading (energy loss) of signals at different frequencies in the electromagnetic wave signal is different. In addition, when the electromagnetic wave signal is the terahertz signal, generally, fading of a high-frequency signal in the terahertz signal is greater than fading of a low-frequency signal, and such unflat fading of a signal spectrum also causes distortion of a signal waveform. In addition, a longer transmission length of the electromagnetic wave signal in the cable indicates severer frequency selective fading, and a larger fading difference between high-frequency and low-frequency signals in the electromagnetic wave signal. Therefore, a larger in-band unflatness degree of the electromagnetic wave signal indicates severer distortion of the electromagnetic wave signal. For example, as shown in FIG. 7, if a channel transmission function of the cable is $H(f)$, where f represents a frequency of the electromagnetic wave signal, an image of the frequency selective fading of the electromagnetic wave signal (represented as an image of $|H(f)|$ that varies with a frequency) is tilted towards a high frequency direction, and a severer amplitude of the frequency selective fading indicates a larger tilt degree of a frequency selective fading curve. $|H(f)|$ indicates an absolute value of $H(f)$.

It can be learned that the cable has great impact on transmission of the electromagnetic wave signal, and consequently, the electromagnetic wave signal received by the second node has distortion, and effective communication between the first node and the second node is affected.

In a conventional technology, to reduce impact on transmission of the electromagnetic wave signal in the cable, a fourth node may be disposed on the cable between the first node and the second node.

Figure 8:
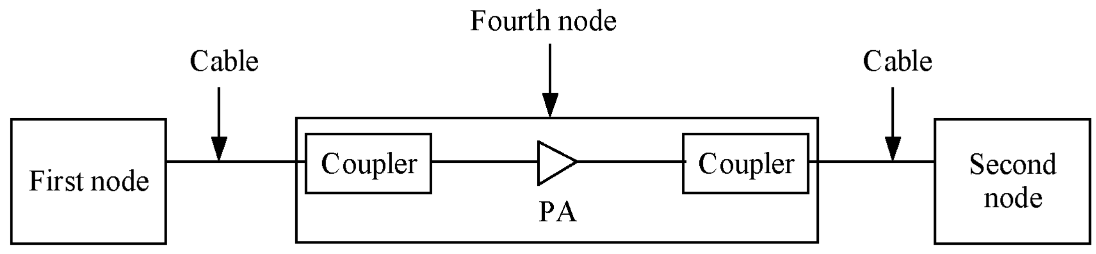
FIG. 8 is a schematic diagram of a structure of a fourth node according to an embodiment of this disclosure.

For example, as shown in FIG. 8, the fourth node is configured to increase power of the electromagnetic wave signal transmitted over the cable. The fourth node includes two couplers and a PA connected in series between the two couplers. The coupler is connected to a cable, and the PA is configured to perform power amplification on an electromagnetic wave signal that passes through the coupler. However, the fourth node shown in FIG. 8 cannot prevent the electromagnetic wave signal from being affected by group delay dispersion and frequency selective fading.

Figure 9:
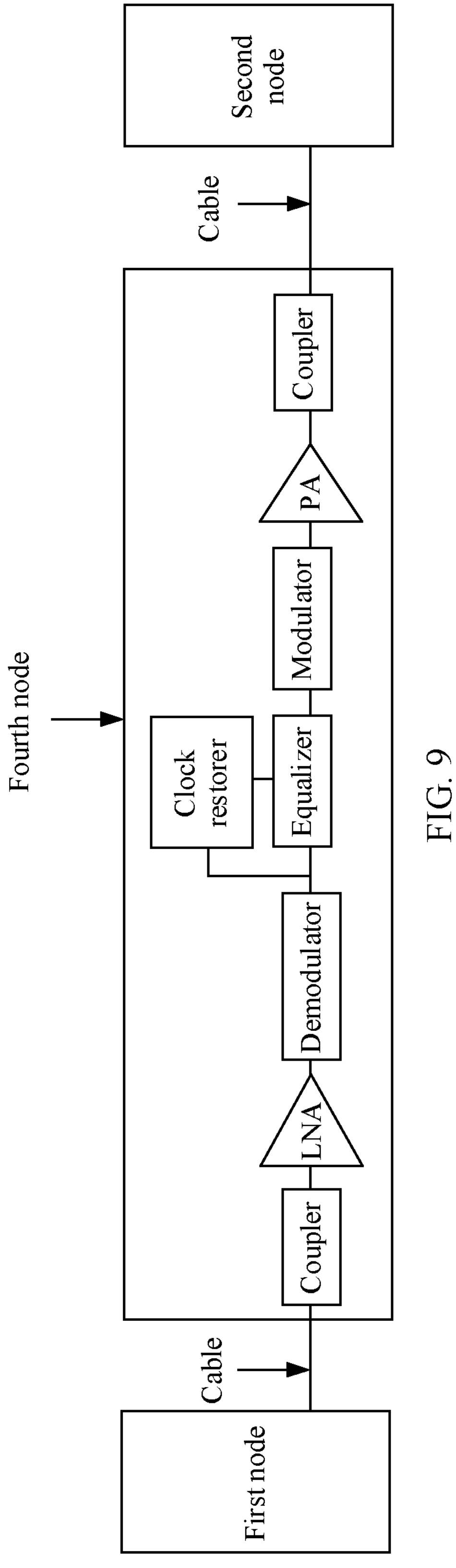
FIG. 9 is a schematic diagram of a structure of another fourth node according to an embodiment of this disclosure.

For another example, as shown in FIG. 9, the fourth node includes: two couplers, and an LNA, a demodulator, an equalizer, a modulator, and a PA that are sequentially connected in series between the two couplers, and a clock restorer connected to both the demodulator and the equalizer. The coupler is connected to a cable. The LNA is configured to perform low noise amplification on an electromagnetic wave signal from one coupler. The demodulator is configured to demodulate the electromagnetic wave signal to obtain a baseband signal that carries data. The clock restorer is configured to extract a clock signal from the baseband signal. The equalizer is configured to equalize the baseband signal based on the clock signal, to obtain data carried in the baseband signal. The modulator is configured to modulate the electromagnetic wave signal based on the data. The PA is configured to perform power amplification on the electromagnetic wave signal modulated by the modulator and transmit an electromagnetic wave signal obtained after the power amplification to the cable via the other coupler.

It can be learned that the fourth node shown in FIG. 9 is configured to demodulate the received electromagnetic wave signal to restore data carried in the electromagnetic wave signal, and then modulate the data to obtain a new electromagnetic wave signal, to compensate for impact on transmission of the electromagnetic wave signal on the cable between the first node and the fourth node. However, a process of processing the electromagnetic wave signal by the fourth node shown in FIG. 9 is complex, which affects transmission efficiency of the electromagnetic wave signal, and cannot compensate for impact on transmission of the electromagnetic wave signal between the fourth node and the second node.

Figure 10:
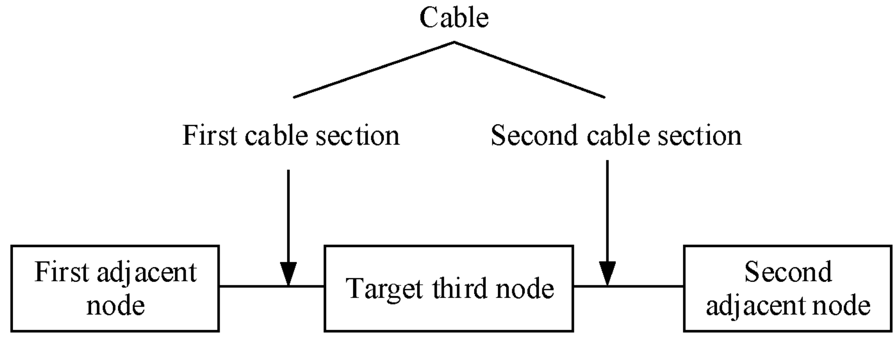
FIG. 10 is a schematic diagram of a structure of another communication system according to an embodiment of this disclosure.

To reduce impact on transmission of the electromagnetic wave signal in the cable, an embodiment of this disclosure provides a communication system. As shown in FIG. 10, based on the communication system shown in FIG. 1, at least one third node may be disposed on a cable between a first node and a second node. There may be one or more third nodes. In FIG. 10, one third node is used as an example. The third node may be a device, for example, a gateway or a router.

The target third node is one of the at least one third node, and in the first node, the second node, and the at least one third node, the target third node is adjacent to a first adjacent node and a second adjacent node. The first adjacent node may be the first node or may be another third node between the first node and the target third node, and the second adjacent node may be the second node or may be another third node between the target third node and the second node.

After receiving a first electromagnetic wave signal sent by the first adjacent node, the target third node performs target processing on the first electromagnetic wave signal to obtain a second electromagnetic wave signal and sends the second electromagnetic wave signal to the second adjacent node. The target processing includes processing used to cause conjugate reversal of a spectrum of the electromagnetic wave signal.

Optionally, amplitude-frequency curves of the first electromagnetic wave signal before and after the conjugate reversal of the spectrum occurs are axisymmetric with respect to a target straight line. Phase-frequency curves of the first electromagnetic wave signal before and after the conjugate reversal of the spectrum occurs are centrosymmetric with respect to a target point. The target straight line is perpendicular to a horizontal coordinate axis of a coordinate system in which the amplitude-frequency curve is located, and a frequency corresponding to an intersection point with the horizontal coordinate axis is a center frequency of the first electromagnetic wave signal. The target point is a point corresponding to the center frequency on a horizontal coordinate axis of a coordinate system in which the phase-frequency curve is located.

Figure 11:
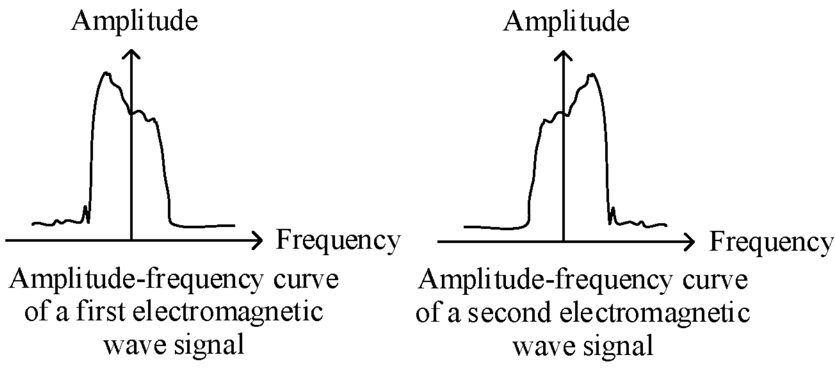
FIG. 11 is a schematic diagram of a change of an amplitude-frequency curve according to an embodiment of this disclosure.
Figure 12:
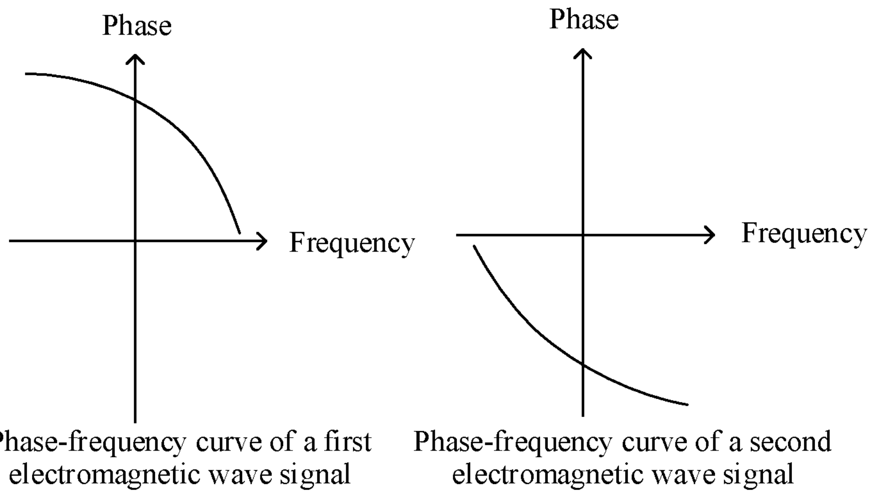
FIG. 12 is a schematic diagram of a change of a phase-frequency curve according to an embodiment of this disclosure.

For example, an amplitude-frequency curve of the first electromagnetic wave signal and an amplitude-frequency curve of the second electromagnetic wave signal are shown in FIG. 11, and a phase-frequency curve of the first electromagnetic wave signal and a phase-frequency curve of the second electromagnetic wave signal may be shown in FIG. 12.

Figure 13:
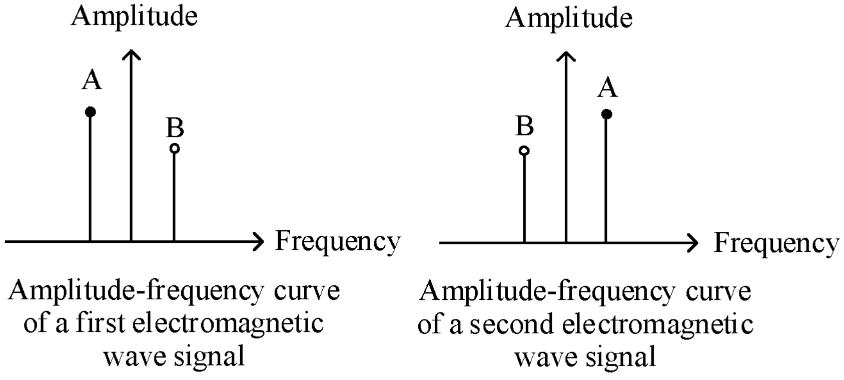
FIG. 13 is a schematic diagram of a change of another amplitude-frequency curve according to an embodiment of this disclosure.
Figure 14:
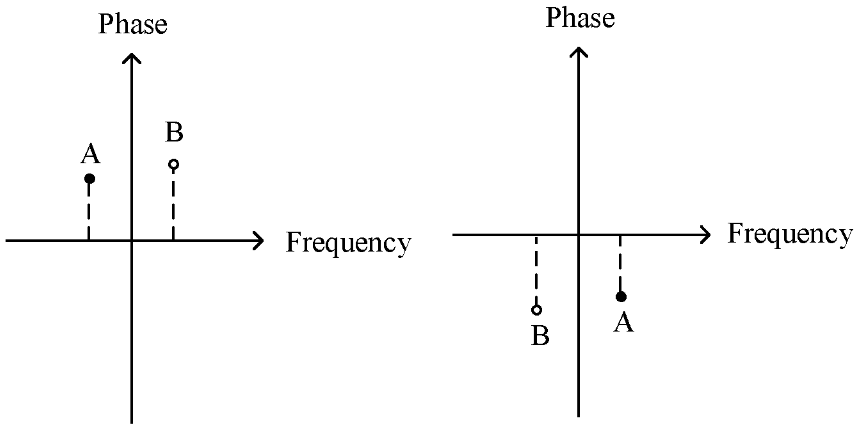
FIG. 14 is a schematic diagram of a change of another phase-frequency curve according to an embodiment of this disclosure.

For another example, an amplitude-frequency curve of the first electromagnetic wave signal and an amplitude-frequency curve of the second electromagnetic wave signal are shown in FIG. 13, and a phase-frequency curve of the first electromagnetic wave signal and a phase-frequency curve of the second electromagnetic wave signal may be shown in FIG. 14. In FIG. 13 and FIG. 14, that the first electromagnetic wave signal is a dual-tone signal is used as an example, and the first electromagnetic wave signal includes a signal A and a signal B.

Optionally, when the target third node performs the processing used to cause the conjugate reversal of the spectrum of the electromagnetic wave signal on the first electromagnetic wave signal, on one hand, for the amplitude-frequency curve in the spectrum, the target third node uses the target straight line as a symmetry axis to symmetrically exchange amplitudes corresponding to frequencies on left and right sides of the target straight line, so that the amplitude-frequency curves of the electromagnetic wave signal before and after the conjugate reversal of the spectrum occurs are axisymmetric to the target straight line; and on the other hand, for the phase-frequency curve in the spectrum, the target third node multiplies a phase corresponding to each frequency in the phase-frequency curve by −1, for example, changing the phase from 10° (degrees) to −10°, and at the same time, uses the target straight line as a symmetry axis to symmetrically exchange phases corresponding to frequencies in the phase-frequency curve, that are, phases corresponding to frequencies on the left and right sides of the target straight line, so that the phase-frequency curves of the electromagnetic wave signal before and after the conjugate reversal of the spectrum occurs are symmetric with respect to the target point.

Certainly, the target third node may also implement, in another manner, the processing used to cause the conjugate reversal of the spectrum of the electromagnetic wave signal on the first electromagnetic wave signal, for example, a manner of filtering the first electromagnetic wave signal. This is not limited in this embodiment of this disclosure.

The following analyzes effect of the foregoing processing for performing the conjugate reversal on the spectrum of the electromagnetic wave signal.

Figure 15:
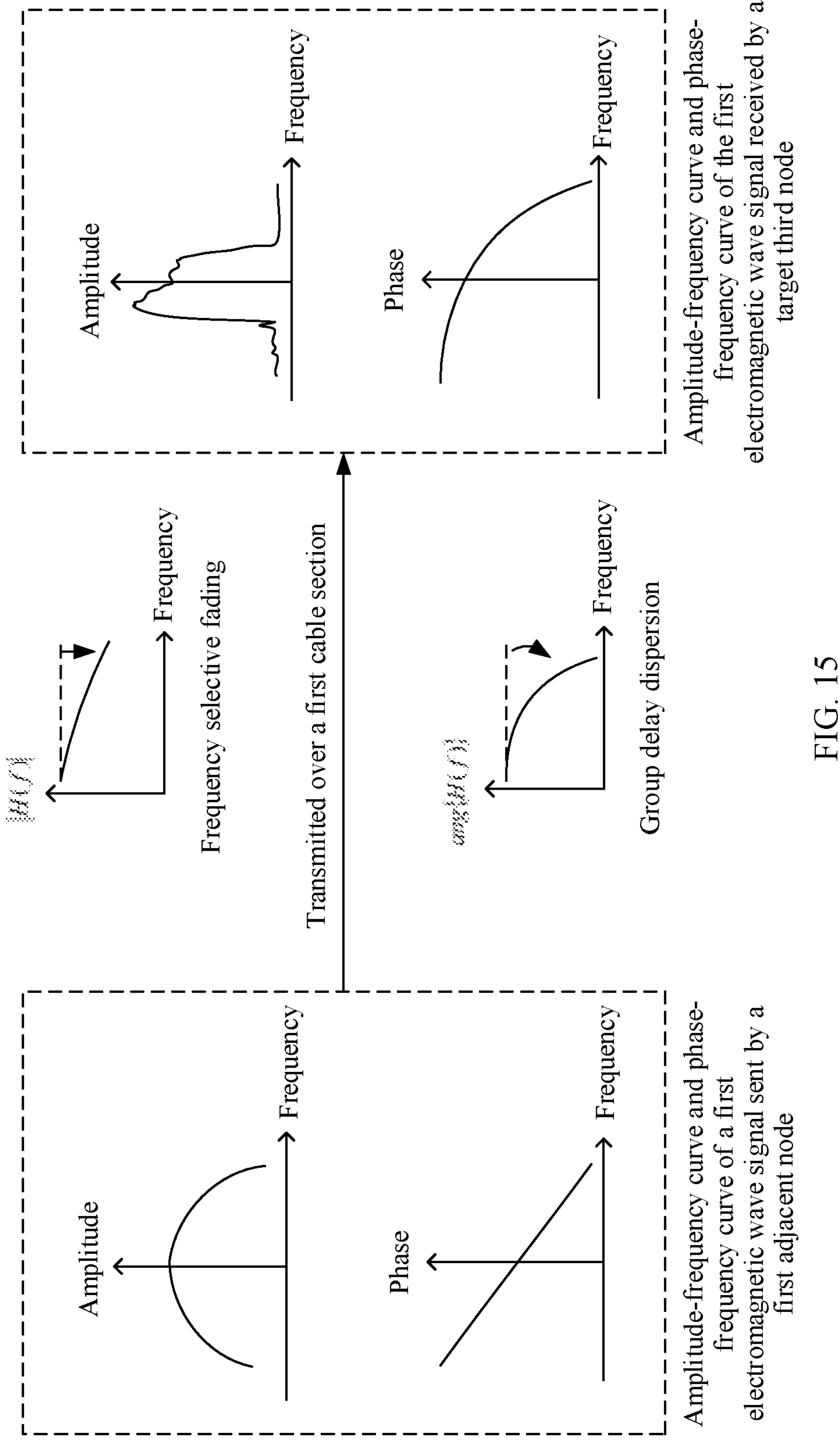
FIG. 15 is a schematic diagram of changes of an amplitude-frequency curve and a phase-frequency curve according to an embodiment of this disclosure.

The scenario shown in FIG. 10 is used as an example. After a first electromagnetic wave signal is transmitted over a first cable section, the first electromagnetic wave signal is affected by group delay dispersion and frequency selective fading, and therefore first distortion occurs. As shown in FIG. 15, a high frequency band part in an amplitude-frequency curve of the first electromagnetic wave signal received by the target third node is concave, and a phase-frequency curve of the first electromagnetic wave signal is bent upward.

Figure 16:
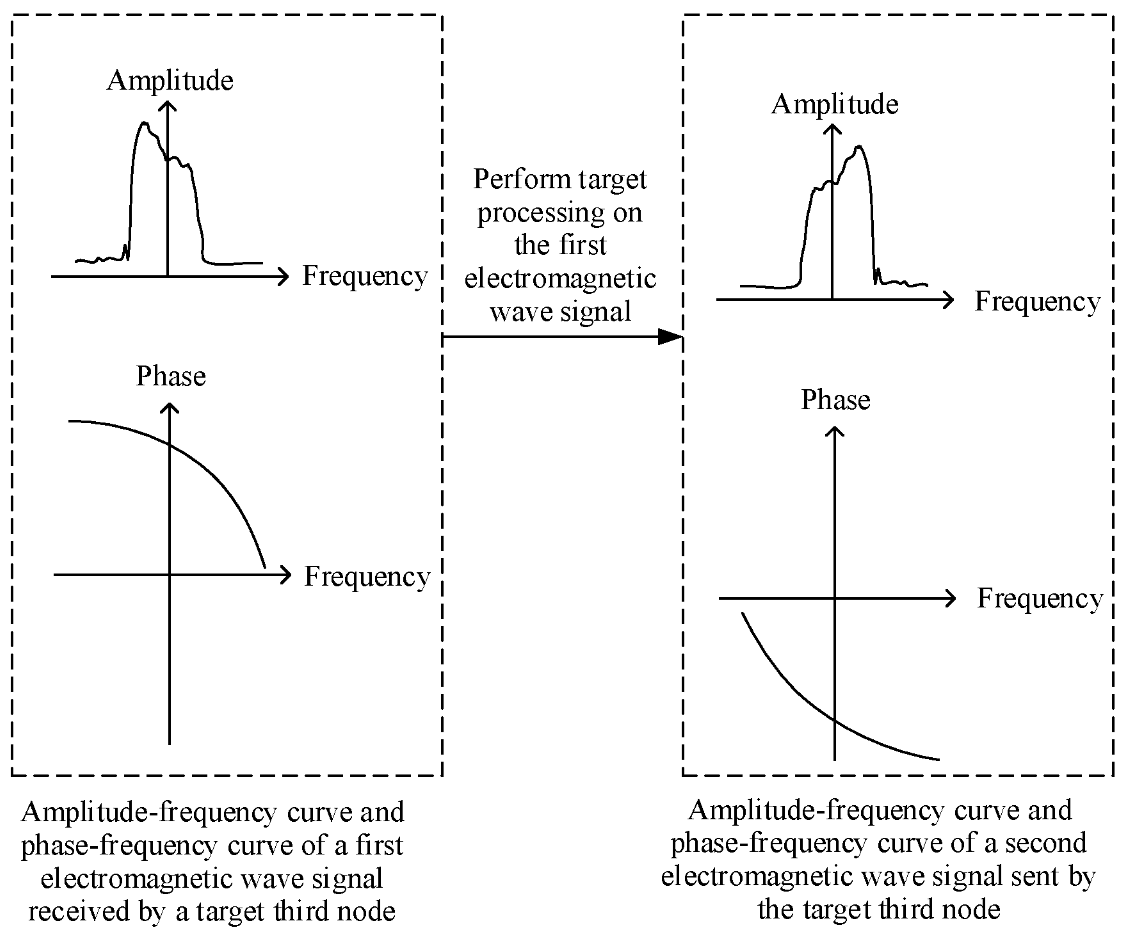
FIG. 16 is a schematic diagram of changes of another amplitude-frequency curve and another phase-frequency curve according to an embodiment of this disclosure.

After receiving the first electromagnetic wave signal, the target third node may perform target processing on the first electromagnetic wave signal. For example, when performing the target processing on the first electromagnetic wave signal, the target third node may perform, on the first electromagnetic wave signal, processing used to cause conjugate reversal of a spectrum of the electromagnetic wave signal, to obtain a second electromagnetic wave signal. An amplitude-frequency curve of the second electromagnetic wave signal is axisymmetric to the amplitude-frequency curve of the first electromagnetic wave signal with respect to a target straight line, and a phase-frequency curve of the second electromagnetic wave signal is axisymmetric to the phase-frequency curve of the first electromagnetic wave signal with respect to a target point. The amplitude-frequency curve and the phase-frequency curve of the second electromagnetic wave signal are shown in FIG. 16. It can be seen from FIG. 16 that a high frequency band part in the amplitude-frequency curve of the first electromagnetic wave signal is concave, and a low frequency band part in the amplitude-frequency curve of the second electromagnetic wave signal is concave. Concave frequency bands in the two amplitude-frequency curves are exactly different. The phase-frequency curve of the first electromagnetic wave signal is bent upward, and the phase-frequency curve of the second electromagnetic wave signal is bent downward. Bending directions of the two phase-frequency curves are exactly opposite. Through comparison between the first electromagnetic wave signal sent by the first adjacent node, the first electromagnetic wave signal received by the target third node, and the second electromagnetic wave signal obtained by the target node, it can be learned that the first electromagnetic wave signal received by the target third node has first distortion relative to the first electromagnetic wave signal sent by the first adjacent node, the second electromagnetic wave signal has second distortion relative to the first electromagnetic wave signal sent by the first adjacent node, and the first distortion is opposite to the second distortion.

Figure 17:
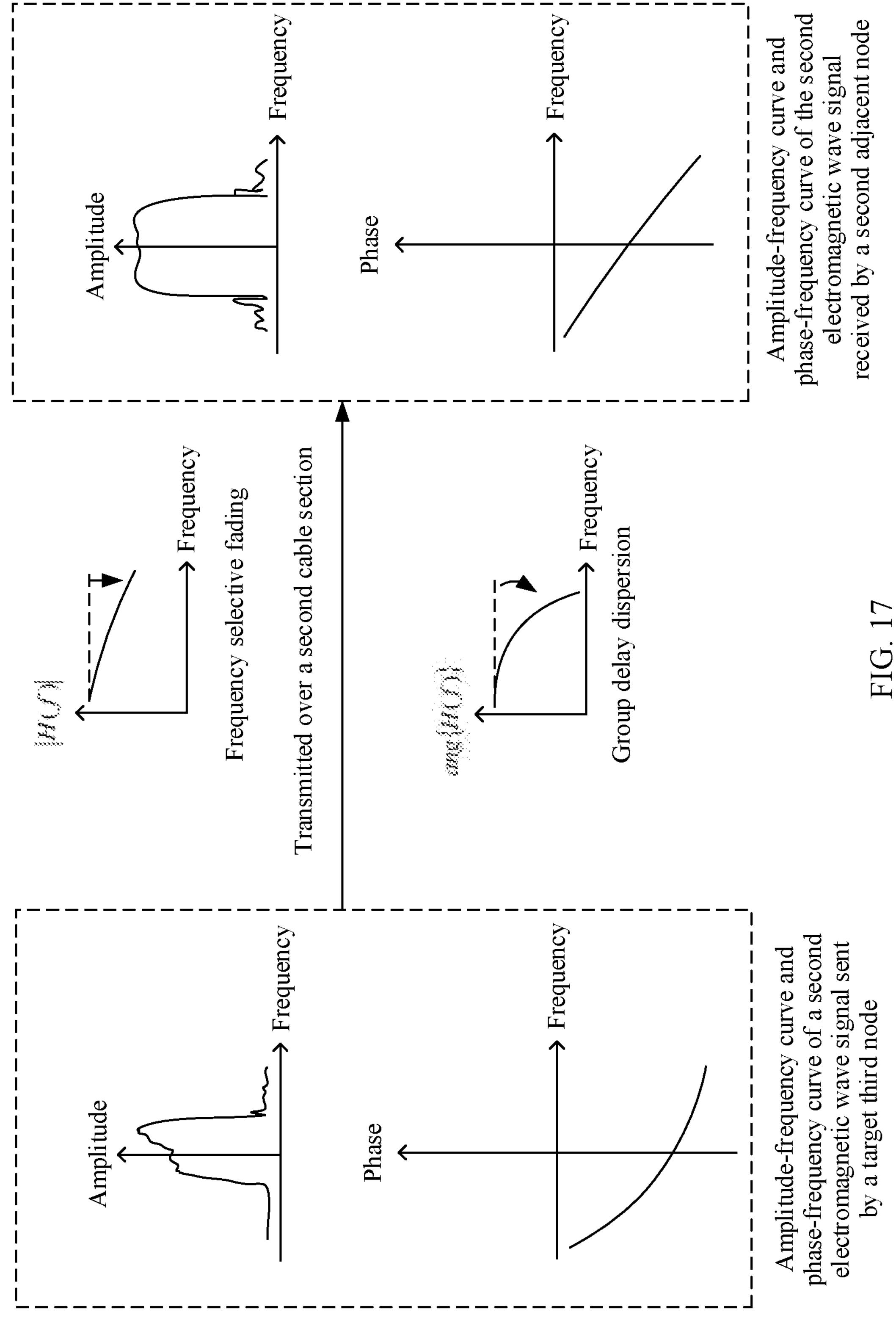
FIG. 17 is a schematic diagram of changes of another amplitude-frequency curve and another phase-frequency curve according to an embodiment of this disclosure.

After the target third node obtains the second electromagnetic wave signal, as shown in FIG. 17, the target third node may send the second electromagnetic wave signal to the second adjacent node over a second cable section. In a process in which the second electromagnetic wave signal is transmitted over the second cable section, third distortion (similar to the first distortion) occurs due to impact of frequency selective fading and group delay dispersion. As a result, both the amplitude-frequency curve and the phase-frequency curve of the second electromagnetic wave signal received by the second adjacent node change. Both the amplitude-frequency curve and the phase-frequency curve of the second electromagnetic wave signal received by the second adjacent node are shown in FIG. 17. It can be learned that a high frequency band part in the amplitude-frequency curve of the second electromagnetic wave signal is concave, and the phase-frequency curve of the first electromagnetic wave signal is bent upward.

According to the processes shown in FIG. 15 to FIG. 17, after the electromagnetic wave signal is transmitted over the first cable section or the second cable section, distortion (for example, the foregoing first distortion or third distortion) occurs in the electromagnetic wave signal. In this case, the high frequency band part in the amplitude-frequency curve of the electromagnetic wave signal is concave, and the phase-frequency curve of the electromagnetic wave signal is bent upward. However, because the target third node performs the target processing on the first electromagnetic wave signal (including the processing used to cause the conjugate reversal of the spectrum of the electromagnetic wave signal), the target processing causes the low frequency band part in the amplitude-frequency curve of the electromagnetic wave signal to concave, and the phase-frequency curve of the electromagnetic wave signal to bend downward, so that the second electromagnetic wave signal has second distortion opposite to the first distortion relative to the first electromagnetic wave signal sent by the first adjacent node. In this way, after the second electromagnetic wave signal is transmitted over the second cable section, although the third distortion occurs due to impact of the second cable section, distortion of the second electromagnetic wave signal received by the second adjacent node relative to the first electromagnetic wave signal sent by the first adjacent node can be reduced under effect of the second distortion and the third distortion.

In conclusion, in the communication system provided in this embodiment of this disclosure, the first distortion occurs in the process of transmitting the electromagnetic wave signal from the first adjacent node to the target third node, and the third distortion further occurs in the process of transmitting the electromagnetic wave signal from the target third node to the second adjacent node, and the third distortion is similar to the first distortion. The target processing performed by the target third node on the received first electromagnetic wave signal includes the processing used to cause the conjugate reversal of the spectrum of the electromagnetic wave signal. Therefore, the second electromagnetic wave signal obtained by the target third node by performing the target processing on the first electromagnetic wave has second distortion opposite to the first distortion relative to the signal sent by the first adjacent node. In the process of transmitting the electromagnetic wave signal from the target third node to the second adjacent node, the third distortion occurs in the electromagnetic wave signal. Under effect of the second distortion and the third distortion, distortion of the electromagnetic wave signal received by the second adjacent node relative to the electromagnetic wave signal sent by the first adjacent node can be reduced, and quality of communication between the first adjacent node and the second adjacent node is ensured, thereby ensuring quality of communication between the first node and the second node.

In addition, when the target third node performs the processing used to cause the conjugate reversal of the spectrum of the electromagnetic wave signal on the first electromagnetic wave signal, the target third node does not need to restore the original electromagnetic wave signal sent by the first node. Therefore, complexity of the target third node is low.

The following further analyzes effect of the target processing according to a formula.

It is assumed that a channel transfer function of a section of cable is $H(f)=\exp\{k(f-f_0)+c\}\cdot\exp\{i^*(\beta(f-f_0)^2+\alpha f)\}$, where $\exp\{k(f-f_0)+c\}$ represents the $k(f-f_0)+c$ power of e, e represents a natural constant, k represents a slope (related to frequency selective fading) of a frequency selective fading image of the cable section at a center frequency $f_0$ of an electromagnetic wave signal transmitted over the cable section, f represents any frequency in a frequency band of the electromagnetic wave signal, and c is an average transmission loss coefficient (related to a transmission loss) of the cable section at a frequency $f_0 \cdot \exp\{i*(\beta(f-f_0)^2+\alpha f)\}$ represents the $i*(\beta(f-f_0)^2+\alpha f)$ power of e, i is an imaginary unit, and β represents a group delay dispersion coefficient (and group delay dispersion) of the cable section in bandwidth of the electromagnetic wave signal. α is a constant coefficient corresponding to a transmission delay of the cable section, and does not affect an energy loss and waveform distortion of the electromagnetic wave signal.

If channel parameters of a first cable section are $k_1$, $c_1$, $\beta_1$, and $\alpha_1$, a signal transfer function of the first cable section is represented as $H_1(f)$, where $$H_1(f) = \exp\{k_1(f-f_0)+c_1\} \cdot \exp\{i*(\beta_1(f-f_0)^2+\alpha_1 f)\}.$$

After a first electromagnetic wave signal is transmitted over the first cable section, a spectrum S(f) of the first electromagnetic wave signal changes to $S_1(f)$, where $$S_1(f) = S(f)H_1(f) = S(f)\exp\{k_1(f-f_0)+c_1\} \cdot \exp\{i*(\beta_1(f-f_0)^2+\alpha_1 f)\}.$$

The target third node performs the target processing on the received first electromagnetic wave signal and a spectrum of the obtained second electromagnetic wave signal may be represented as $S_2(f)$. $S_2(f)=S^*(-f)\ \exp\{k_1(-f+f_0)+c_1\} \cdot \exp\{i*(-\beta_1(f-f_0)^2+\alpha_1 f)\}$, where $S^*(-f)$ represents conjugate symmetry of S(f);

$\exp\{k_1(-f+f_0)+c_1\}$ represents the $k_1(-f+f_0)+c_1$ power of $e$;

and $\exp\{i*(-\beta_1(f-f_0)^2+\alpha_1 f)$ represents the $i*-\beta_1(f-f_0)^2+\alpha_1 f$ power) of $e$.

After the target third node obtains the second electromagnetic wave signal, the target third node may send the second electromagnetic wave signal to the second adjacent node over a second cable section. In a process in which the second electromagnetic wave signal is transmitted over the second cable section, due to impact of the frequency selective fading and the group delay dispersion, both the amplitude-frequency curve and the phase-frequency curve of the second electromagnetic wave signal received by the second adjacent node change.

It is assumed that channel parameters of the second cable section are $k_2$, $c_2$, $\beta_2$, and $\alpha_2$, and a signal transfer function of the second cable section is represented as $H_2(f)$. $H_2(f)=\exp\{k_2\ (f-f_0)+c_2\} \cdot \exp\{i*(\beta_2(f-f_0)^2+\alpha_2 f)\}$.

A spectrum of the second electromagnetic wave signal received by the second adjacent node is represented as $S_3(f)=S_2(f)H_2(f)=S^*(-f)\ \ \exp\{(k_2-k_1)(f-f_0)+c_1+c_2\} \cdot \exp\{i*((\beta 2-\beta 1)(f-f_0)^2+(\alpha_2+\alpha_1)f)\}$, where $\exp\{(k_2-k_1)(f-f_0)+c_1+c_2\}$ represents the $(k_2-k_1)(f-f_0)+c_1+c_2$ power of $e$;

and $\exp\{i*((\beta_2-\beta_1)(f-f_0)^2+(\alpha_2+\alpha_1)f)\}$ represents the $i*((\beta_2-\beta_1)(f-f_0)^2+(\alpha_2+\alpha_1)f)$ power of $e$.

If lengths of the first cable section and the second cable section are close, the channel parameters ($k_1$, $c_1$, $\beta_1$, $\alpha_1$) of the first cable section are approximately the same as the channel parameters ($k_2$, $c_2$, $\beta_2$, $\alpha_2$) of the second cable section.

In this case, $S_3(f)=S^*(-f)\exp\{(k_2-k_1)(f-f_o)+c_1+c_2\} \cdot \exp\{*((\beta 2-\beta 1)(f-f_0)^2+(\alpha_2+\alpha_1)f)$. $(k_2-k_1)(f-f_0)$ is approaching zero, and $(\beta_2-\beta_1)(f-f_0)^2$ is also approaching zero. $S_3(f) \approx S^*(-f)\exp\{c_1+c_2\} \cdot \exp\{i*((\alpha_2+\alpha_1)f)\}$.

It can be learned that, $S_3(f)$ is irrelevant to k and β, k is related to the frequency selective fading, and β is related to the group delay dispersion. Therefore, $S_3(f)$ has a low correlation with the frequency selective fading and the group delay dispersion, and distortion of an electromagnetic wave signal caused by the frequency selective fading and the group delay dispersion in $S_3(f)$ is greatly reduced.

Further, it is assumed that amplitude-frequency curves of the first electromagnetic wave signal before and after the conjugate reversal of the spectrum occurs are axisymmetric with respect to a target straight line, and phase-frequency curves of the first electromagnetic wave signal before and after the conjugate reversal of the spectrum occurs are centrosymmetric with respect to a target point. In addition, the first electromagnetic wave signal obtained after such conjugate reversal of the spectrum occurs is referred to as a conjugate reversed signal. Then, it can be learned from the foregoing content that an amplitude-frequency curve of the conjugate reversed signal is axisymmetric to the amplitude-frequency curve of the first electromagnetic wave signal with respect to the target straight line, and a phase-frequency curve of the conjugate reversed signal is centrosymmetric to the phase-frequency curve of the first electromagnetic wave signal with respect to the target point. The target straight line is perpendicular to the horizontal coordinate axis of the coordinate system in which the amplitude-frequency curve is located, and the frequency corresponding to the intersection point with the horizontal coordinate axis is the center frequency of the first electromagnetic wave signal. The target point is the point corresponding to the center frequency on the horizontal coordinate axis of the coordinate system in which the phase-frequency curve is located.

The second electromagnetic wave signal finally obtained by the target third node may be the same as or different from the conjugate reversed signal. This is not limited in this embodiment of this disclosure. When the second electromagnetic wave signal finally obtained by the target third node is different from the conjugate reversed signal, the second electromagnetic wave signal and the conjugate reversed signal are different in at least one type of information of the center frequency, the amplitude-frequency curve, and the phase-frequency curve.

When the second electromagnetic wave signal finally obtained by the target third node may be different from the conjugate reversed signal, the second electromagnetic wave signal and the conjugate reversed signal may meet at least one of the following conditions:

Condition 1.1: In the amplitude-frequency curve of the conjugate reversed signal, a sum of first amplitudes and a sum of second amplitudes have a target magnitude relationship; and in an amplitude-frequency curve of the second electromagnetic wave signal, a sum of third amplitudes and a sum of fourth amplitudes also have the target magnitude relationship.

The first amplitude is an amplitude corresponding to a first frequency, the second amplitude is an amplitude corresponding to a second frequency, the first frequency is less than a center frequency of the conjugate reversed signal, and the second frequency is greater than the center frequency of the conjugate reversed signal. The third amplitude is an amplitude corresponding to a third frequency, the fourth amplitude is an amplitude corresponding to a fourth frequency, the third frequency is less than a center frequency of the second electromagnetic wave signal, and the fourth frequency is greater than the center frequency of the second electromagnetic wave signal.

Condition 1.2: A fluctuation rate of a phase corresponding to any frequency in an additional phase-frequency curve is less than 40% (or 20%, 30%, or the like). The fluctuation rate is a ratio of a fluctuation phase to a phase corresponding to any frequency, and the fluctuation phase is a phase corresponding to the any frequency in a normalized additional phase-frequency curve.

The additional phase-frequency curve is a curve obtained by subtracting a reference phase-frequency curve from a phase-frequency curve of the second electromagnetic wave signal. A center frequency of the reference phase-frequency curve is the same as the center frequency of the second electromagnetic wave signal. When the center frequency of the conjugate reversed signal is the same as the center frequency of the second electromagnetic wave signal, the reference phase-frequency curve is the phase-frequency curve of the conjugate reversed signal. When the center frequency of the conjugate reversed signal is different from the center frequency of the second electromagnetic wave signal, the reference phase-frequency curve is a phase-frequency curve obtained after the phase-frequency curve of the conjugate reversed signal shifts along the horizontal coordinate axis of the phase-frequency curve.

Figure 18:
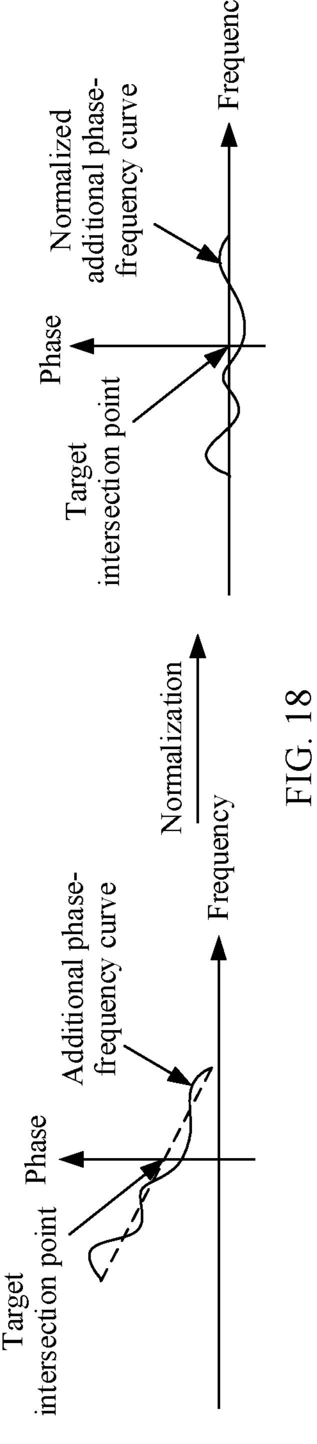
FIG. 18 is a schematic diagram of normalization of an additional phase-frequency curve according to an embodiment of this disclosure.

The fluctuation rate is the ratio of the fluctuation phase to the phase corresponding to the any frequency, and the fluctuation phase is the phase corresponding to the any frequency in the normalized additional phase-frequency curve. Refer to FIG. 18. It should be noted that the normalization is used for rotating and shifting the additional phase-frequency curve, so that both two endpoints and a target intersection point of the additional phase-frequency curve are shifted to a horizontal coordinate axis of the additional phase-frequency curve, and the target intersection point corresponds to the center frequency of the first electromagnetic wave signal. The target intersection point is an intersection point between a connection line of the two endpoints and a reference straight line (not shown in FIG. 18), the reference straight line is perpendicular to the horizontal coordinate axis, and a frequency corresponding to an intersection point with the horizontal coordinate axis is the center frequency of the first electromagnetic wave signal.

When the second electromagnetic wave signal and the conjugate reversed signal meet the condition 1.1, a difference between the amplitude-frequency curve of the second electromagnetic wave signal and the amplitude-frequency curve of the conjugate reversed signal is small. When the second electromagnetic wave signal and the conjugate reversed signal meet the condition 1.2, a difference between the phase-frequency curve of the second electromagnetic wave signal and the phase-frequency curve of the conjugate reversed signal is small. In this case, a difference between the second electromagnetic wave signal and the conjugate reversed signal is small, so that the distortion of the electromagnetic wave signal received by the second adjacent node relative to the electromagnetic wave signal sent by the first adjacent node can also be reduced.

It can be learned from the foregoing content that the second electromagnetic wave signal may be the same as or different from the conjugate reversed signal. When the second electromagnetic wave signal is different from the conjugate reversed signal, the difference may be caused by a factor of a component in the target third node. Alternatively, when the second electromagnetic wave signal is different from the conjugate reversed signal, the difference may be caused by other processing (for example, referred to as auxiliary processing) that is different from the foregoing processing used to cause the conjugate reversal of the spectrum of the electromagnetic wave signal. Alternatively, when the second electromagnetic wave signal is different from the conjugate reversed signal, the difference may be caused by the factor of the component in the target third node and the other processing included in the target processing. The auxiliary processing is processing related to the foregoing different.

For example, the factor of the component in the target third node may be a factor, for example, an unstable frequency of a local oscillator circuit, limited bandwidth of the component, limited in-band flatness, and a nonlinear group delay. Under impact of the factor of the component in the target third node, although the target third node performs the processing used to cause the conjugate reversal of the spectrum of the electromagnetic wave signal on the first electromagnetic wave signal, it is difficult for the obtained electromagnetic wave signal to be completely the same as the conjugate reversed signal. Generally, at least one of the following changes 1 to 3 additionally occurs on a spectrum of the signal obtained after the conjugate reversal.

Figure 19:
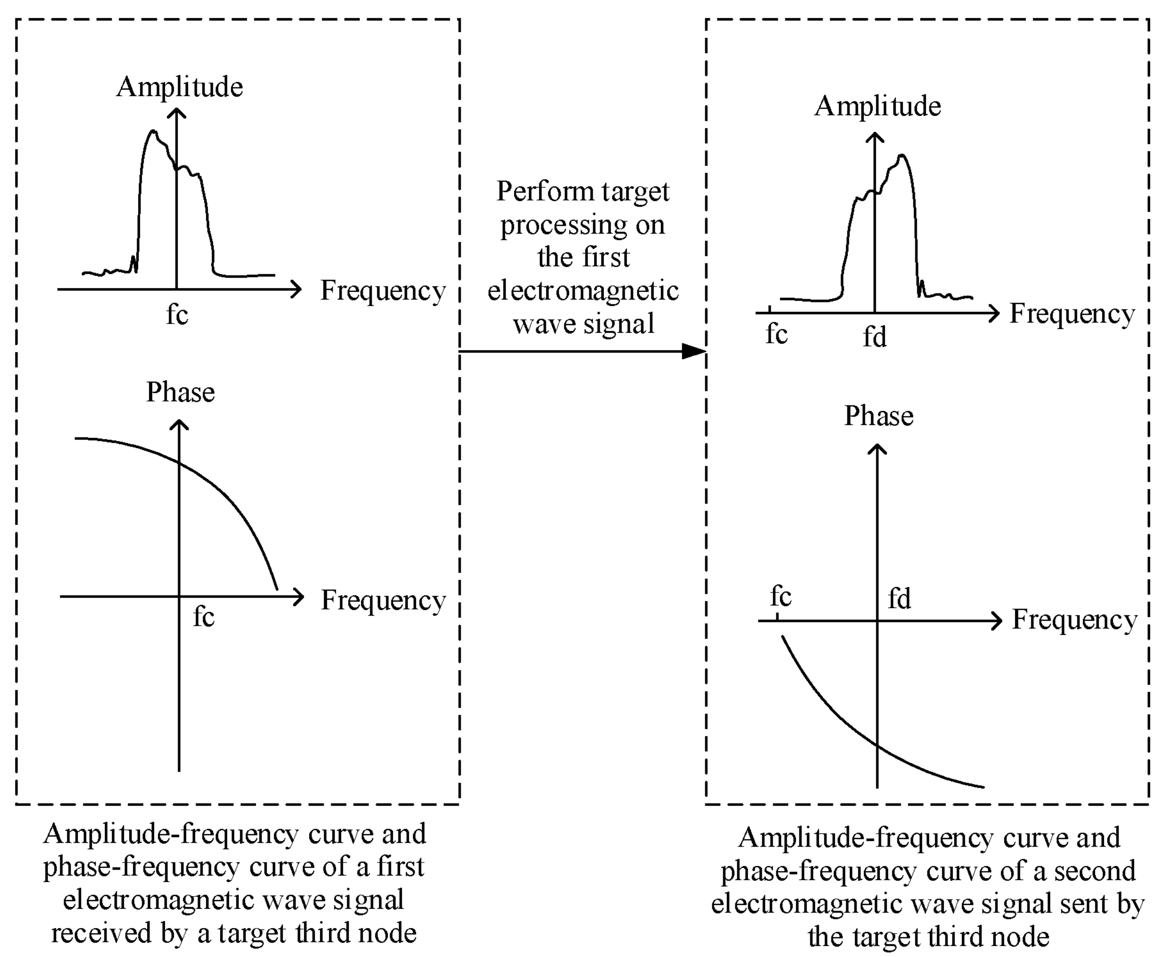
FIG. 19 is a schematic diagram of changes of another amplitude-frequency curve and another phase-frequency curve according to an embodiment of this disclosure.

Change 1: Because objectively uncontrollable frequency jitter usually exists in a component that is in the target third node and that is configured to perform the processing used to cause the conjugate reversal of the spectrum of the electromagnetic wave signal, a center frequency of the first electromagnetic wave signal obtained after the conjugate reversal of the spectrum occurs may be different from the center frequency of the first electromagnetic wave signal. For example, as shown in FIG. 19, the center frequency of the first electromagnetic wave signal obtained after the conjugate reversal of the spectrum occurs is fd, where fd is not equal to the center frequency fc of the first electromagnetic wave signal.

Change 2: Because an amplitude-frequency response of a component that is in the target third node and that is configured to perform the processing used to cause the conjugate reversal of the spectrum of the electromagnetic wave signal changes an amplitude-frequency curve of the signal, an amplitude-frequency curve of the first electromagnetic wave signal obtained after the conjugate reversal of the spectrum occurs may be different from an amplitude-frequency curve of the conjugate reversed signal.

Figure 20:
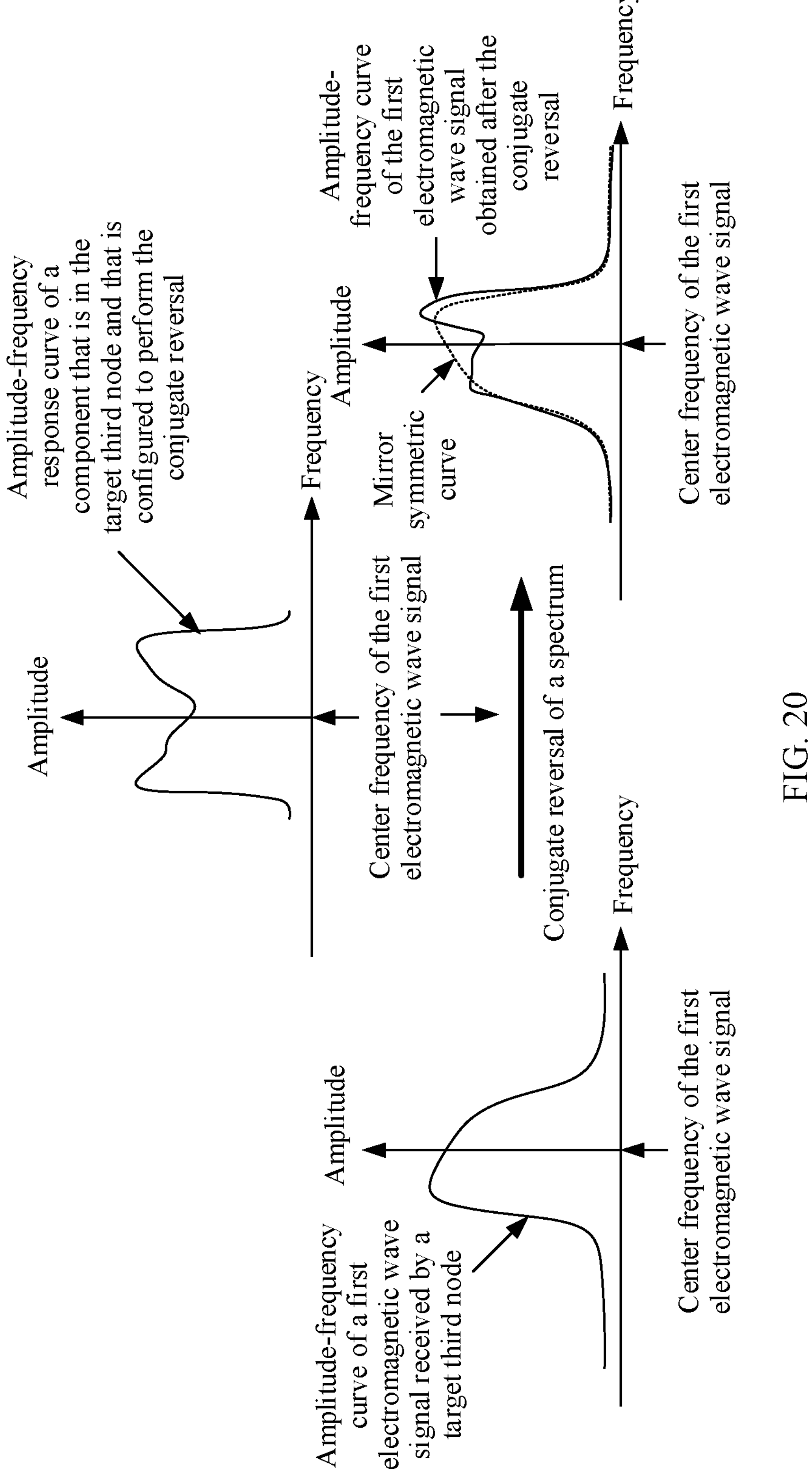
FIG. 20 is a schematic diagram of a change of another amplitude-frequency curve according to an embodiment of this disclosure.

For example, as shown in FIG. 20, the amplitude-frequency curve of the first electromagnetic wave signal obtained after the conjugate reversal of the spectrum occurs is obtained by further superimposing an amplitude-frequency response curve of the component that is in the target third node and that is configured to perform the processing used to cause the conjugate reversal of the spectrum of the electromagnetic wave signal on a mirror symmetric curve (the amplitude-frequency curve of the conjugate reversed signal) of the amplitude-frequency curve of the input first electromagnetic wave signal.

For another example, if the amplitude-frequency curve of the first electromagnetic wave signal is shown in FIG. 13, both an amplitude of a signal A and an amplitude of a signal B in the amplitude-frequency curve of the first electromagnetic wave signal obtained after the conjugate reversal of the spectrum occurs change. For example, the amplitude of the signal A in the amplitude-frequency curve of the first electromagnetic wave signal obtained after the conjugate reversal of the spectrum occurs is different from the amplitude of the signal A in the amplitude-frequency curve of the second electromagnetic wave signal in FIG. 13. The amplitude of the signal B in the amplitude-frequency curve of the first electromagnetic wave signal obtained after the conjugate reversal of the spectrum occurs is different from the amplitude of the signal B in the amplitude-frequency curve of the second electromagnetic wave signal in FIG. 13.

Change 3: Because a phase-frequency response of a component in the target third node changes a phase-frequency curve of the signal, a phase-frequency curve of the first electromagnetic wave signal obtained after the conjugate reversal of the spectrum occurs may be different from a phase-frequency curve of the conjugate reversed signal. The phase-frequency curve of the first electromagnetic wave signal obtained after the conjugate reversal of the spectrum occurs is obtained by further superimposing a phase-frequency response of the component that is in the target third node and that is configured to perform the processing used to cause the conjugate reversal of the spectrum of the electromagnetic wave signal.

Figure 21:
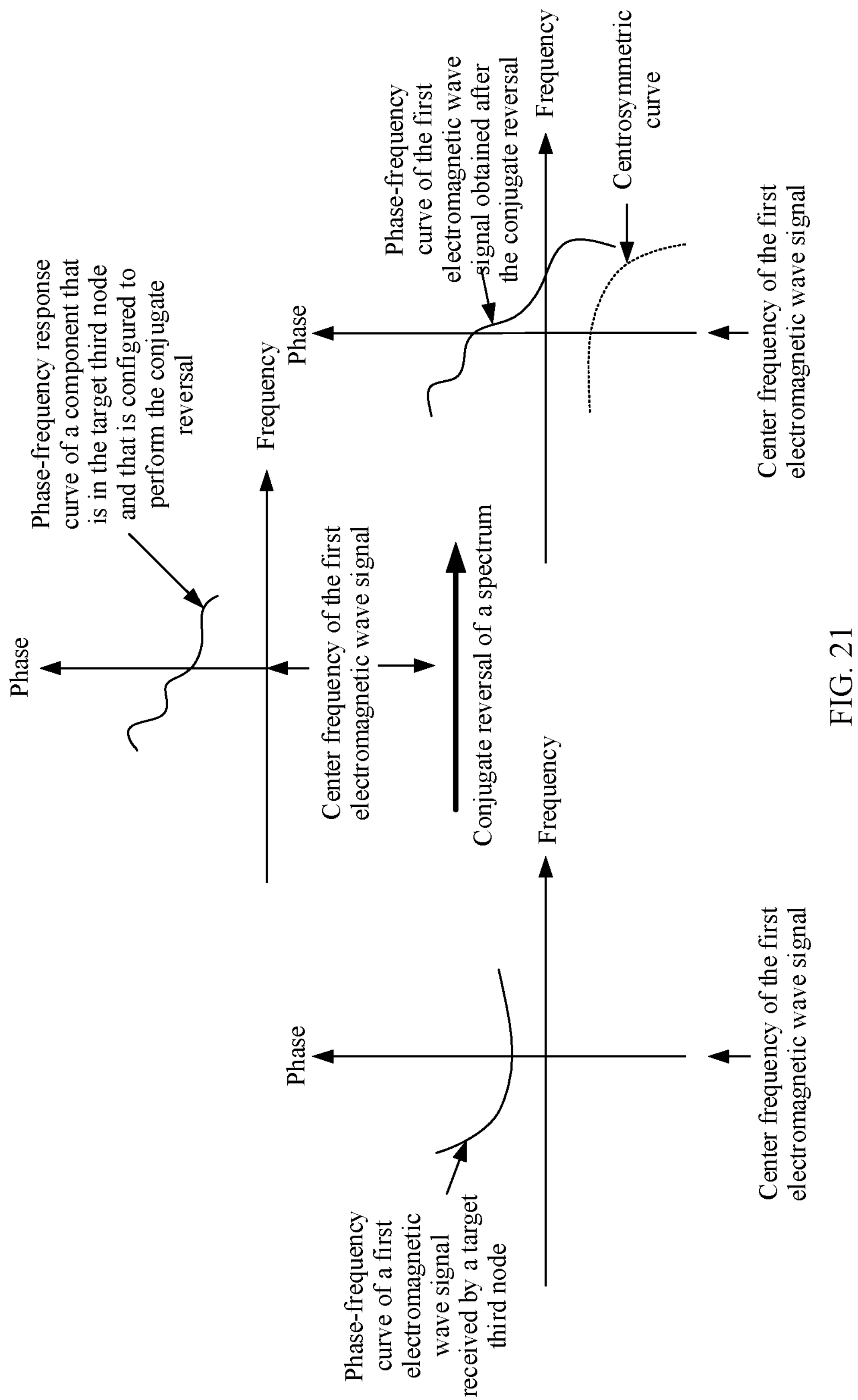
FIG. 21 is a schematic diagram of a change of another phase-frequency curve according to an embodiment of this disclosure.

For example, as shown in FIG. 21, the phase-frequency curve of the first electromagnetic wave signal obtained after the conjugate reversal of the spectrum occurs is obtained by further superimposing a phase-frequency response curve of the component that is in the target third node and that is configured to perform the processing used to cause the conjugate reversal of the spectrum of the electromagnetic wave signal on a centrosymmetric curve (the phase-frequency curve of the conjugate reversed signal) of the phase-frequency curve of the input first electromagnetic wave signal.

For another example, when the phase-frequency curve of the first electromagnetic wave signal is shown in FIG. 14, a sum of a phase of a signal A in the phase-frequency curve of the first electromagnetic wave signal obtained after the conjugate reversal of the spectrum occurs and an original phase of the signal A in the first electromagnetic wave signal is not zero, and a sum of a phase of a signal B in the phase-frequency curve of the first electromagnetic wave signal obtained after the conjugate reversal of the spectrum occurs and an original phase of the signal B in the first electromagnetic wave signal is not zero.

Further, when the second electromagnetic wave signal is the same as the conjugate reversed signal, it is equivalent to that the second electromagnetic wave signal can be obtained after conjugate reversal in an ideal case occurs on the spectrum of the first electromagnetic wave signal. When the second electromagnetic wave signal is different from the conjugate reversed signal, it is equivalent to that the second electromagnetic wave signal can be obtained after conjugate reversal in a non-ideal case occurs on the spectrum of the first electromagnetic wave signal.

On the basis of the conjugate reversal in the ideal case, the conjugate reversal in the non-ideal case may meet at least one of the following conditions 2.1 to 2.4.

Condition 2.1: The amplitude-frequency curves of the electromagnetic wave signal before and after the conjugate reversal of the spectrum in the non-ideal case occurs are not axisymmetric with respect to the target straight line, but are approximately symmetric with respect to the target straight line.

Condition 2.2: The phase-frequency curves of the electromagnetic wave signal before and after the conjugate reversal of the spectrum in the non-ideal case occurs are not centrosymmetric with respect to the target point, but are approximately centrosymmetric with respect to the target point.

Condition 2.3: The frequency corresponding to the intersection point of the target straight line with the horizontal coordinate axis is not the center frequency of the electromagnetic wave signal, but a frequency that deviates from the center frequency.

Condition 2.4: The target point is not the point corresponding to the center frequency of the electromagnetic wave signal on the horizontal coordinate axis of the coordinate system in which the phase-frequency curve is located, but a point corresponding to a frequency that deviates from the center frequency on the horizontal coordinate axis of the coordinate system in which the phase-frequency curve is located.

For example, when the conjugate reversal in the non-ideal case meets the foregoing conditions 2.1 to 2.4, the amplitude-frequency curves of the electromagnetic wave signal before and after the conjugate reversal of the spectrum in the non-ideal case occurs are approximately symmetric with respect to the target straight line, and the phase-frequency curves of the electromagnetic wave signal before and after the conjugate reversal of the spectrum in the non-ideal case occurs are approximately centrosymmetric with respect to the target point. The target straight line is perpendicular to the horizontal coordinate axis of the coordinate system in which the amplitude-frequency curve is located, and the frequency corresponding to the intersection point with the horizontal coordinate axis deviates from the center frequency of the electromagnetic wave signal. The target point is the point corresponding to the frequency that deviates from the center frequency on the horizontal coordinate axis of the coordinate system in which the phase-frequency curve is located.

Figure 22:
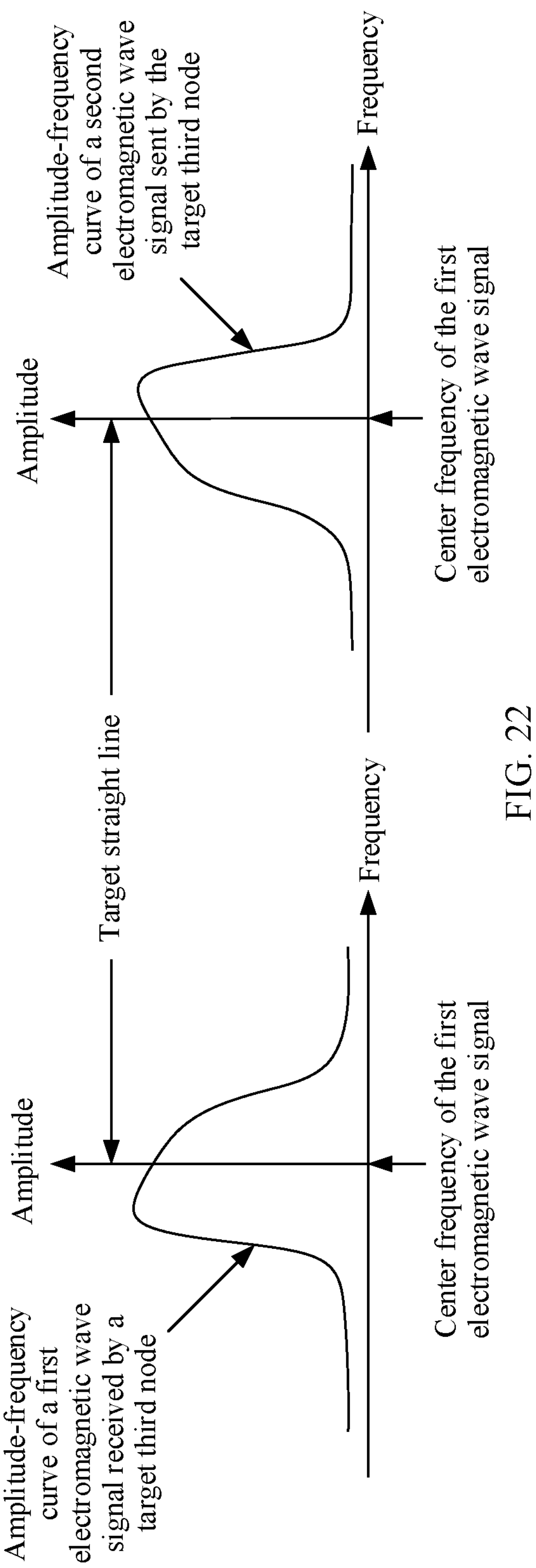
FIG. 22 is a schematic diagram of a change of another amplitude-frequency curve according to an embodiment of this disclosure.
Figure 23:
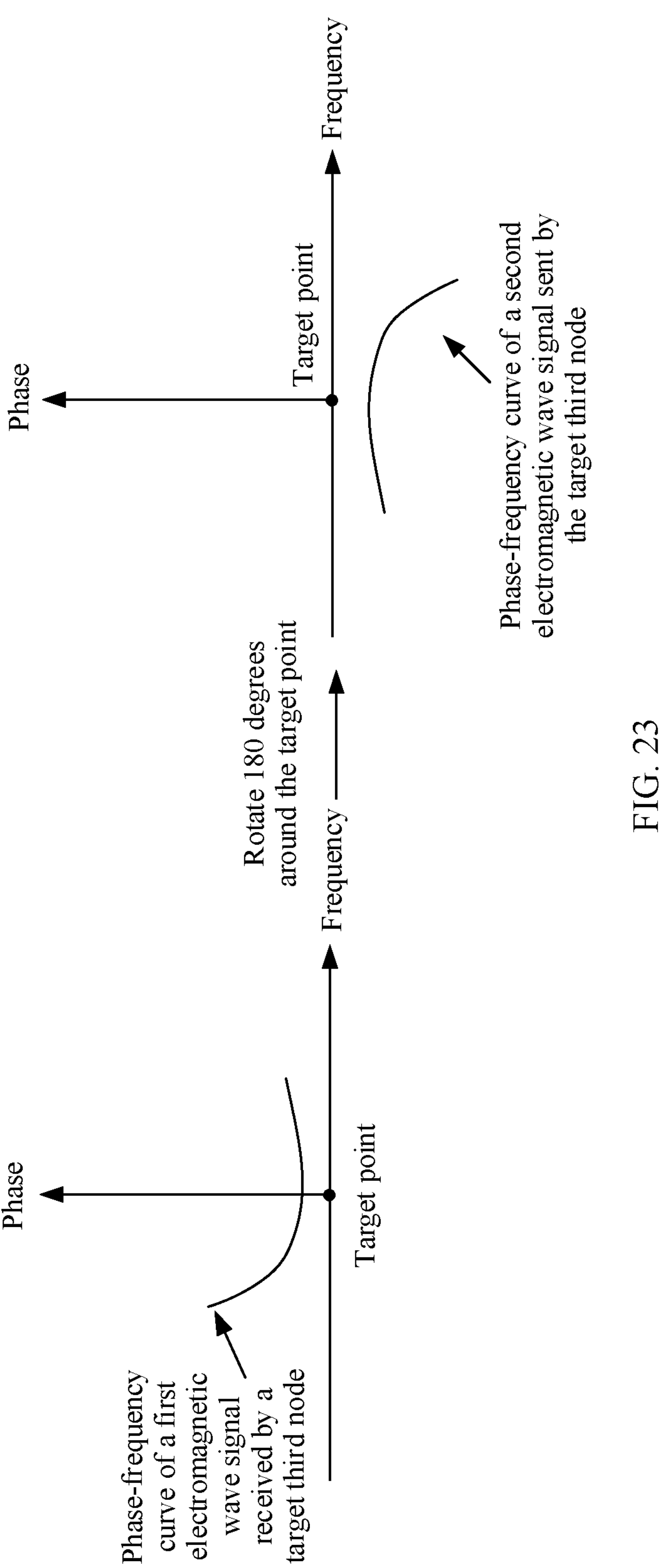
FIG. 23 is a schematic diagram of a change of another phase-frequency curve according to an embodiment of this disclosure.
Figure 24:
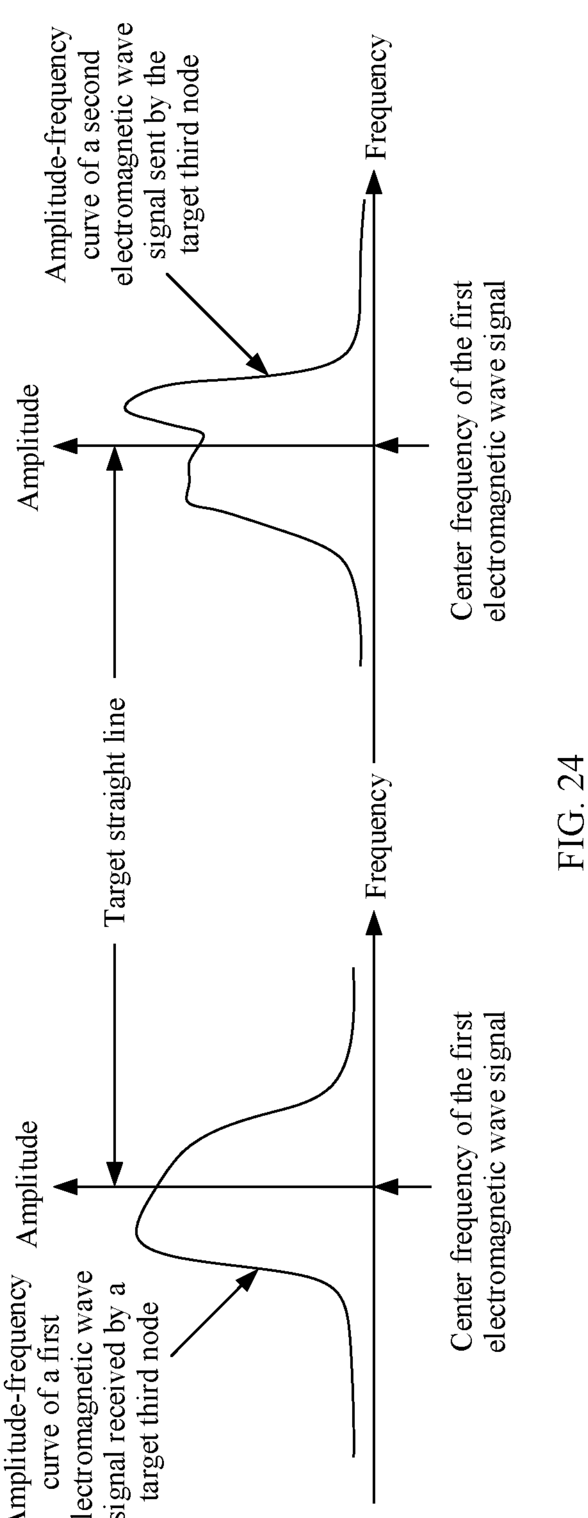
FIG. 24 is a schematic diagram of a change of another amplitude-frequency curve according to an embodiment of this disclosure.
Figure 25:
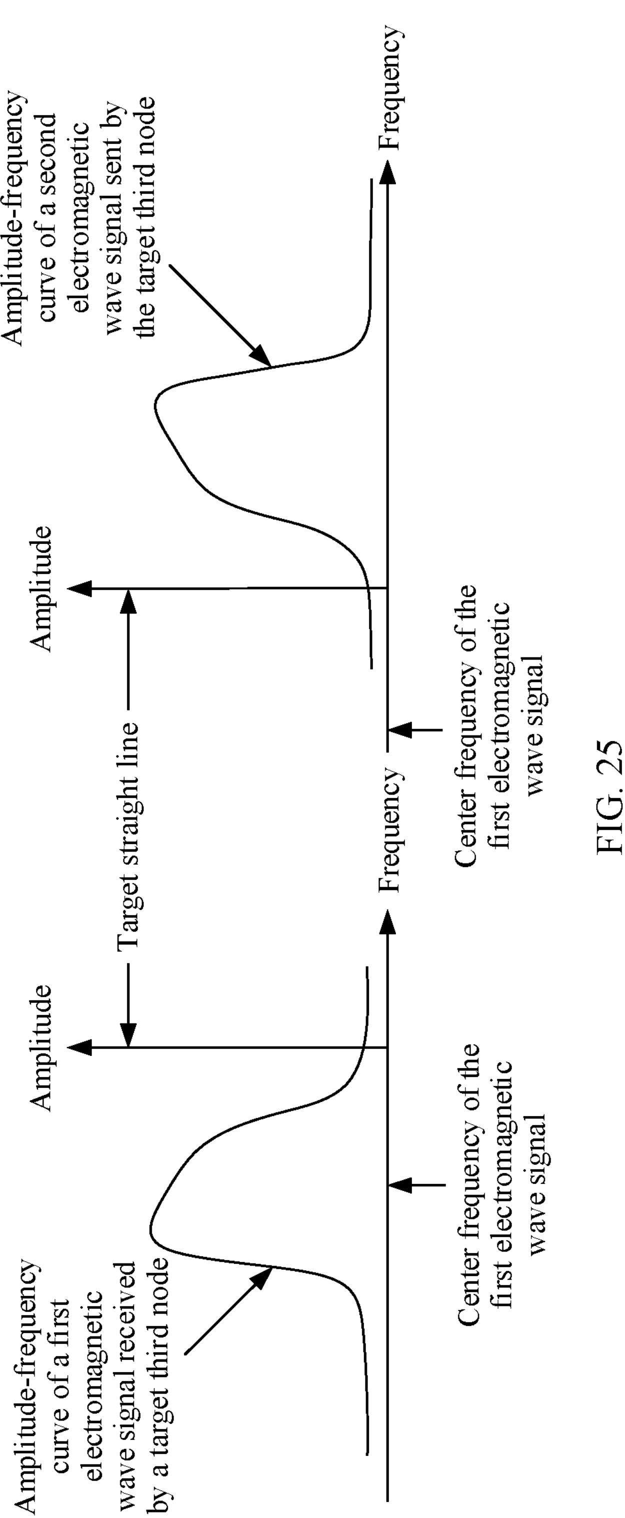
FIG. 25 is a schematic diagram of a change of another amplitude-frequency curve according to an embodiment of this disclosure.
Figure 26:
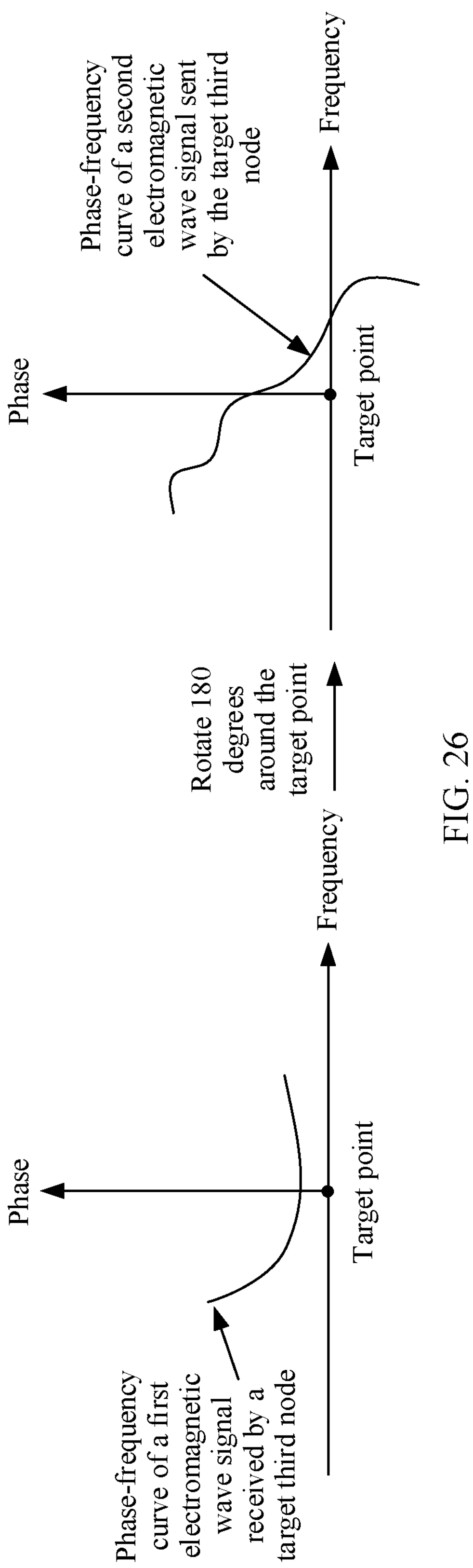
FIG. 26 is a schematic diagram of a change of another phase-frequency curve according to an embodiment of this disclosure.
Figure 27:
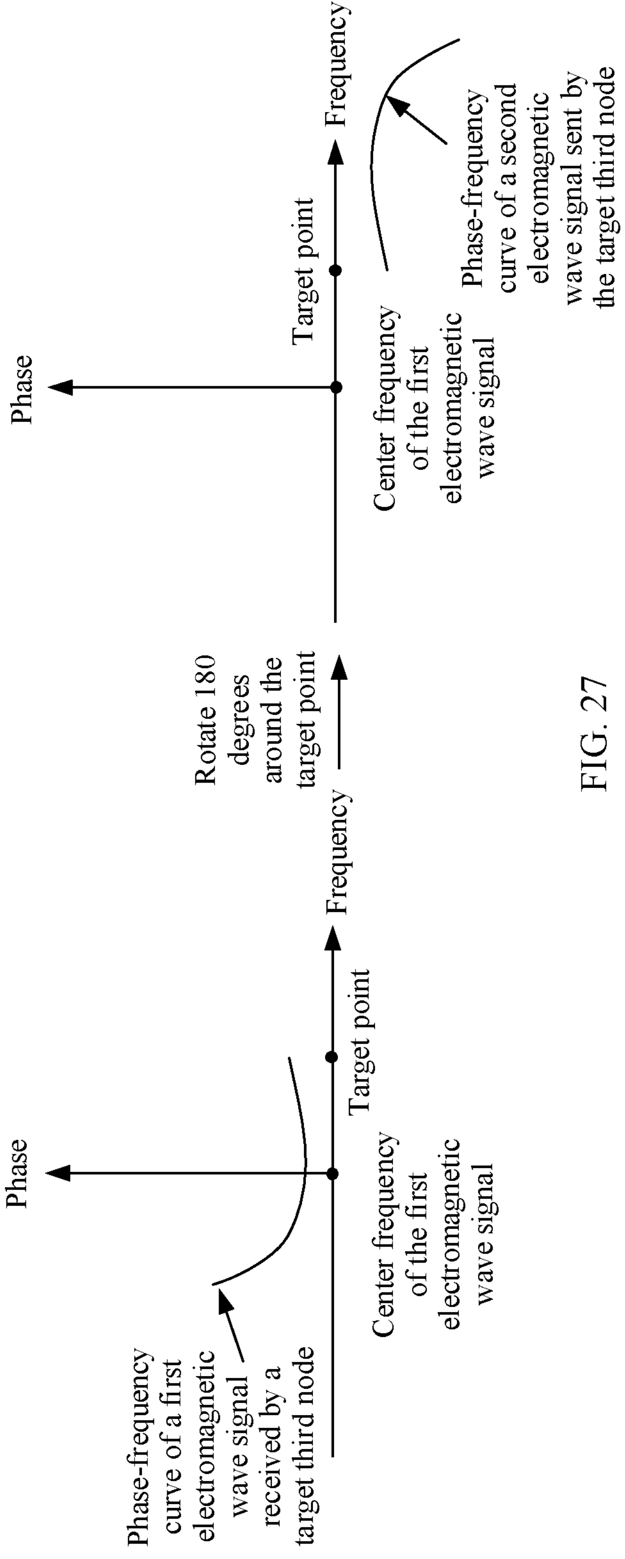
FIG. 27 is a schematic diagram of a change of another phase-frequency curve according to an embodiment of this disclosure.

For example, it is assumed that after the conjugate reversal in the ideal case occurs on the first electromagnetic wave signal, the obtained amplitude-frequency curve of the second electromagnetic wave signal may be shown in FIG. 22, and the phase-frequency curve of the second electromagnetic wave signal may be shown in FIG. 23. After the conjugate reversal in the non-ideal case occurs on the first electromagnetic wave signal, the obtained amplitude-frequency curve of the second electromagnetic wave signal may be shown in FIG. 24 or FIG. 25, and the phase-frequency curve of the second electromagnetic wave signal may be shown in FIG. 26 or FIG. 27. FIG. 24 meets the condition 2.1, FIG. 25 meets the condition 2.3, FIG. 26 meets the condition 2.2, and FIG. 27 meets the condition 2.4.

Further, the foregoing conjugate reversal in the non-ideal case has a specific relationship with the conjugate reversal in the ideal case. The following describes the relationship.

For example, for a same electromagnetic wave signal, it is assumed that after conjugate reversal in an ideal case occurs on a spectrum of the electromagnetic wave signal, an amplitude-frequency curve of the electromagnetic wave signal is referred to as a first amplitude-frequency curve, and a phase-frequency curve of the electromagnetic wave signal is referred to as a first phase-frequency curve. After conjugate reversal in a non-ideal case occurs on a spectrum of the electromagnetic wave signal, the electromagnetic wave signal corresponds to a second amplitude-frequency curve and a second phase-frequency curve.

It should be noted that, it is assumed that after the conjugate reversal in the non-ideal case occurs on the spectrum of the electromagnetic wave signal, an amplitude-frequency curve of the electromagnetic wave signal is a target amplitude-frequency curve, and a phase-frequency curve of the electromagnetic wave signal is a target phase-frequency curve. If a center frequency of the electromagnetic wave signal does not change after the conjugate reversal of the spectrum in the non-ideal case occurs, the second amplitude-frequency curve is the target amplitude-frequency curve, and the second phase-frequency curve is the target phase-frequency curve. If the center frequency of the electromagnetic wave signal changes after the conjugate reversal of the spectrum in the non-ideal case occurs, the second amplitude-frequency curve is a curve obtained after the target amplitude-frequency curve shifts along a horizontal coordinate axis at which the target amplitude-frequency curve is located, and the second phase-frequency curve is a curve obtained after the target phase-frequency curve shifts along a horizontal coordinate axis at which the target phase-frequency curve is located. In addition, a center frequency of the second amplitude-frequency curve is the same as a center frequency of the second phase-frequency curve, and these center frequencies are center frequencies of the electromagnetic wave signal before the conjugate reversal of the spectrum in the non-ideal case occurs.

It is assumed that the first amplitude-frequency curve is represented as $y=f_1(x)$, and the second amplitude-frequency curve is represented as $y=f_2(x)$, where x represents a frequency, and y represents an amplitude. In this case, the first amplitude-frequency curve and the second amplitude-frequency curve satisfy formula (1): $\Sigma_x|f_{2n}(x)-f_1(x)|^2<\Sigma_x|f_1(x)|^2$, and a value range of x is within a bandwidth range of the electromagnetic wave signal, where $$f_{2n}(x) = f_2(x)\times\left(\sqrt[2]{\left(\Sigma_x|f_1(x)|^2\right)/\left(\Sigma_x|f_2(x)|^2\right)}\right).$$

$y=f_{2n}(x)$ represents a normalized second amplitude-frequency curve obtained by normalizing energy of the second amplitude-frequency curve to energy of the first amplitude-frequency curve.

The conjugate reversal in the non-ideal case is related to the conjugate reversal in the ideal case and a non-ideal factor. In the formula (1), $\Sigma_x|f_{2n}(x)-f_1(x)|^2$ represents a value of impact of the non-ideal factor on an amplitude of the second amplitude-frequency curve, and $\Sigma_x|f_1(x)|^2$ represents a value of impact of the conjugate reversal in the ideal case on the amplitude of the second amplitude-frequency curve. Because $\Sigma_x|f_{2n}(x)-f_1(x)|^2<E_x|f_1(x)|^2$, the value of impact of the non-ideal factor on the amplitude of the second amplitude-frequency curve does not exceed the value of impact of the conjugate reversal in the ideal case on the amplitude of the second amplitude-frequency curve, and the conjugate reversal in the non-ideal case can also have effect of the conjugate reversal in the ideal case. Therefore, the distortion of the electromagnetic wave signal received by the second adjacent node relative to the electromagnetic wave signal sent by the first adjacent node can also be reduced.

It is assumed that the first phase-frequency curve is represented as $y=f_3(x)$, and the second phase-frequency curve is represented as $y=f_4(x)$, where x represents a frequency, and y represents a phase. In this case, the first phase-frequency curve and the second phase-frequency curve satisfy formula (2): $\Sigma_x|f_{dn}(x)|<E_x|f_3(x)|$, where $$f_{dn}(x) = f_d(x) - (x_U - x)\times\frac{f_d(x_D)-f_d(x_U)}{x_U - x_D} - f_d(x_U),$$

$y=f_{dn}(x)$ represents a normalized error curve, the error curve is $y=f_d(x)=f_4(x)-f_3(x)$, and $x_U$ and $x_D$ represent frequencies corresponding to two endpoints of the error curve, and both phases corresponding to the two endpoints in the normalized error curve change to 0.

The conjugate reversal in the non-ideal case is related to the conjugate reversal in the ideal case and a non-ideal factor. In the formula (2), $\Sigma_x|f_{dn}(x)|$ represents a value of impact of the non-ideal factor on a phase of the second phase-frequency curve, and $\Sigma_x|f_3(x)|$ represents a value of impact of the conjugate reversal in the ideal case on the phase of the second phase-frequency curve. Because $\Sigma_x|f_{dn}(x)|<\Sigma_x|f_3(x)|$, the value of impact of the non-ideal factor on the phase of the second phase-frequency curve does not exceed the value of impact of the conjugate reversal in the ideal case on the phase of the second phase-frequency curve, and the conjugate reversal in the non-ideal case can also have effect of the conjugate reversal in the ideal case. Therefore, the distortion of the electromagnetic wave signal received by the second adjacent node relative to the electromagnetic wave signal sent by the first adjacent node can also be reduced.

It should be noted that the phase-frequency curve of the electromagnetic wave signal (for example, the first electromagnetic wave signal and the second electromagnetic wave signal) may be the same as or different from a phase-frequency curve that is of the electromagnetic wave signal and that is collected by a device (for example, an oscilloscope).

For example, the electromagnetic wave signal is a complex number signal, and a phase of the complex number signal may be any one of $\beta+2*N*\pi$ ($\beta$ represents a phase between $-\pi$ and $\pi$ in phases of the complex number signal, $\pi$ represents a ratio of a circumference-diameter ratio constant of a circle, and Nis an integer). Therefore, when the device is used to measure the phase-frequency curve of the electromagnetic wave signal, a value of a phase in the phase-frequency curve is usually limited to an interval of $[-\pi, \pi]$. In this case, the phase-frequency curve of the electromagnetic wave signal is different from the phase-frequency curve collected by the device.

Figure 28:
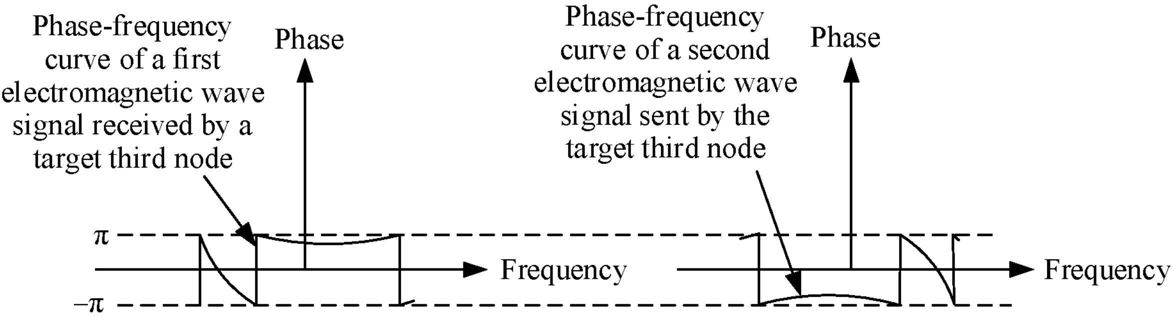
FIG. 28 is a schematic diagram of folding a phase-frequency curve according to an embodiment of this disclosure.

For example, it is assumed that phase-frequency curves of the first electromagnetic wave signal and the second electromagnetic wave signal are shown in FIG. 23. Phase-frequency curves that are of the first electromagnetic wave signal and the second electromagnetic wave signal and that are collected by the device change to curves shown in FIG. 28. It can be learned that these phase-frequency curves are wrapped (wrap) into the phase interval of $[-\pi, \pi]$. In this case, if a phase value point corresponding to the center frequency in the phase-frequency curve that is of the electromagnetic wave signal and that is collected in the oscilloscope is used as a reference point, and the phase-frequency curve is unwrapped (unwrap), a phase-frequency curve of the electromagnetic wave signal shown in FIG. 23 may be obtained.

It should be noted that at least one third node may be disposed on a cable between the first node and the second node. When a plurality of third nodes are disposed on the cable, each third node may be a target third node. Details are not described herein in this embodiment of this disclosure.

Further, in this embodiment of this disclosure, the target third node may perform the target processing on the first electromagnetic wave signal in various manners. The following uses several manners as an example for description. It should be noted that in the following several manners, the conjugate reversal occurring on the first electromagnetic wave signal may be the conjugate reversal in the ideal case, or may be the conjugate reversal in the non-ideal case. In addition, when the conjugate reversal is the conjugate reversal in the non-ideal case, the second electromagnetic wave signal is different from the conjugate reversed signal due to the factor of the component in the target third node.

(1) Manner 1: When performing the target processing on the first electromagnetic wave signal, the target third node may first perform down-conversion on the first electromagnetic wave signal to obtain a first baseband signal; then obtain a second baseband signal based on the first baseband signal, where the second baseband signal is conjugate to the first baseband signal; and finally perform up-conversion on the second baseband signal to obtain the second electromagnetic wave signal.

It should be noted that it is assumed that the first electromagnetic wave signal is represented as $s_i(t)$, and t represents time. If a center frequency of the first electromagnetic wave signal is $f_0$, a spectrum of the first electromagnetic wave signal is represented as $B_i(f-f_0)$, where $B_i(f)$ represents a spectrum of a baseband signal (the first baseband signal) $b_i(t)$ of the first electromagnetic wave signal, and the spectrum uses a frequency 0 as a center frequency.

The second electromagnetic wave signal is represented as $s_o(t)$. Because the spectrum of the first electromagnetic wave signal is conjugately symmetric to a spectrum of the second electromagnetic wave signal, the spectrum of the second electromagnetic wave signal is $Bi^*(-f-f0)$, where * represents conjugate of a complex value. A baseband signal (the second baseband signal) of the second electromagnetic wave signal is represented as $b_o(t)$, and a spectrum of the second baseband signal is represented as $B_o(f)$. When the spectrum of the first electromagnetic wave signal is conjugately symmetric to the spectrum of the second electromagnetic wave signal, a spectrum of the baseband signal of the first electromagnetic wave signal is also conjugately symmetric to the spectrum of the baseband signal of the second electromagnetic wave signal. Therefore, the spectrum of the baseband signal $b_o(t)$ of the second electromagnetic wave signal is $B_o(f)=B_i^*(-f)$.

It can be learned from a property of the Fourier transform of a time domain signal that when $b_o(t)=b_i^*(t)$, $B_o(f)=B;^*(-f)$, the spectrum of the second electromagnetic wave signal is $B_i^*(-f-f_0)$. The baseband signal is the time domain signal. Therefore, the target third node may conjugate the baseband signal $b_o(t)$ (the first baseband signal) of the first electromagnetic wave signal to obtain the second baseband signal $b;^*(t)$, and then perform up-conversion on the second baseband signal to obtain the second electromagnetic wave signal $s_o(t)$. The spectrum $B_i^*(-f-f_0)$ of the second electromagnetic wave signal is conjugately symmetric to the spectrum $B_i(f-f_0)$ of the first electromagnetic wave signal.

Figure 29:
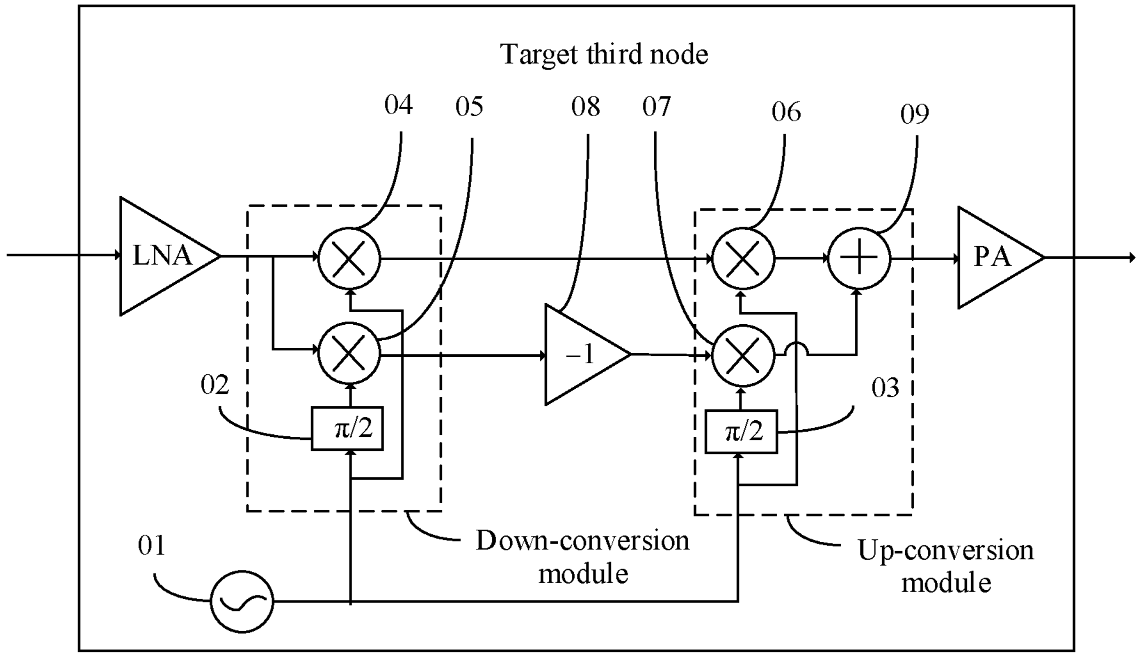
FIG. 29 is a schematic diagram of a structure of a target third node according to an embodiment of this disclosure.

When the target third node performs the target processing on the first electromagnetic wave signal in the manner 1, as shown in FIG. 29, the target third node may include a signal source unit 01, a first phase shift unit 02, a second phase shift unit 03, a first frequency mixing unit 04, a second frequency mixing unit 05, a third frequency mixing unit 06, a fourth frequency mixing unit 07, a reverse unit 08, and a combining unit 09. The signal source unit 01 is configured to provide a local-frequency electromagnetic wave signal, and a center frequency of the local-frequency electromagnetic wave signal is the same as the center frequency of the first electromagnetic wave signal. The first phase shift unit 02, the second phase shift unit 03, the first frequency mixing unit 04, and the third frequency mixing unit 06 are all connected to the signal source unit 01, the first phase shift unit 02 is further connected to the second frequency mixing unit 05, the second phase shift unit 03 is further connected to the fourth frequency mixing unit 07, the first frequency mixing unit 04 is connected to the third frequency mixing unit 06, the second frequency mixing unit 05 and the fourth frequency mixing unit 07 are connected via the reverse unit 08, and both the third frequency mixing unit 06 and the fourth frequency mixing unit 07 are connected to the combining unit 09. The first frequency mixing unit 04, the second frequency mixing unit 05, and the first phase shift unit 02 may form a down-conversion module, and the third frequency mixing unit 06, the fourth frequency mixing unit 07, the second phase shift unit 03, and the combining unit 09 form an up-conversion module.

It should be noted that, for units (such as the signal source unit 01, the first phase shift unit 02, the second phase shift unit 03, the first frequency mixing unit 04, the second frequency mixing unit 05, the third frequency mixing unit 06, the fourth frequency mixing unit 07, the reverse unit 08, and the combining unit 09) in embodiments provided in this disclosure, the units may be independent components, or may be a plurality of units integrated together, and each unit is one of the logical units. This is not limited in this disclosure.

When the target third node performs the down-conversion on the first electromagnetic wave signal, the first frequency mixing unit 04 mixes the first electromagnetic wave signal and the local-frequency electromagnetic wave signal provided by the signal source unit 01 to obtain a real part signal I of the first baseband signal. The first phase shift unit 02 shifts a phase of the local-frequency electromagnetic wave signal provided by the signal source unit 01 by $\pi/2$ to obtain a first phase-shift signal, where the first phase-shift signal is orthogonal to the local-frequency electromagnetic wave signal, and $\pi$ represents a ratio of a circumference-diameter ratio constant of a circle. The second frequency mixing unit 05 mixes the first electromagnetic wave signal and the first phase-shift signal obtained by the first phase shift unit 02, to obtain an imaginary part signal Q of the first baseband signal. In this way, the first baseband signal including the real part signal I and the imaginary part signal Q is obtained. The first baseband signal $b_i(t)=I+Q$.

Figure 30:
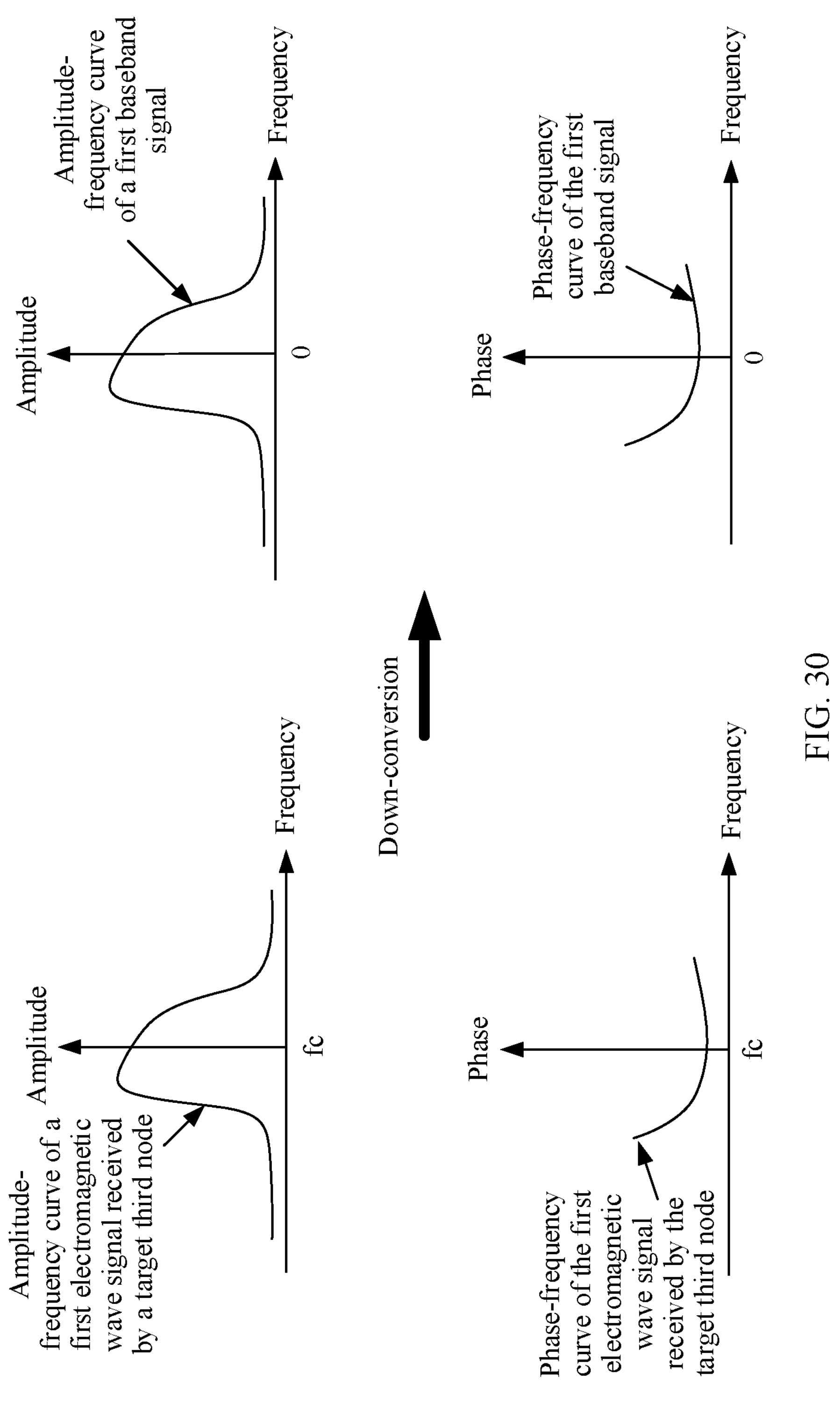
FIG. 30 is a schematic diagram of changes of another amplitude-frequency curve and another phase-frequency curve according to an embodiment of this disclosure.

The amplitude-frequency curve of the first electromagnetic wave signal shown in FIG. 22 and the phase-frequency curve of the first electromagnetic wave signal shown in FIG. 23 are used as an example. After the down-conversion is performed on the first electromagnetic wave signal, a signal spectrum (including an amplitude-frequency component and a phase-frequency component) of the first electromagnetic wave signal is entirely shifted from an original center frequency fc to a frequency 0. As shown in FIG. 30, both center frequencies of an amplitude-frequency curve and a phase-frequency curve of the down-conversed first electromagnetic wave signal (the first baseband signal) change from fc to 0.

When the target third node obtains the second baseband signal based on the first baseband signal, the reverse unit 08 performs negation on the imaginary part signal Q obtained by the second frequency mixing unit 05, to obtain a reverse signal –Q of the imaginary part signal Q. In this case, the second baseband signal includes the real part signal I of the first baseband signal and the reverse signal –Q of the imaginary part signal of the first baseband signal. The second baseband signal $b_o(t)=I-Q=(I+Q)^*=b_i^*(t)$. The amplitude-frequency curve and the phase-frequency curve of the first baseband signal shown in FIG. 30 are used as an example. Conjugate reversal occurs on the spectrum of the first baseband signal after passing through the reverse unit to obtain the second baseband signal, and a spectrum of the obtained second baseband signal is shown in FIG. 31.

When the target third node performs the up-conversion on the second baseband signal, the third frequency mixing unit 06 mixes the real part signal I obtained by the first frequency mixing unit 04 and the local-frequency electromagnetic wave signal provided by the signal source unit 01 to obtain a first frequency-mixed signal. The second phase shift unit 03 shifts the phase of the local-frequency electromagnetic wave signal provided by the signal source unit 01 by $\pi/2$ to obtain a first phase-shift signal. The fourth frequency mixing unit 07 mixes the reverse signal obtained by the reverse unit 08 and the first phase-shift signal obtained by the second phase shift unit 03, to obtain a second frequency-mixed signal. Finally, the combining unit 09 combines the first frequency-mixed signal obtained by the third frequency mixing unit 06 and the second frequency-mixed signal obtained by the fourth frequency mixing unit 07 to obtain the second electromagnetic wave signal.

Figure 31:
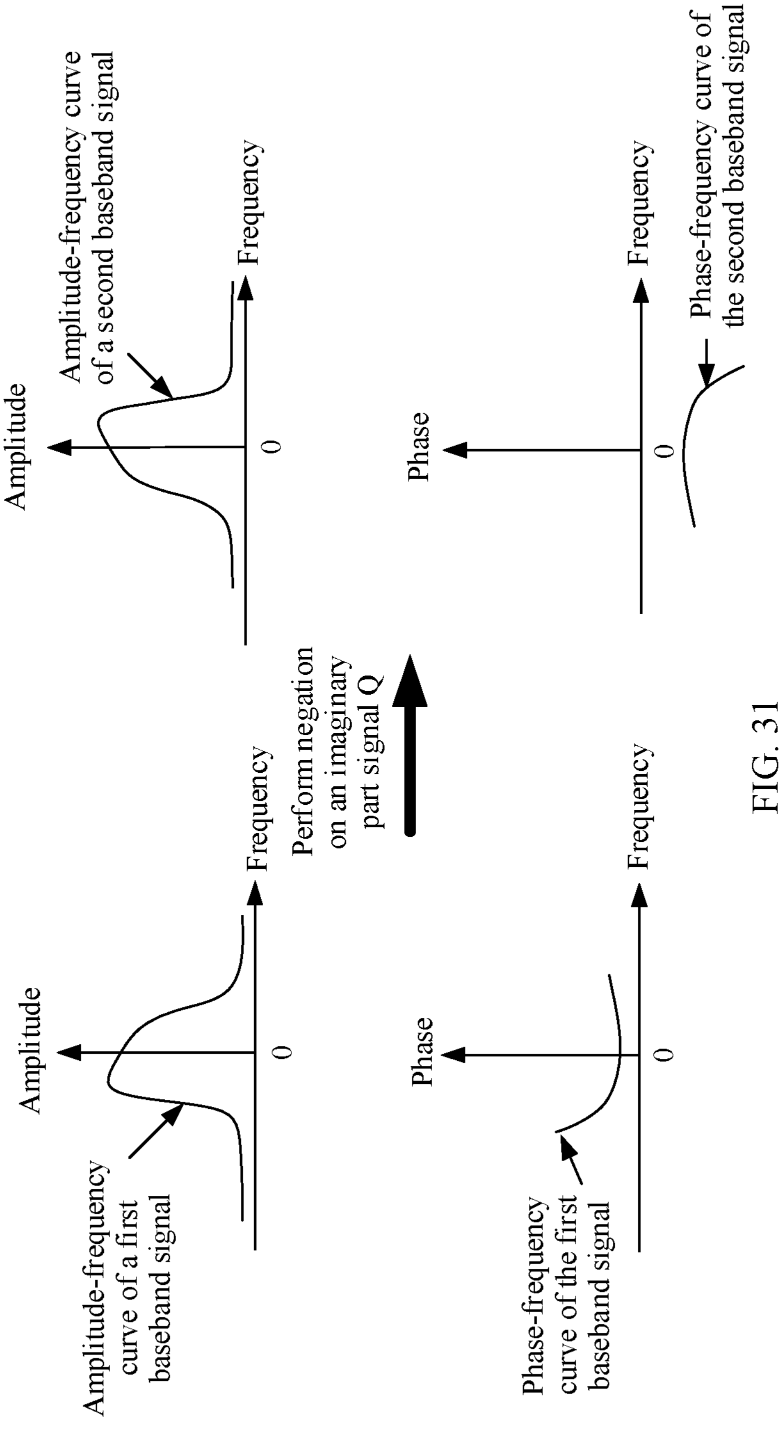
FIG. 31 is a schematic diagram of changes of another amplitude-frequency curve and another phase-frequency curve according to an embodiment of this disclosure.
Figure 32:
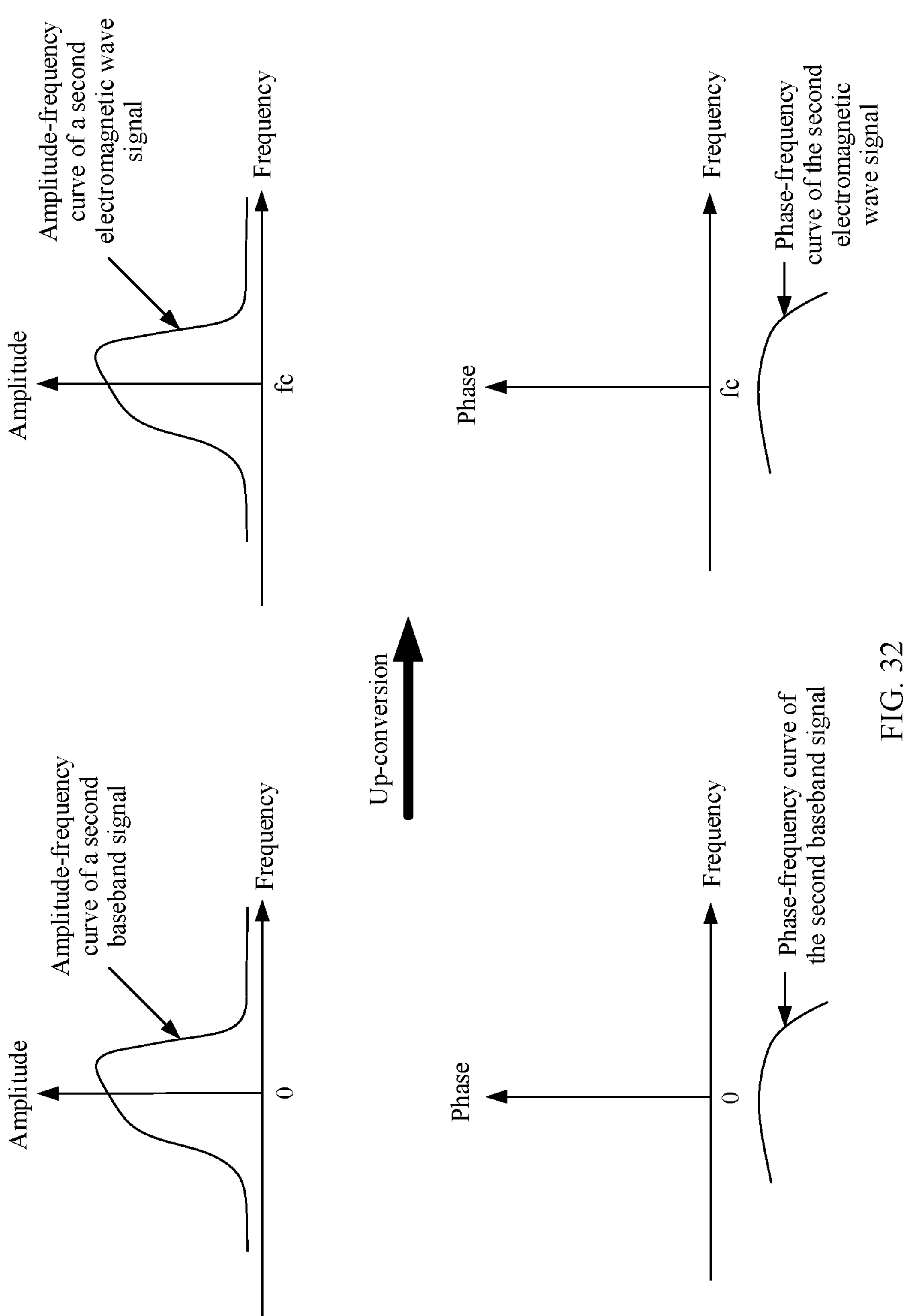
FIG. 32 is a schematic diagram of changes of another amplitude-frequency curve and another phase-frequency curve according to an embodiment of this disclosure.

The amplitude-frequency curve and the phase-frequency curve of the second baseband signal shown in FIG. 31 are used as an example. After the up-conversion is performed on the second baseband signal, a signal spectrum (including an amplitude-frequency component and a phase-frequency component) of the second baseband signal is entirely shifted from an original center frequency 0 to a frequency fc. As shown in FIG. 32, both center frequencies of an amplitude-frequency curve and a phase-frequency curve of the up-conversed second baseband signal (the second electromagnetic wave signal) are changed from 0 to fc.

It should be noted that, in FIG. 30, FIG. 31, and FIG. 32, an example in which the conjugate reversal in the ideal case occurs on the first electromagnetic wave signal is used. It may be understood that, in the manner 1, the conjugate reversal in the non-ideal case may also occur on the first electromagnetic wave signal due to the factor of the component in the target third node. This is not limited in this embodiment of this disclosure.

(2) Manner 2: When performing the target processing on the first electromagnetic wave signal, the target third node may first perform down-conversion on the first electromagnetic wave signal to obtain a first baseband signal; and then perform conjugate up-conversion on the first baseband signal to obtain the second electromagnetic wave signal.

It should be noted that when the target third node performs the target processing on the first electromagnetic wave signal in the manner 2, there are various processing manners of the target third node.

Figure 33:
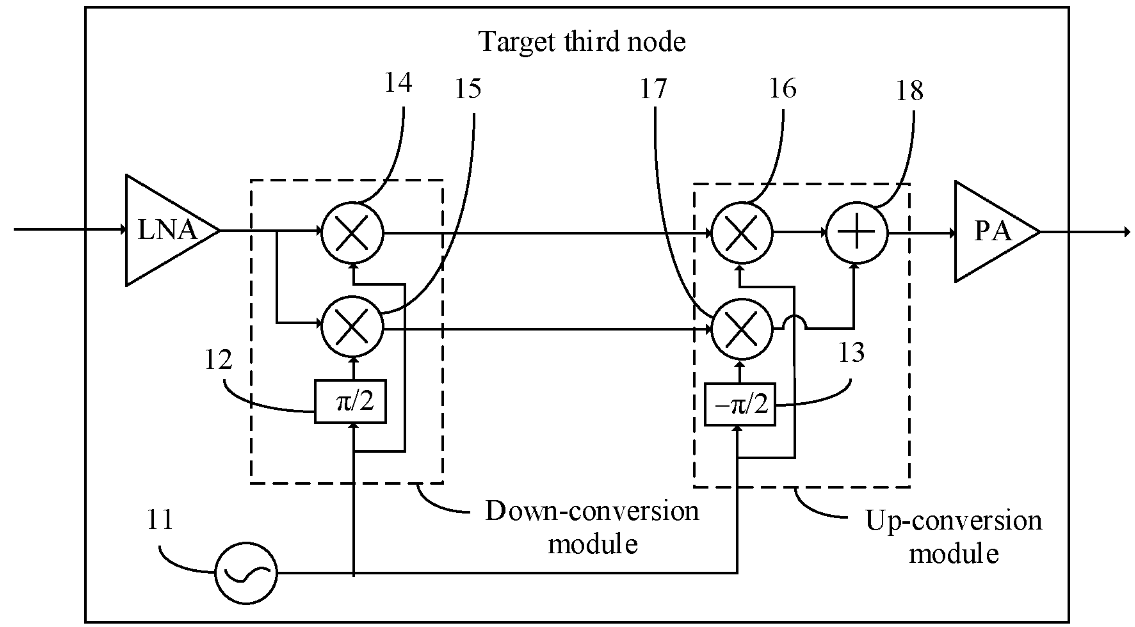
FIG. 33 is a schematic diagram of a structure of another target third node according to an embodiment of this disclosure.

(2.1) In a first optional processing manner, as shown in FIG. 33, the target third node includes a signal source unit 11, a first phase shift unit 12, a second phase shift unit 13, a first frequency mixing unit 14, a second frequency mixing unit 15, a third frequency mixing unit 16, a fourth frequency mixing unit 17, and a combining unit 18. The signal source unit 11 is configured to provide a local-frequency electromagnetic wave signal, and a center frequency of the local-frequency electromagnetic wave signal is the same as the center frequency of the first electromagnetic wave signal. The first phase shift unit 12, the second phase shift unit 13, the first frequency mixing unit 14, and the third frequency mixing unit 16 are all connected to the signal source unit 11, the first phase shift unit 12 is further connected to the second frequency mixing unit 15, the second phase shift unit 13 is further connected to the fourth frequency mixing unit 17, the first frequency mixing unit 14 is connected to the third frequency mixing unit 16, the second frequency mixing unit 15 is connected to the fourth frequency mixing unit 17, and the third frequency mixing unit 16 and the fourth frequency mixing unit 17 are both connected to the combining unit 18. The first frequency mixing unit 14, the second frequency mixing unit 15, and the first phase shift unit 12 may form a down-conversion module, and the third frequency mixing unit 16, the fourth frequency mixing unit 17, the second phase shift unit 13, and the combining unit 18 form a conjugate up-conversion module.

When the target third node performs the down-conversion on the first electromagnetic wave signal, the first frequency mixing unit 14 mixes the first electromagnetic wave signal and the local-frequency electromagnetic wave signal provided by the signal source unit 11 to obtain a real part signal I of the first baseband signal. The first phase shift unit 12 shifts a phase of the local-frequency electromagnetic wave signal provided by the signal source unit 11 by $\pi/2$ to obtain a first phase-shift signal, where $\pi$ represents a ratio of a circumference-diameter ratio constant of a circle. The second frequency mixing unit 15 mixes the first electromagnetic wave signal and the first phase-shift signal, to obtain an imaginary part signal Q of the first baseband signal. In this way, the first baseband signal including the real part signal I and the imaginary part signal Q is obtained. The first baseband signal $b_i(t)=I+Q$.

When the target third node performs the conjugate up-conversion on the first baseband signal, the third frequency mixing unit 16 mixes the real part signal I obtained by the first frequency mixing unit 14 and the local-frequency electromagnetic wave signal provided by the signal source unit 11 to obtain a first frequency-mixed signal. The second phase shift unit 13 shifts the phase of the local-frequency electromagnetic wave signal provided by the signal source unit 11 by $-\pi/2$ to obtain a second phase-shift signal. The fourth frequency mixing unit 17 mixes the imaginary part signal Q obtained by the second frequency mixing unit 15 and the second phase-shift signal obtained by the second phase shift unit 13 to obtain a second frequency-mixed signal. Finally, the combining unit 18 combines the first frequency-mixed signal obtained by the third frequency mixing unit 16 and the second frequency-mixed signal obtained by the fourth frequency mixing unit 17 to obtain the second electromagnetic wave signal.

In the first optional processing manner of the manner 2, because the second phase shift unit 13 shifts the phase of the local-frequency electromagnetic wave signal by $-\pi/2$ to obtain the second phase-shift signal, the fourth frequency mixing unit 17 mixes the imaginary part signal and the second phase-shift signal, which is equivalent to mixing the reverse signal of the imaginary part signal in the manner 1 and the second phase-shift signal in the manner 1. Therefore, in the first optional processing manner of the manner 2, the second frequency-mixed signal obtained by mixing the imaginary part signal and the second phase-shift signal by the fourth frequency mixing unit 17 is equivalent to the second frequency-mixed signal in the manner 1, and further in the first optional processing manner of the manner 2, the second electromagnetic wave signal obtained by the combining unit is equivalent to the second electromagnetic wave signal in the manner 1.

Figure 34:
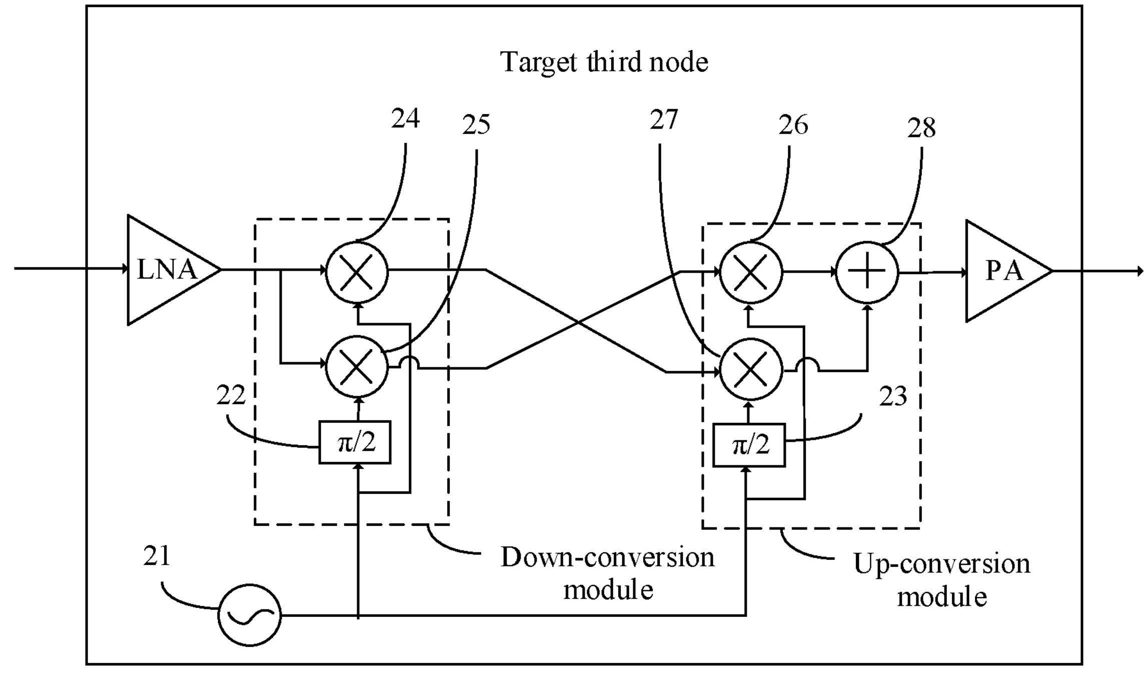
FIG. 34 is a schematic diagram of a structure of another target third node according to an embodiment of this disclosure.

(2.2) In a second optional processing manner of the manner 2, as shown in FIG. 34, the target third node includes a signal source unit 21, a first phase shift unit 22, a second phase shift unit 23, a first frequency mixing unit 24, a second frequency mixing unit 25, a third frequency mixing unit 26, a fourth frequency mixing unit 27, and a combining unit 28. The signal source unit 21 is configured to provide a local-frequency electromagnetic wave signal, and a center frequency of the local-frequency electromagnetic wave signal is the same as the center frequency of the first electromagnetic wave signal. The first phase shift unit 22, the second phase shift unit 23, the first frequency mixing unit 24, and the third frequency mixing unit 26 are all connected to the signal source unit 21, the first phase shift unit 22 is further connected to the second frequency mixing unit 25, the second phase shift unit 23 is further connected to the fourth frequency mixing unit 27, the first frequency mixing unit 24 is connected to the fourth frequency mixing unit 27, the second frequency mixing unit 25 is connected to the third frequency mixing unit 26, and the third frequency mixing unit 26 and the fourth frequency mixing unit 27 are both connected to the combining unit 28. The first frequency mixing unit 24, the second frequency mixing unit 25, and the first phase shift unit 22 may form a down-conversion module, and the third frequency mixing unit 26, the fourth frequency mixing unit 27, the second phase shift unit 23, and the combining unit 28 form a conjugate up-conversion module.

When the target third node performs the down-conversion on the first electromagnetic wave signal, the first frequency mixing unit 24 mixes the first electromagnetic wave signal and the local-frequency electromagnetic wave signal provided by the signal source unit 21 to obtain a real part signal I of the first baseband signal. The first phase shift unit 22 shifts a phase of the local-frequency electromagnetic wave signal provided by the signal source unit 21 by $\pi/2$ to obtain a first phase-shift signal, where $\pi$ represents a ratio of a circumference-diameter ratio constant of a circle. The second frequency mixing unit 25 mixes the first electromagnetic wave signal and the first phase-shift signal, to obtain an imaginary part signal Q of the first baseband signal. In this way, the first baseband signal including the real part signal I and the imaginary part signal Q is obtained. The first baseband signal $b_i(t)=I+Q$.

When the target third node performs the up-conversion on the first baseband signal, the third frequency mixing unit 26 mixes the imaginary part signal Q and the local-frequency electromagnetic wave signal provided by the signal source unit 21 to obtain a first frequency-mixed signal. The second phase shift unit 23 shifts the phase of the local-frequency electromagnetic wave signal provided by the signal source unit 21 by $\pi/2$ to obtain a first phase-shift signal. The fourth frequency mixing unit 27 mixes the real part signal I and the first phase-shift signal obtained by the second phase shift unit 23, to obtain a second frequency-mixed signal. The combining unit 28 combines the first frequency-mixed signal and the second frequency-mixed signal to obtain the second electromagnetic wave signal.

It can be learned that, in the second optional processing manner of the manner 2, the real part signal and the imaginary part signal in the input signal of the upper frequency mixing unit are crossed, to implement the conjugate on the first baseband signal. In this case, the upper frequency mixing unit is equivalent to additionally adding a phase rotation of 90 degrees after performing the conjugate on the first baseband signal. The phase rotation of 90 degrees does not affect effect of the target processing.

(3) Manner 3: When performing the target processing on the first electromagnetic wave signal, the target third node may perform spectrum shifting on the first electromagnetic wave signal to obtain a third electromagnetic wave signal; and then filter the third electromagnetic wave signal to obtain the second electromagnetic wave signal.

It should be noted that the first electromagnetic wave signal $S_i(t)$ is a band-pass real signal, and the spectrum of the first electromagnetic wave signal has conjugate symmetry, that is, the spectrum $S_i(f)$ of the first electromagnetic wave signal is conjugate symmetric with respect to a vertical coordinate axis (a point passing through a frequency 0) of a coordinate system in which the spectrum is located, that is, $S_i(f)=S_i^*(-f)$. In this case, the spectrum $B_i(f)$ of the baseband signal $b_i(t)$ of the first electromagnetic wave signal is on a positive half-axis side of $S_i(f)$, and the center frequency $f_0$ of the first electromagnetic wave signal is used as a center frequency. That is, $B_i(f)=S_i(f+f_0)$, $-F/2<f<F/2$, where F is bandwidth of the first electromagnetic wave signal.

According to the conjugate symmetry of $S_i(f)$, a spectrum that is conjugately symmetric to $B_i(f)$ exists in an interval $$\left[-\frac{F}{2}-f_0, -f_0+\frac{F}{2}\right]$$

on a negative half-axis side of $S_i(f)$, that is, $$S_i^*(-f-f_0)=B_i^*(-f),\ -F/2<f<F/2.$$

Therefore, the conjugate symmetry of the signal spectrum of the original positive half-axis can be equivalently implemented by shifting the spectrum $S^*_i(-f-f_0)$ of $S_i(f)$ at $-f_0$ on the negative half-axis side to $f_0$ on the positive half-axis.

Figure 35:
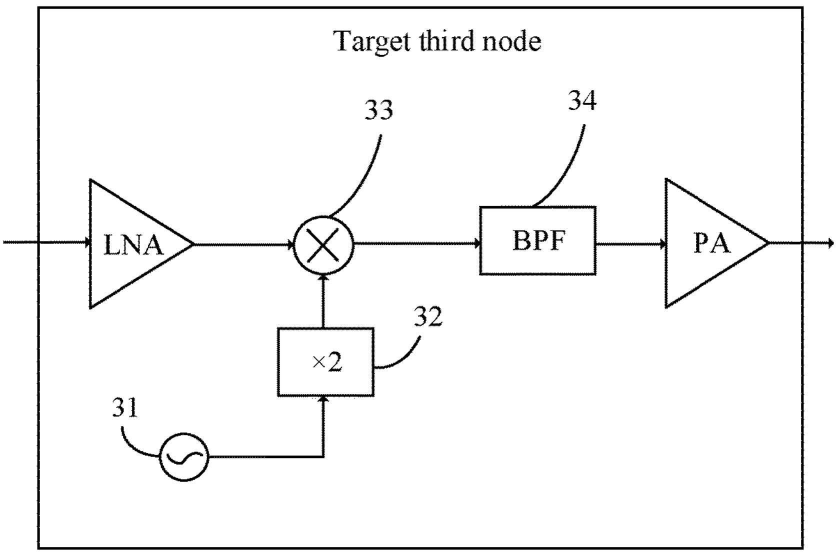
FIG. 35 is a schematic diagram of a structure of another target third node according to an embodiment of this disclosure.

When the target third node performs the target processing on the first electromagnetic wave signal in the manner 3, as shown in FIG. 35, the target third node may include a signal source unit 31, a frequency multiplication unit 32, a frequency mixing unit 33, and a filter unit 34. The signal source unit 31, the frequency multiplication unit 32, the frequency mixing unit 33, and the filter unit 34 are sequentially connected. The signal source unit 31 is configured to provide a local-frequency electromagnetic wave signal, and a center frequency of the local-frequency electromagnetic wave signal is the same as the center frequency of the first electromagnetic wave signal. The filter unit 34 may be a band-pass filter unit (BPF).

When the target third node performs the spectrum shifting on the first electromagnetic wave signal, the frequency multiplication unit 32 obtains a frequency multiplied signal of the local-frequency electromagnetic wave signal generated by the signal source unit 31.

A center frequency $2f_0$ of the frequency multiplied signal is twice the center frequency $f_0$ of the first electromagnetic wave signal. Then, the frequency mixing unit 33 mixes the first electromagnetic wave signal and the frequency multiplied signal to obtain the third electromagnetic wave signal.

Spectra of the third electromagnetic wave signal include: a spectrum near $2f_0+f_0=3f_0$, a spectrum near $f_0-2f_0=-f_0$, a spectrum near $-f_0+2f_0-f_0$, and a spectrum near $-f_0-2f_0=-3f_0$.

In this case, it is equivalent to that the spectrum near $-f_0$ in the spectra of the first electromagnetic wave signal is shifted to near $f_0$ and near $-3f_0$, and the spectrum near original $f_0$ is shifted to near $-f_0$ and near $3f_0$.

When the target third node filters the third electromagnetic wave signal, the filter unit 34 filters the third electromagnetic wave signal to obtain the second electromagnetic wave signal. A center frequency of the filter unit 34 is $f_0$. Therefore, after the filter unit 34 filters the third electromagnetic wave signal, the spectra near $3f_0$ and $-3f_0$ in the spectra of the third electromagnetic wave signal are filtered out, and spectra of the obtained second electromagnetic wave signal include the spectra near $f_0$ and $-f_0$. In addition, the spectrum near $f_0$ in the spectra of the second electromagnetic wave signal is conjugately symmetric to the spectrum near $f_0$ in the spectra of the first electromagnetic wave signal.

(4) Manner 4: When performing the target processing on the first electromagnetic wave signal, the target third node may sequentially perform frequency conversion, spectrum shifting, filtering, and frequency conversion on the first electromagnetic wave signal to obtain the second electromagnetic wave signal.

Figure 36:
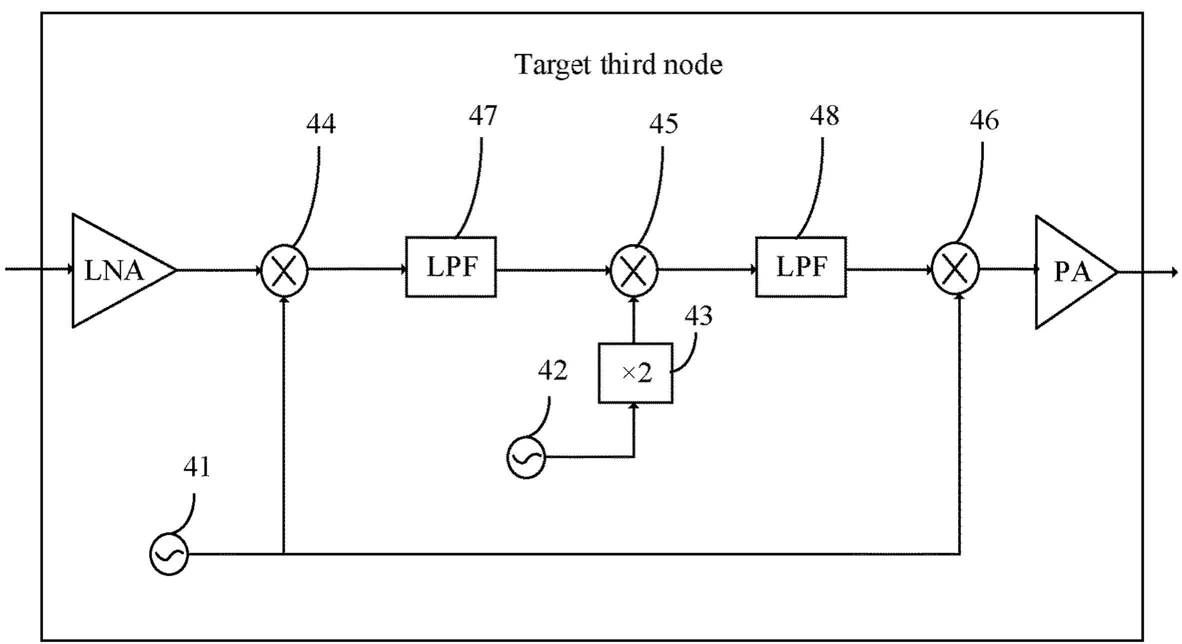
FIG. 36 is a schematic diagram of a structure of another target third node according to an embodiment of this disclosure.

When the target third node performs the target processing on the first electromagnetic wave signal in the manner 4, as shown in FIG. 36, the target third node may include a first signal source unit 41, a second signal source unit 42, a frequency multiplication unit 43, a first frequency mixing unit 44, a second frequency mixing unit 45, a third frequency mixing unit 46, a first filter unit 47, and a second filter unit 48. The first frequency mixing unit 44, the first filter unit 47, the second frequency mixing unit 45, the second filter unit 48, and the third frequency mixing unit 46 are sequentially connected. The first signal source unit 41 is connected to the first frequency mixing unit 44, and the second signal source unit 42 is connected to the second frequency mixing unit 45 via the frequency multiplication unit 43. The first signal source unit 41 is configured to generate a first local-frequency electromagnetic wave signal, and the second signal source unit 42 is configured to generate a second local-frequency electromagnetic wave signal. A center frequency of the first local-frequency electromagnetic wave signal is $f_1$, a center frequency of the second local-frequency electromagnetic wave signal is $f_2$, the center frequency of the first electromagnetic wave signal is $f_0$, $f1+f_2=f_0$, $f_1<f_0-F/2$, and F represents bandwidth of the first electromagnetic wave signal. Both the first filter unit 47 and the second filter unit 48 may be low-pass filter units (LPF).

When the target third node performs the target processing on the first electromagnetic wave signal, the first frequency mixing unit 44 mixes the first electromagnetic wave signal and the first local-frequency electromagnetic wave signal to obtain a first frequency-mixed signal. After frequency mixing by the first frequency mixing unit 44, in spectra of the first electromagnetic wave signal, a spectrum near $f_0$ is shifted to near $f_0-f_1=f_2$ and near $f_0+f_1$, and a spectrum near $-f_0$ is shifted to near $-f_0-f_1$ and near $-f_0+f_1=-f_2$. Then, the first filter unit 47 filters the first frequency-mixed signal to obtain a first sub-signal in the first frequency-mixed signal, where a center frequency of the first sub-signal is $f_2$. After filtering by the first filter unit 47, the spectrum near $f_0+f_1$ and the spectrum near $-f_0-f_1$ in the first frequency-mixed signal are filtered out. In this case, spectra of the first sub-signal obtained through filtering include the spectrum near $f_2$ and the spectrum near $-f_2$, and the spectrum near $f_2$ is consistent with the spectrum near $f_2$ in the spectra of the first electromagnetic wave signal, and no conjugate symmetry occurs. Optionally, to avoid aliasing between the spectrum near $f_2$ and the spectrum near $-f_2$ in the spectra of the first sub-signal, in this embodiment of this disclosure, $f1<f0-F/2$ may be set, that is, $f2<F/2$.

When the target third node performs the target processing on the first electromagnetic wave signal, the frequency multiplication unit 43 may obtain a frequency multiplied signal of the second local-frequency electromagnetic wave signal, where a center frequency of the frequency multiplied signal is twice $f_2$ (that is, $2f_2$). Then, the second frequency mixing unit 45 mixes the first sub-signal obtained by the first filter unit 47 and the frequency multiplied signal, to obtain a second frequency-mixed signal. Spectra of the second frequency-mixed signal include: a spectrum near $2f_2+f_2=3f_2$, a spectrum near $f_2-2f_2=-f_2$, a spectrum near $-f_2+2f_2=f_2$, and a spectrum near $-f_2-2f_2=-3f_2$. In this case, it is equivalent to that a part on a negative half-axis in the spectra of the first sub-signal is shifted from near $-f_2$ to near $f_2$ on a positive half-axis and near $-3f_2$ on the negative half-axis, and a part on the positive half-axis in the spectra of the first sub-signal is shifted from near the center frequency $f_2$ to near $3f_2$ and near $-f_2$ on the negative half-axis. Then, the second filter unit 48 filters the second frequency-mixed signal, filters out the spectra near $3f_2$ and $-3f_2$ in the second frequency-mixed signal, to obtain a second sub-signal in the second frequency-mixed signal, where spectra of the second sub-signal include the spectrum near $f_2$ and the spectrum near $-f_2$. Finally, the third mixing unit 46 mixes the second sub-signal and the first local-frequency electromagnetic wave signal to obtain the second electromagnetic wave signal.

(5) Manner 5: When performing the target processing on the first electromagnetic wave signal, the target third node performs parametric amplification on the first electromagnetic wave signal to obtain the second electromagnetic wave signal. It should be noted that when the target third node performs the target processing on the first electromagnetic wave signal in the manner 5, there are various processing manners of the target third node.

Figure 37:
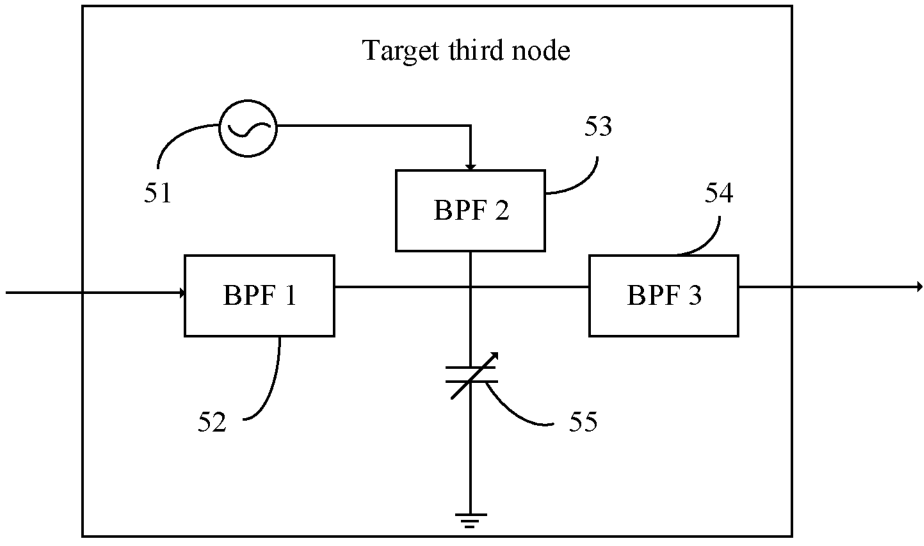
FIG. 37 is a schematic diagram of a structure of another target third node according to an embodiment of this disclosure.

(5.1) In a first optional processing manner, as shown in FIG. 37, the target third node includes a signal source unit 51, a first filter unit 52, a second filter unit 53, a third filter unit 54, and a nonlinear unit 55. The signal source unit 51 is configured to provide a local-frequency electromagnetic wave signal. The signal source unit 51 is connected to the second filter unit 53, and the first filter unit 52, the second filter unit 53, and the third filter unit 54 are all connected to the nonlinear unit 55. The nonlinear unit 55 may be a varactor diode or a Josephson junction.

When the target third node performs the parametric amplification on the first electromagnetic wave signal, the first filter unit 52 filters the first electromagnetic wave signal to obtain a first filtered signal, where a center frequency of the first filtered signal is the center frequency $f_0$ of the first electromagnetic wave signal. In addition, the second filter unit 53 filters the local-frequency electromagnetic wave signal to obtain a second filtered signal, and a center frequency of the second filtered signal is $f_p$. Then, the nonlinear unit 55 performs parametric amplification on the first filtered signal based on the second filtered signal to obtain a parametric amplified signal. The third filter unit 54 may filter the parametric amplified signal to obtain the second electromagnetic wave signal, where the center frequency of the second electromagnetic wave signal is $Mf_p+Nf_0$, both M and N are non-zero integers, N is less than zero, and $Mf_p+Nf_0=f_0$.

It should be noted that, the second filtered signal obtained by filtering the local-frequency electromagnetic wave signal generated by the signal source unit 51 by the second filter unit 53 is used as a pump signal, and is applied to the nonlinear unit 55 together with the first filtered signal (the center frequency is $f_0$) obtained by filtering the first electromagnetic wave signal input to the target third node by the first filter unit 52. The nonlinear unit 55 has nonlinear effect under the action of the pump signal, and the nonlinear unit 55 transfers energy in the pump signal to an output parametric amplified signal, to implement parametric amplification. The nonlinear unit 55 may generate the parametric amplified signal at any frequency $Af_p+Bf_0$ (both A and B are non-zero integers). In this case, the third filter unit 54 may filter the parametric amplified signal output by the nonlinear unit 55, to obtain the second electromagnetic wave signal whose center frequency is $Mf_p+Nf_0$. In addition, to implement the conjugate symmetry of the spectrum of the second electromagnetic wave signal with respect to the spectrum of the first electromagnetic wave signal, N needs to be an integer less than zero. For example, M=2 and N=−1. In this case, the center frequency of the second electromagnetic wave signal is $2f_p-f_0$, and $f_p$ may be a frequency close to $f_0$. When $f_p$ is a frequency similar to $2f_0$, M=1 and N=−1 may also be selected. In this case, the center frequency of the second electromagnetic wave signal is $f_p-f_0=f_0$.

In addition, because the target third node performs the parametric amplification on the first electromagnetic wave signal in a process of performing the target processing on the first electromagnetic wave signal, power of the second electromagnetic wave signal can also be increased, thereby reducing a transmission loss of the electromagnetic wave signal on the cable.

Figure 38:
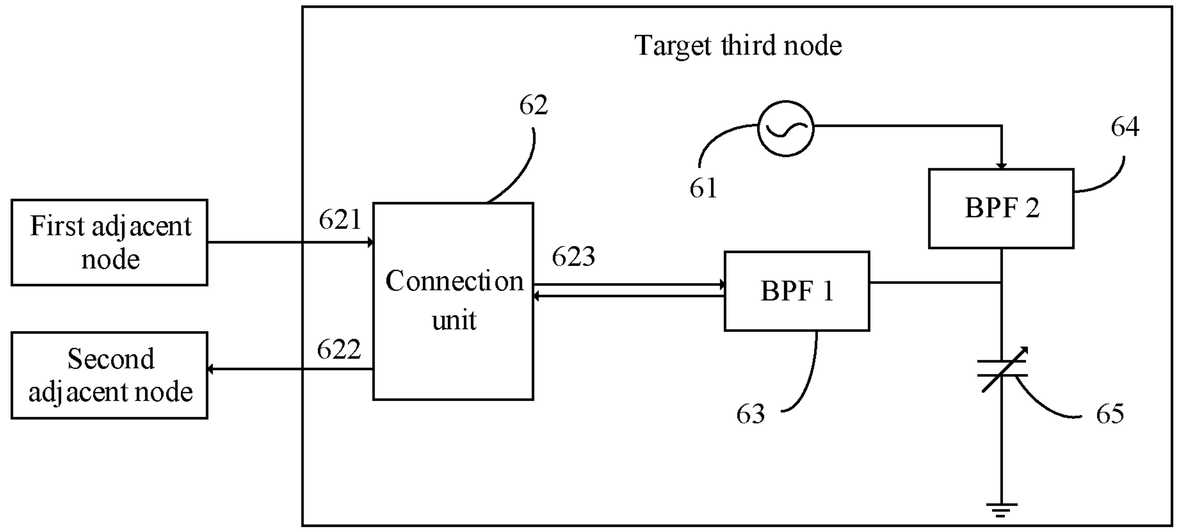
FIG. 38 is a schematic diagram of a structure of another target third node according to an embodiment of this disclosure.

(5.2) In a second optional processing manner, as shown in FIG. 38, the target third node includes a signal source unit 61, a connection unit 62, a first filter unit 63, a second filter unit 64, and a nonlinear unit 65. The connection unit 62 has a first end 621, a second end 622, and a third end 623, the first end 621 is connected to the first adjacent node, the second end 622 is connected to the second adjacent node, and the third end 623 is connected to one end of the first filter unit 63. The connection unit 62 is configured to transmit a signal that is input from the first end 621 to the third end 623, and transmit a signal that is input from the third end 623 to the second end 622. The other end of the first filter unit 63 and the second filter unit 64 are connected to the nonlinear unit 65. The signal source unit 61 is connected to the second filter unit 64, and the signal source unit 61 is configured to provide a local-frequency electromagnetic wave signal.

When the target third node performs the parametric amplification on the first electromagnetic wave signal, the first electromagnetic wave signal from the first adjacent node is input to the first end 621 of the connection unit 62, and the connection unit 62 transmits the first electromagnetic wave signal to the third end 623 and then inputs the first electromagnetic wave signal to one end of the first filter unit 63. The first filter unit 63 filters the first electromagnetic wave signal input from the one end of the first filter unit 63 to obtain a first filtered signal, and outputs the first filtered signal from the other end of the first filter unit 63, where a center frequency of the first filtered signal is the center frequency $f_0$ of the first electromagnetic wave signal. At the same time, the second filter unit 64 filters the local-frequency electromagnetic wave signal to obtain a second filtered signal, where a center frequency of the second filtered signal is $f_p$. Then, the nonlinear unit 65 performs parametric amplification on the first filtered signal based on the second filtered signal to obtain a parametric amplified signal. The parametric amplified signal is transmitted to the other end of the first filter unit 63. The first filter unit 63 filters the parametric amplified signal to obtain a second electromagnetic wave signal, and outputs the second electromagnetic wave signal from the other end of the first filter unit 63. The second electromagnetic wave signal output from the one end of the first filter unit 63 is input to the third end 623 of the connection unit 62, is transmitted by the connection unit 62 to the second end 622, and is further transmitted to the second adjacent node. The center frequency of the second electromagnetic wave signal is $Mf_p+Nf_0$, $Mf_p+Nf_0=f_0$, both M and N are non-zero integers, and N is less than zero.

In the second optional processing manner, filtering the parametric amplification signal to obtain the second electromagnetic wave signal and filtering the first electromagnetic wave signal to obtain the first filtered signal are both implemented on the first filter unit. In addition, the second electromagnetic wave signal and the first filtered signal are separated via a connection unit (for example, a device such as a circulator) according to different signal directions.

Optionally, in this embodiment of this disclosure, before performing the target processing on the first electromagnetic wave signal, the target third node may further perform low-noise amplification on the first electromagnetic wave signal, to improve quality of the first electromagnetic wave signal. For example, refer to any one of FIG. 29 and FIG. 33 to FIG. 36. The target third node may further include a low noise amplifier (LNA), and the LNA is configured to perform the low noise amplification on the first electromagnetic wave signal. For example, in FIG. 29, the LNA is connected to the first frequency mixing unit 04 and the second frequency mixing unit 05 in the down-conversion module. After performing the low-noise amplification on the first electromagnetic wave signal, the LNA inputs the low-noise-amplified first electromagnetic wave signal into the down-conversion module, so that the down-conversion module performs down-conversion on the low-noise-amplified first electromagnetic wave signal.

Optionally, in this embodiment of this disclosure, after performing the target processing on the first electromagnetic wave signal to obtain the second electromagnetic wave signal, and before sending the second electromagnetic wave signal to the second adjacent node, the target third node may further perform power amplification on the second electromagnetic wave signal, to increase power of the second electromagnetic wave signal, thereby reducing a transmission loss of the electromagnetic wave signal on the cable. For example, refer to any one of FIG. 29 and FIG. 33 to FIG. 36. The target third node may further include a power amplifier (PA), and the PA is configured to perform power amplification on the second electromagnetic wave signal.

Figure 39:
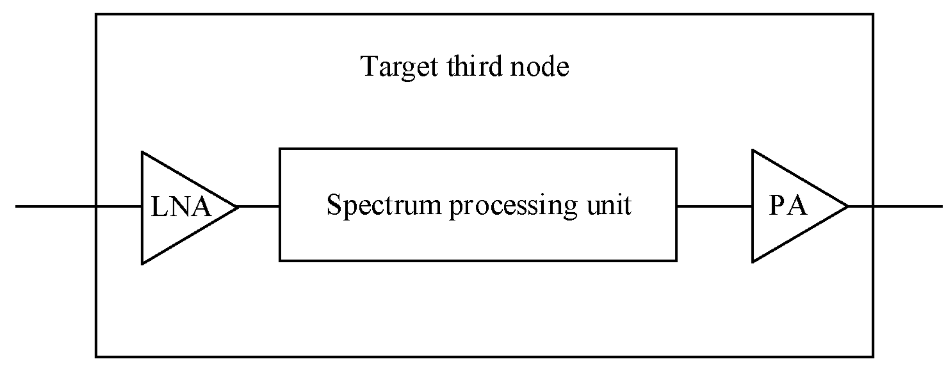
FIG. 39 is a schematic diagram of a structure of another target third node according to an embodiment of this disclosure.

In addition, a part that is of the target third node and that is configured to perform the foregoing target processing may be a spectrum processing unit. When the target third node includes the PA and the LNA, as shown in FIG. 39, the LNA, the spectrum processing unit, and the PA may be sequentially connected.

It can be learned from a function of the target third node provided in this embodiment of this disclosure that the target third node does not need to perform complex signal processing performed by the fourth node shown in FIG. 9. Therefore, power consumption, a delay, and implementation complexity of the target third node are all very low, and the target third node is suitable for large-scale deployment when high-speed communication is performed between the first node and the second node, so that a transmission length of the first node and the second node in the communication system can be greatly extended.

A module that is in the target third node and that is configured to perform the target processing may be referred to as a target processing module. In this case, all units that are configured to implement the target processing in the manner 1 to the manner 5 belong to the target processing module. The target third node may further include other modules, for example, a receiving module configured to receive the first electromagnetic wave signal sent by the first adjacent node, and a sending module configured to send the second electromagnetic wave signal to the second adjacent node. Details are not described herein in this embodiment of this disclosure.

Figure 40:
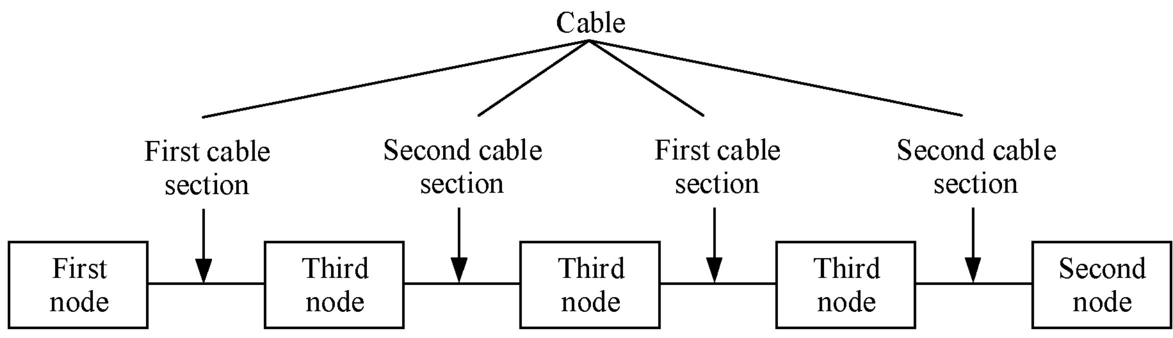
FIG. 40 is a schematic diagram of a cable section according to an embodiment of this disclosure.

Further, in the communication system provided in this embodiment of this disclosure, at least one third node (one or more third nodes) may be disposed on the cable between the first node and the second node, and each third node may have the function of the target third node. The cable is divided into a plurality of cable sections by the first node, the at least one third node, and the second node. A cable section between a $(2n+1)^{th}$ node and a $(2n+2)^{th}$ node located in the first node, the at least one third node, and the second node is referred to as a first cable section, where n>0. A cable section between a $(2n+2)^{th}$ node and a $(2n+3)^{th}$ node located in the first node, the at least one third node, and the second node is referred to as a second cable section. For example, as shown in FIG. 40, it is assumed that three third nodes are disposed on the cable in total. A cable section between the first node and a $1^{st}$ third node is a first cable section, a cable section between the $1^{st}$ third node and a $2^{nd}$ third node is a second cable section, a cable section between the $2^{nd}$ third node and a $3^{rd}$ third node is a first cable section, and a cable section between the 3rd third node and a $4^{th}$ third node is a second cable section.

A length of each cable section meets a specific constraint condition.

For example, the length of each cable section in the cable meets the first constraint condition: an absolute value of a difference between a sum of lengths of the first cable section and a sum of lengths of the second cable section in the cable is less than a first length.

The first length is a minimum value of a frequency selective fading transmission length and a dispersion transmission length. After the frequency selective fading transmission length is transmitted over the cable, a maximum fading amplitude in fading amplitudes of frequencies in the electromagnetic wave signal sent by the first node is a maximum fading amplitude that is capable of being processed by the second node. The frequency selective fading transmission length may be a quotient of the maximum fading amplitude and a unit fading amplitude in the cable. The unit fading amplitude is a maximum fading amplitude of fading amplitudes of frequencies in the electromagnetic wave signal sent by the first node when the electromagnetic wave signal is transmitted over a cable section of a unit length in the cable. After the dispersion transmission length is transmitted over the cable, dispersion of the electromagnetic wave signal sent by the first node is maximum dispersion that is capable of being processed by the second node. The dispersion transmission length may be a quotient of the maximum dispersion and a dispersion amount of a cable section per unit length in the cable.

When the first length is the minimum value of the frequency selective fading transmission length and the dispersion transmission length, the absolute value of the difference between the sum of the lengths of the first cable section and the sum of the lengths of the second cable section in the cable is less than the minimum value. This can ensure that both frequency selective fading and group delay dispersion of the electromagnetic wave signal received by the second node are small.

For another example, the length of each cable section in the cable meets a second constraint condition: a length of a cable section between any two adjacent nodes in the cable is less than or equal to a second length, and the second length is a maximum length that can be transmitted by the electromagnetic wave signal sent by the first node.

The maximum length that can be transmitted by the electromagnetic wave signal sent by the first node is a maximum length transmitted by the electromagnetic wave signal sent by the first node when no node exists between the first node and the second node and the electromagnetic wave signal sent by the first node can be effectively received by the second node. The maximum length is determined by device parameters such as a transmission loss of the electromagnetic wave signal transmitted over the cable, power of transmitting the electromagnetic wave signal by the first node, and sensitivity of receiving the electromagnetic wave signal by the second node. When the length of the cable section between the any two adjacent nodes is less than or equal to the maximum length that can be transmitted by the electromagnetic wave signal sent by the first node, it can be ensured that the electromagnetic wave signal can be effectively transmitted between the cable sections.

Figure 41:
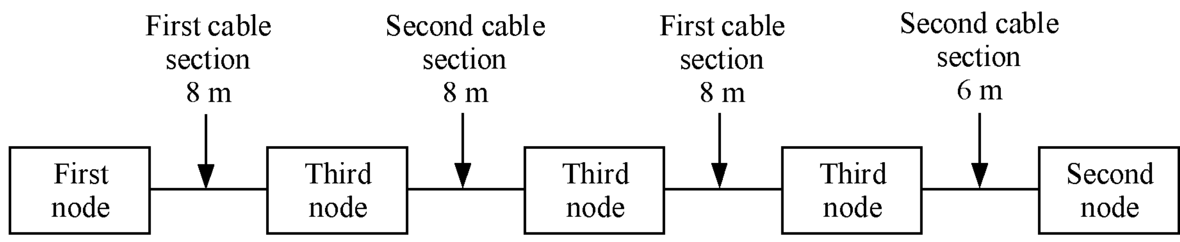
FIG. 41 is a schematic diagram of a length of a cable section according to an embodiment of this disclosure.

For example, as shown in FIG. 41, it is assumed that the transmission length (that is, a length of the cable) between the first node and the second node is 30 meters (m), and the second length is 8 m. The second node uses a self-mixing demodulation architecture, the frequency selective fading transmission length is 3 m, the dispersion transmission length is 2 m, and the first length is 2 m. Therefore, a total length of the cable is 30 m, a length of the first cable section in the cable is 8 m, and a length of the second cable section is 6 m. Both the length of the first cable section and the length of the second cable section are less than or equal to the second length 8 m. In addition, an absolute value (2 m) of a difference between a sum (16 m) of lengths of the first cable section and a sum (14 m) of lengths of the second cable section is less than or equal to the first length (2 m). It can be learned that both the first constraint condition and the second constraint condition are met.

In addition, based on the first constraint condition and the second constraint condition, a quantity of third nodes disposed on the cable should be as small as possible. However, when the transmission length between the first node and the second node is a specific transmission length, a simple arrangement manner of the third node (for example, the lengths of the cable sections are evenly distributed as much as possible) causes a large absolute value of the difference between the sum of the lengths of the first cable section and the sum of the lengths of the second cable section, and consequently the first constraint condition is not met. In this case, the first constraint condition may be met by adding the third node.

Figure 42:
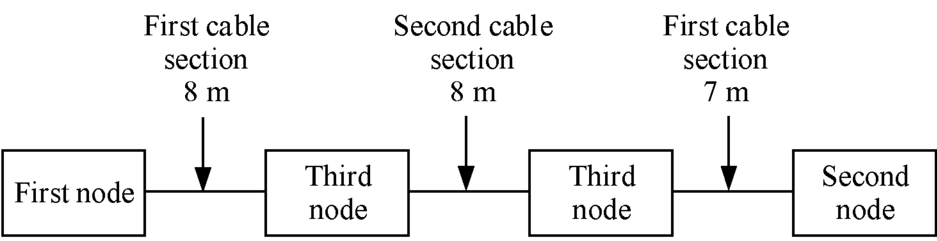
FIG. 42 is a schematic diagram of a length of another cable section according to an embodiment of this disclosure.

For example, as shown in FIG. 42, it is assumed that the transmission length between the first node and the second node is 23 m, and the second length is 8 m. The second node uses a self-mixing demodulation architecture, the frequency selective fading transmission length is 3 m, the dispersion transmission length is 2 m, and the first length is 2 m. Therefore, a total length of the cable is 23 m. If a length of the first cable section in the cable is 8 m, and a length of the second cable section is 7 m, both the length of the first cable section and the length of the second cable section are less than or equal to the second length 8 m, and the second constraint condition is met. However, an absolute value (7 m) of a difference between a sum (15 m) of lengths of the first cable section and a sum (8 m) of lengths of the second cable section cannot meet a requirement of being less than or equal to the first length (2 m), and the first constraint condition is not met. In addition, because a length of each cable section is close to the second length 8 m, it is difficult to adjust a location of the third node in a large range.

Figures 43, 44, 45:
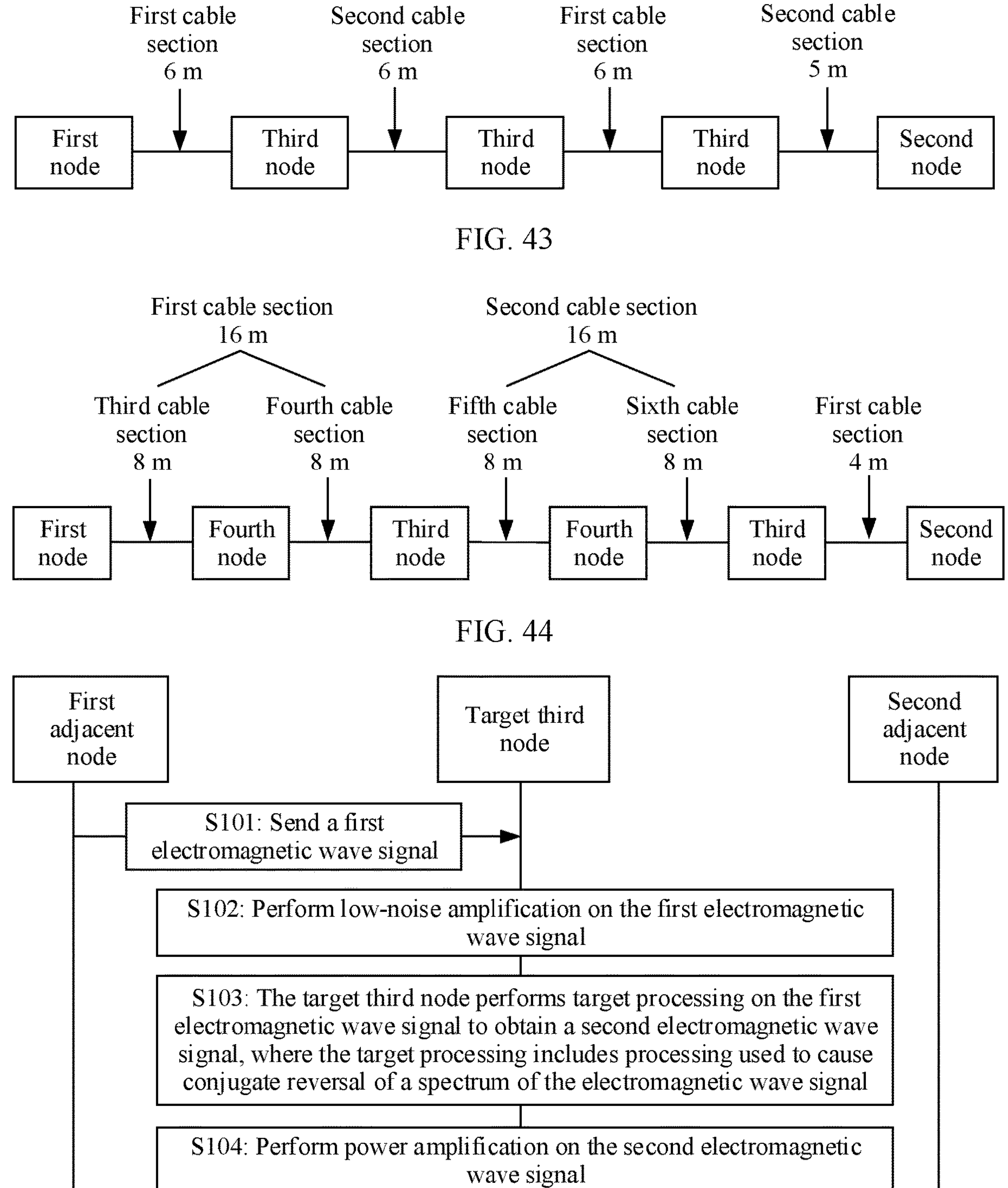
FIG. 43 is a schematic diagram of a length of another cable section according to an embodiment of this disclosure.
FIG. 44 is a schematic diagram of a structure of another communication system according to an embodiment of this disclosure.
FIG. 45 is a flowchart of a communication method according to an embodiment of this disclosure.

In this case, one third node may be added to the cable, and then the lengths of the cable sections are evenly allocated as much as possible. As shown in FIG. 43, a total length of the cable is 23 m. A length of the first cable section in the cable is 6 m, a length of one second cable section is 7 m, and a length of the other second cable section is 5 m. In addition, both the length of the first cable section and the length of the second cable section are less than or equal to the second length 8 m. In addition, an absolute value (1 m) of a difference between a sum (12 m) of lengths of the first cable section and a sum (11 m) of lengths of the second cable section is less than or equal to the first length (2 m). It can be learned that both the first constraint condition and the second constraint condition are met.

Further, at least one fourth node may be further disposed on the cable, and the fourth node is configured to perform power amplification on the electromagnetic wave signal transmitted over the cable. When a transmission length between the first node and the second node is long, and a quantity of third nodes is large, in this embodiment of this disclosure, the fourth node may be further disposed on one or more cable sections, so that the fourth node performs the power amplification on the electromagnetic wave signal transmitted over the cable, thereby ensuring that power of the electromagnetic wave signal received by the second node is high, and reducing a transmission loss of the electromagnetic wave signal.

For example, as shown in FIG. 44, it is assumed that the transmission length between the first node and the second node is 36 m, and the second length is 8 m. The second node uses a coherent demodulation architecture, the frequency selective fading transmission length is 5 m, the dispersion transmission length is 4 m, and the first length is 4 m. Therefore, a total length of the cable is 36 m. Two third nodes are disposed on the cable in total, a cable section between the first node and a $1^{st}$ third node is $1^{st}$ first cable section, a cable section between a $2^{nd}$ third node and the second node is a $2^{nd}$ first cable section, and a cable section between the two third nodes is a second cable section. One fourth node may be disposed on the first cable section, and one fourth node may be disposed on the second cable section. The first cable section includes a third cable section and a fourth cable section, and the second cable section includes a fifth cable section and a sixth cable section.

A length of the $1^{st}$ first cable section in the cable is 16 m, a length of the $2^{nd}$ first cable section is 4 m, and a length of the second cable section is 16 m. In this case, an absolute value (4 m) of a difference between a sum (20 m) of lengths of the first cable section and a sum (16 m) of lengths of the second cable section is less than or equal to the first length (4 m), and the first constraint condition is met. In addition, a length of each cable section in the cable is less than or equal to the second length (8 m), and the second constraint condition is met.

In this embodiment of this disclosure, an example in which the fourth node has a function of the fourth node shown in FIG. 8 is used. Optionally, the fourth node may also have a function of the fourth node shown in FIG. 9. Alternatively, some of fourth nodes have a function of the fourth node shown in FIG. 8, and the other some of fourth nodes have a function of the fourth node shown in FIG. 9. This is not limited in this embodiment of this disclosure.

An embodiment of this disclosure further provides a second node. The second node may be the second node in the foregoing communication system. The second node is configured to receive an electromagnetic wave signal sent by an adjacent third node, and determine, based on the electromagnetic wave signal, data carried in an electromagnetic wave signal sent by a first node. The electromagnetic wave signal received by the second node may be a second electromagnetic wave signal obtained through target processing by the adjacent third node.

Further, in this embodiment of this disclosure, in a process of performing target processing on the received first electromagnetic wave signal, a target third node performs processing used to cause conjugate reversal of a spectrum of the electromagnetic wave signal on the first electromagnetic wave signal. Therefore, when an even number of third nodes are disposed on the cable, and each third node has a function of the target third node, the even number of third nodes may be divided into a plurality of groups of third nodes that are sequentially arranged in a direction from the first node to the second node, and each group of third nodes includes two third nodes. After target processing is performed by the two third nodes on the electromagnetic wave signal, the conjugate reversal does not occur on the spectrum of the electromagnetic wave signal. Therefore, the conjugate reversal does not occur on the electromagnetic wave signal received by the second node relative to the spectrum of the electromagnetic wave signal sent by the first node.

However, when an odd number of third nodes are disposed on the cable, and each third node has a function of the target third node, the odd number of third nodes may be divided into a plurality of groups of third nodes and one third node that are sequentially arranged in a direction from the first node to the second node, and each group of third nodes includes two third nodes. After target processing is performed by the two third nodes on the electromagnetic wave signal, the conjugate reversal does not occur on the spectrum of the electromagnetic wave signal. However, after the electromagnetic wave signal is processed by a last third node, the conjugate reversal occurs on the spectrum of the electromagnetic wave signal. Therefore, the conjugate reversal occurs on the electromagnetic wave signal received by the second node relative to the spectrum of the electromagnetic wave signal sent by the first node. Therefore, when the odd number of third nodes are disposed on the cable, the second node needs to perform the processing used to cause the conjugate reversal of the spectrum of the electromagnetic wave signal on the received electromagnetic wave signal.

For example, when the odd number of third nodes are disposed on the cable, when determining, based on the received electromagnetic wave signal, the data carried in the electromagnetic wave signal sent by the first node, the second node may first process the received electromagnetic wave signal to obtain the electromagnetic wave signal sent by the first node, then obtain a baseband signal of the electromagnetic wave signal sent by the first node, and perform constellation mapping based on the baseband signal to obtain the data carried in the electromagnetic wave signal sent by the first node. A process in which the second node processes the received electromagnetic wave signal to obtain the electromagnetic wave signal sent by the first node is the same as a process in which the target third node performs the processing on the first electromagnetic wave signal to obtain the second electromagnetic wave signal. Details are not described herein in this embodiment of this disclosure.

For another example, when the odd number of third nodes are disposed on the cable, when the second node determines, based on the received electromagnetic wave signal, the data carried in the electromagnetic wave signal sent by the first node, the second node may first obtain a second baseband signal of the received electromagnetic wave signal, where the second baseband signal includes a real part signal and an imaginary part signal. Then, the second node may obtain a first baseband signal based on the second baseband signal, where the first baseband signal is conjugate to the second baseband signal. Finally, the second node may perform constellation mapping based on the first baseband signal to obtain the data carried in the electromagnetic wave signal sent by the first node.

When the even number of third nodes are disposed on the cable, the second node may directly obtain a baseband signal of the received electromagnetic wave signal, and perform constellation mapping based on the real part signal and the imaginary part signal in the baseband signal to obtain the data carried in the electromagnetic wave signal sent by the first node.

In addition, if the second electromagnetic wave signal is different from a conjugate reversed signal, before determining, based on the received electromagnetic wave signal, the data carried in the electromagnetic wave signal sent by the first node, the second node may further compensate for the difference, to reduce the difference.

For example, if an amplitude-frequency curve of the second electromagnetic wave signal is shifted leftwards by x units along a horizontal coordinate axis of an amplitude-frequency coordinate system relative to an amplitude-frequency curve of the conjugate reversed signal, and y third nodes are disposed on the cable, compensation for the difference enables an amplitude-frequency curve of the electromagnetic wave signal received by the second node to be shifted rightwards by x*y units along the horizontal coordinate axis of the amplitude-frequency coordinate system, where both x and y are greater than or equal to 1.

For another example, if a phase-frequency curve of the second electromagnetic wave signal is shifted leftwards by x units along a horizontal coordinate axis of a phase-frequency coordinate system relative to a phase-frequency curve of the conjugate reversed signal, and y third nodes are disposed on the cable, compensation for the difference enables a phase-frequency curve of the electromagnetic wave signal received by the second node to be shifted rightwards by x*y units along the horizontal coordinate axis of the phase-frequency coordinate system.

For another example, if a phase-frequency curve of the second electromagnetic wave signal is shifted upward by x units along a longitudinal coordinate axis of a phase-frequency coordinate system relative to a phase-frequency curve of the conjugate reversed signal, and y third nodes are disposed on the cable, compensation for the difference enables a phase-frequency curve of the electromagnetic wave signal received by the second node to be shifted downward by x*y units along the longitudinal coordinate axis of the phase-frequency coordinate system.

For another example, if a left end point of a phase-frequency curve of the second electromagnetic wave signal is shifted upward by x units along a longitudinal coordinate axis direction of a phase-frequency coordinate system relative to a left end point of a phase-frequency curve of the conjugate reversed signal, a right end point of a phase-frequency curve of the second electromagnetic wave signal is shifted downward by z units along the longitudinal coordinate axis direction of the phase-frequency coordinate system relative to a right end point of a phase-frequency curve of the conjugate reversed signal, and y third nodes are disposed on the cable, compensation for the difference enables a left endpoint of a phase-frequency curve of the electromagnetic wave signal received by the second node to be shifted downward by x*y units along the longitudinal coordinate axis direction, and a right endpoint to be shifted upward by z*y units along the longitudinal coordinate axis direction.

A module that is in the second node and that is configured to determine, based on the received electromagnetic wave signal, the data carried in the electromagnetic wave signal sent by the first node may be referred to as a determining module. The second node may further include another module, for example, a receiving module configured to receive the electromagnetic wave signal sent by the adjacent third node. The second node may further include a compensation module configured to compensate the foregoing different.

With reference to the communication method provided in embodiments of this disclosure, the following further describes functions of the communication system provided in embodiments of this disclosure.

For example, FIG. 45 is a flowchart of a communication method according to an embodiment of this disclosure. The method may be used in the communication system provided in this embodiment of this disclosure. As shown in FIG. 45, the communication method includes the following steps.

S101: A first adjacent node sends a first electromagnetic wave signal to a target third node.

The first adjacent node may be a first node. The first node may modulate the first electromagnetic wave signal based on data that needs to be sent to a second node, and transmit the first electromagnetic wave signal to a cable between the first node and the second node. In this way, the target third node on the cable can receive the first electromagnetic wave signal, and the first electromagnetic wave signal carries the data that needs to be sent by the first node to the second node.

The first adjacent node may also be another third node between the first node and the target third node. In this case, the first electromagnetic wave signal sent by the first adjacent node may be a second electromagnetic wave signal obtained by performing target processing on the received electromagnetic wave signal by the first adjacent node.

S102: The target third node performs low-noise amplification on the first electromagnetic wave signal.

For an explanation of performing, by the target third node, the low-noise amplification on the first electromagnetic wave signal, refer to related explanations in the foregoing embodiment. Details are not described herein in this embodiment of this disclosure.

S103: The target third node performs target processing on the first electromagnetic wave signal to obtain a second electromagnetic wave signal, where the target processing includes processing used to cause conjugate reversal of a spectrum of the electromagnetic wave signal.

For an explanation of the target processing performed by the target third node on the first electromagnetic wave signal, refer to related explanations in the foregoing embodiment. Details are not described herein in this embodiment of this disclosure.

S104: The target third node performs power amplification on the second electromagnetic wave signal.

For an explanation of performing, by the target third node, power amplification on the second electromagnetic wave signal, refer to related explanations in the foregoing embodiment. Details are not described herein in this embodiment of this disclosure.

S105: The target third node sends the second electromagnetic wave signal to the second adjacent node.

The target third node may transport the second electromagnetic wave signal to the cable, to send the second electromagnetic wave signal to the second adjacent node.

When the second adjacent node is the second node, the second node may further determine, based on the received electromagnetic wave signal, the data carried in the electromagnetic wave signal sent by the first node.

For a process in which the second node determines, based on the received electromagnetic wave signal, the data carried in the electromagnetic wave signal sent by the first node, refer to the related process in the foregoing embodiment. Details are not described herein in this embodiment of this disclosure.

Optionally, after receiving the first electromagnetic wave signal, the target third node may also not need to perform the low-noise amplification on the first electromagnetic wave signal. Before sending the second electromagnetic wave signal, the target third node may also not need to perform the power amplification on the second electromagnetic wave signal.

Optionally, at least one fourth node may be further disposed on the cable between the first node and the second node, and the fourth node is configured to perform power amplification on the electromagnetic wave signal transmitted over the cable.

In conclusion, in the communication method provided in this embodiment of this disclosure, first distortion occurs in a process of transmitting the electromagnetic wave signal from the first adjacent node to the target third node, and third distortion further occurs in a process of transmitting the electromagnetic wave signal from the target third node to the second adjacent node, and the third distortion is similar to the first distortion. The target processing performed by the target third node on the received first electromagnetic wave signal includes the processing used to cause the conjugate reversal of the spectrum of the electromagnetic wave signal. Therefore, the second electromagnetic wave signal obtained by the target third node by performing the target processing on the first electromagnetic wave has second distortion opposite to the first distortion relative to the signal sent by the first adjacent node. In the process of transmitting the electromagnetic wave signal from the target third node to the second adjacent node, the third distortion occurs in the electromagnetic wave signal. Under effect of the second distortion and the third distortion, distortion of the electromagnetic wave signal received by the second adjacent node relative to the electromagnetic wave signal sent by the first adjacent node can be reduced, and quality of communication between the first adjacent node and the second adjacent node is ensured, thereby ensuring quality of communication between the first node and the second node.

In addition, when the target third node performs the processing used to cause the conjugate reversal of the spectrum of the electromagnetic wave signal on the first electromagnetic wave signal, the target third node does not need to restore the original electromagnetic wave signal sent by the first node. Therefore, complexity of the target third node is low.

A sequence of operations in the method embodiment provided in this embodiment of this disclosure can be properly adjusted, and operations can also be correspondingly added or deleted based on a situation. For example, at least one of S102 and S104 may not be performed. Any method variation readily figured out by any person skilled in the art within the technical scope disclosed in this disclosure shall fall within the protection scope of this disclosure. Therefore, details are not described herein again.

In this disclosure, the terms "first", "second", and the like are merely intended for description, but cannot be understood as an indication or implication of relative importance. The term "at least one" means one or more, and the term "a plurality of" means two or more, unless expressly limited otherwise.

Different types of embodiments such as the method embodiments and the apparatus embodiments provided in embodiments of this disclosure may be cross-referenced. This is not limited in embodiments of this disclosure.

In the corresponding embodiments provided in this disclosure, it should be understood that the disclosed system, apparatus, and the like may be implemented in other composition manners. For example, the described apparatus embodiment is merely an example. Parts described as separate components may or may not be physically separate. Some or all of the parts may be selected based on actual requirements to achieve the objectives of the solutions of embodiments.

The foregoing descriptions are merely illustrative implementations of this disclosure. As such, the protection scope of this disclosure is not limited thereto but shall instead be subject to the protection scope afforded by the accompanying claims.

What is claimed is:

1. A communication method, comprising:

receiving, by a target node, a first electromagnetic wave signal sent by a first adjacent node, the target node being interposed between the first adjacent node and a second adjacent node, each of the first adjacent node, second adjacent node and target node being connected over a cable;

performing, by the target node, target processing on the first electromagnetic wave signal to obtain a second electromagnetic wave signal, the target processing causing conjugate reversal of a spectrum of the first electromagnetic wave signal;

sending, by the target node, the second electromagnetic wave signal to the second adjacent node, wherein:

the second electromagnetic wave signal is different from a conjugate reversed signal;

an amplitude-frequency curve of the conjugate reversed signal is axisymmetric to the amplitude-frequency curve of the first electromagnetic wave signal with respect to a target straight line; and a phase-frequency curve of the conjugate reversed signal is centrosymmetric to the phase-frequency curve of the first electromagnetic wave signal with respect to a target point, wherein:

the target straight line is perpendicular to a horizontal coordinate axis of a coordinate system in which the amplitude-frequency curve is located;

a frequency corresponding to an intersection point with the horizontal coordinate axis is a center frequency of the first electromagnetic wave signal; and the target point is a point corresponding to a center frequency on the horizontal coordinate axis of the coordinate system in which the phase-frequency curve is located.

2. The method according to claim 1, wherein:

amplitude-frequency curves of the first electromagnetic wave signal before and after conjugate reversal of the spectrum occurs are axisymmetric with respect to the target straight line, and phase-frequency curves of the first electromagnetic wave signal before and after the conjugate reversal of the spectrum occurs are centrosymmetric with respect to the target point.

3. The method according to claim 1, wherein a sum of first amplitudes and a sum of second amplitudes in the amplitude-frequency curve of the conjugate reversed signal have a target magnitude relationship, the first amplitude is an amplitude corresponding to a first frequency, the second amplitude is an amplitude corresponding to a second frequency, the first frequency is less than a center frequency of the conjugate reversed signal, and the second frequency is greater than the center frequency of the conjugate reversed signal; and in an amplitude-frequency curve of the second electromagnetic wave signal, a sum of third amplitudes and a sum of fourth amplitudes have the target magnitude relationship, the third amplitude is an amplitude corresponding to a third frequency, the fourth amplitude is an amplitude corresponding to a fourth frequency, the third frequency is less than a center frequency of the second electromagnetic wave signal, and the fourth frequency is greater than the center frequency of the second electromagnetic wave signal.

4. The method according to claim 1, wherein:

a fluctuation rate of a phase corresponding to any frequency in an additional phase-frequency curve is less than 40%;

the additional phase-frequency curve is obtained by subtracting a reference phase-frequency curve from a phase-frequency curve of the second electromagnetic wave signal;

a center frequency of the reference phase-frequency curve is the same as a center frequency of the second electromagnetic wave signal;

when the center frequency of the conjugate reversed signal is the same as the center frequency of the second electromagnetic wave signal, the reference phase-frequency curve is the phase-frequency curve of the conjugate reversed signal; and when the center frequency of the conjugate reversed signal is different from the center frequency of the second electromagnetic wave signal, the reference phase-frequency curve is a phase-frequency curve obtained after the phase-frequency curve of the conjugate reversed signal shifts along a horizontal coordinate axis of the phase-frequency curve;

the fluctuation rate is a ratio of a fluctuation phase to a phase corresponding to any frequency, and the fluctuation phase is a phase corresponding to the any frequency in a normalized additional phase-frequency curve; and rotating and shifting the additional phase-frequency curve based on the normalization so that the two endpoints and a target intersection point of the additional phase-frequency curve are shifted to a horizontal coordinate axis of the additional phase-frequency curve, whereby:

the target intersection point corresponds to the center frequency of the first electromagnetic wave signal;

the target intersection point is an intersection point between a connection line of the two endpoints and a reference straight line;

the reference straight line is perpendicular to the horizontal coordinate axis; and a frequency corresponding to an intersection point with the horizontal coordinate axis is the center frequency of the first electromagnetic wave signal.

5. The method according to claim 1, wherein the second electromagnetic wave signal and the conjugate reversed signal are different in at least one type of information of the center frequency, the amplitude-frequency curve, or the phase-frequency curve.

6. The method according to claim 1, wherein the target processing further comprises auxiliary processing related to a difference between the second electromagnetic wave signal and the conjugate reversed signal.

7. The method according to claim 1, wherein performing target processing on the first electromagnetic wave signal to obtain a second electromagnetic wave signal comprises:

performing down-conversion on the first electromagnetic wave signal to obtain a first baseband signal;

obtaining a second baseband signal based on the first baseband signal, wherein the second baseband signal is conjugate to the first baseband signal; and performing up-conversion on the second baseband signal to obtain the second electromagnetic wave signal.

8. The method according to claim 1, wherein performing target processing on the first electromagnetic wave signal to obtain a second electromagnetic wave signal comprises:

performing down-conversion on the first electromagnetic wave signal to obtain a first baseband signal; and performing conjugate up-conversion on the first baseband signal to obtain the second electromagnetic wave signal.

9. The method according to claim 1, wherein the performing target processing on the first electromagnetic wave signal to obtain a second electromagnetic wave signal comprises:

performing spectrum shifting on the first electromagnetic wave signal to obtain a third electromagnetic wave signal; and filtering the third electromagnetic wave signal to obtain the second electromagnetic wave signal.

10. The method according to claim 1, wherein the performing target processing on the first electromagnetic wave signal to obtain a second electromagnetic wave signal comprises:

performing parametric amplification on the first electromagnetic wave signal to obtain the second electromagnetic wave signal.

11. A communication apparatus, comprising:

a receiver configured to receive a first electromagnetic wave signal sent by a first adjacent node, the communication apparatus being interposed between the first adjacent node and a second adjacent node, each of the communication apparatus and first and second adjacent nodes being connected by a cable;

a target processor configured to perform target processing on the first electromagnetic wave signal to obtain a second electromagnetic wave signal, wherein the target processing comprises processing that causes conjugate reversal of a spectrum of the first electromagnetic wave signal; and a transmitter configured to send the second electromagnetic wave signal to the second adjacent node, wherein:

the second electromagnetic wave signal is different from a conjugate reversed signal;

an amplitude-frequency curve of the conjugate reversed signal is axisymmetric to an amplitude-frequency curve of the first electromagnetic wave signal with respect to a target straight line; and a phase-frequency curve of the conjugate reversed signal is centrosymmetric to a phase-frequency curve of the first electromagnetic wave signal with respect to a target point, wherein:

the target straight line is perpendicular to a horizontal coordinate axis of a coordinate system in which the amplitude-frequency curve is located;

a frequency corresponding to an intersection point with the horizontal coordinate axis is a center frequency of the first electromagnetic wave signal; and the target point is a point corresponding to a center frequency on the horizontal coordinate axis of the coordinate system in which the phase-frequency curve is located.

12. The communication apparatus according to claim 11, wherein:

amplitude-frequency curves of the first electromagnetic wave signal before and after conjugate reversal of the spectrum occurs are axisymmetric with respect to the target straight line, and phase-frequency curves of the first electromagnetic wave signal before and after the conjugate reversal of the spectrum occurs are centrosymmetric with respect to a target point.

13. The communication apparatus according to claim 11, wherein a sum of first amplitudes and a sum of second amplitudes in the amplitude-frequency curve of the conjugate reversed signal have a target magnitude relationship, the first amplitude is an amplitude corresponding to a first frequency, the second amplitude is an amplitude corresponding to a second frequency, the first frequency is less than a center frequency of the conjugate reversed signal, and the second frequency is greater than the center frequency of the conjugate reversed signal; and in an amplitude-frequency curve of the second electromagnetic wave signal, a sum of third amplitudes and a sum of fourth amplitudes have the target magnitude relationship, the third amplitude is an amplitude corresponding to a third frequency, the fourth amplitude is an amplitude corresponding to a fourth frequency, the third frequency is less than a center frequency of the second electromagnetic wave signal, and the fourth frequency is greater than the center frequency of the second electromagnetic wave signal.

14. The communication apparatus according to claim 11, wherein:

a fluctuation rate of a phase corresponding to any frequency in an additional phase-frequency curve is less than 40%;

the additional phase-frequency curve is a curve obtained by subtracting a reference phase-frequency curve from a phase-frequency curve of the second electromagnetic wave signal;

a center frequency of the reference phase-frequency curve is the same as a center frequency of the second electromagnetic wave signal;

when a center frequency of the conjugate reversed signal is the same as the center frequency of the second electromagnetic wave signal, the reference phase-frequency curve is the phase-frequency curve of the conjugate reversed signal; and when the center frequency of the conjugate reversed signal is different from the center frequency of the second electromagnetic wave signal, the reference phase-frequency curve is a phase-frequency curve obtained after the phase-frequency curve of the conjugate reversed signal shifts along the horizontal coordinate axis of the phase-frequency curve;

the fluctuation rate is a ratio of a fluctuation phase to a phase corresponding to any frequency, and the fluctuation phase is a phase corresponding to the any frequency in a normalized additional phase-frequency curve; and rotating and shifting the additional phase-frequency curve based on the normalization so that the two endpoints and a target intersection point of the additional phase-frequency curve are shifted to a horizontal coordinate axis of the additional phase-frequency curve, whereby:

the target intersection point corresponds to the center frequency of the first electromagnetic wave signal;

the target intersection point is an intersection point between a connection line of the two endpoints and a reference straight line, the reference straight line is perpendicular to the horizontal coordinate axis; and a frequency corresponding to an intersection point with the horizontal coordinate axis is the center frequency of the first electromagnetic wave signal.

15. The communication apparatus according to claim 11, wherein the second electromagnetic wave signal and the conjugate reversed signal are different in at least one type of information of the center frequency, the amplitude-frequency curve, or the phase-frequency curve.

16. The communication apparatus according to claim 11, wherein the target processing further comprises auxiliary processing related to a difference between the second electromagnetic wave signal and the conjugate reversed signal.

17. The communication apparatus according to claim 11, wherein the target processor is configured to:

perform down-conversion on the first electromagnetic wave signal to obtain a first baseband signal;

obtain a second baseband signal based on the first baseband signal, wherein the second baseband signal is conjugate to the first baseband signal; and perform up-conversion on the second baseband signal to obtain the second electromagnetic wave signal.

18. The communication apparatus according to claim 11, wherein the target processor is configured to:

perform down-conversion on the first electromagnetic wave signal to obtain a first baseband signal; and perform conjugate up-conversion on the first baseband signal to obtain the second electromagnetic wave signal.

19. The communication apparatus according to claim 11, wherein the target processor is configured to:

perform spectrum shifting on the first electromagnetic wave signal to obtain a third electromagnetic wave signal; and filter the third electromagnetic wave signal to obtain the second electromagnetic wave signal.

20. The communication apparatus according to claim 11, wherein the target processor is configured to:

perform parametric amplification on the first electromagnetic wave signal to obtain the second electromagnetic wave signal.

21. A chip, comprising:

at least one of a programmable logic circuit or program instructions that, when running, configure the chip to implement a communication method, the communication method comprising:

receiving, by a target node, a first electromagnetic wave signal sent by a first adjacent node, the target node being interposed between the first adjacent node and a second adjacent node, each of the first adjacent node, second adjacent node and target node being connected over a cable;

performing, by the target node, target processing on the first electromagnetic wave signal to obtain a second electromagnetic wave signal, the target processing causing conjugate reversal of a spectrum of the first electromagnetic wave signal;

sending, by the target node, the second electromagnetic wave signal to the second adjacent node, wherein:

the second electromagnetic wave signal is different from a conjugate reversed signal;

an amplitude-frequency curve of the conjugate reversed signal is axisymmetric to the amplitude-frequency curve of the first electromagnetic wave signal with respect to a target straight line; and a phase-frequency curve of the conjugate reversed signal is centrosymmetric to the phase-frequency curve of the first electromagnetic wave signal with respect to a target point, wherein:

the target straight line is perpendicular to a horizontal coordinate axis of a coordinate system in which the amplitude-frequency curve is located;

a frequency corresponding to an intersection point with the horizontal coordinate axis is a center frequency of the first electromagnetic wave signal; and the target point is a point corresponding to a center frequency on the horizontal coordinate axis of the coordinate system in which the phase-frequency curve is located.

22. A communication system, comprising:

a target node;

a first adjacent node; and a second adjacent node, wherein:

the target node is interposed between the first adjacent node and the second adjacent node, each of the first adjacent node, second adjacent node and target node being connected over a cable;

the target node including a chip comprising at least one of a programmable logic circuit or program instructions that, when running, configure the chip to implement a communication method, the communication method comprising:

receiving, by the target node, a first electromagnetic wave signal sent by the first adjacent node;

performing, by the target node, target processing on the first electromagnetic wave signal to obtain a second electromagnetic wave signal, the target processing causing conjugate reversal of a spectrum of the first electromagnetic wave signal;

sending, by the target node, the second electromagnetic wave signal to the second adjacent node, wherein:

the first adjacent node is configured to send an electromagnetic wave signal to the third adjacent node; and the second adjacent node is configured to receive an electromagnetic wave signal sent by the target node and obtain, based on the received electromagnetic wave signal, data carried in the first electromagnetic wave signal sent by the first adjacent node;

the second electromagnetic wave signal is different from a conjugate reversed signal;

an amplitude-frequency curve of the conjugate reversed signal is axisymmetric to an amplitude-frequency curve of the first electromagnetic wave signal with respect to a target straight line; and a phase-frequency curve of the conjugate reversed signal is centrosymmetric to the phase-frequency curve of the first electromagnetic wave signal with respect to a target point, wherein:

the target straight line is perpendicular to a horizontal coordinate axis of a coordinate system in which the amplitude-frequency curve is located;

a frequency corresponding to the intersection point with the horizontal coordinate axis is a center frequency of the first electromagnetic wave signal; and the target point is a point corresponding to a center frequency on the horizontal coordinate axis of the coordinate system in which the phase-frequency curve is located.

23. The chip according to claim 21, wherein:

the target processing further comprises auxiliary processing related to a difference between the second electromagnetic wave signal and the conjugate reversed signal.

24. The communication system according to claim 22, wherein:

the target processing further comprises auxiliary processing related to a difference between the second electromagnetic wave signal and the conjugate reversed signal.

* * * * *